US010871536B2

(12) United States Patent
Golden et al.

(10) Patent No.: US 10,871,536 B2
(45) Date of Patent: Dec. 22, 2020

(54) AUTOMATED CARDIAC VOLUME SEGMENTATION

(71) Applicant: ARTERYS INC., San Francisco, CA (US)

(72) Inventors: Daniel Irving Golden, Palo Alto, CA (US); John Axerio-Cilies, San Francisco, CA (US); Matthieu Le, San Francisco, CA (US); Torin Arni Taerum, Calgary (CA); Jesse Lieman-Sifry, San Francisco, CA (US)

(73) Assignee: ARTERYS INC., San Francisco, CA (US)

( * ) Notice: Subject to any disclaimer, the term of this patent is extended or adjusted under 35 U.S.C. 154(b) by 119 days.

(21) Appl. No.: 15/779,448

(22) PCT Filed: Nov. 29, 2016

(86) PCT No.: PCT/US2016/064028
§ 371 (c)(1),
(2) Date: May 25, 2018

(87) PCT Pub. No.: WO2017/091833
PCT Pub. Date: Jun. 1, 2017

(65) Prior Publication Data
US 2018/0259608 A1 Sep. 13, 2018

Related U.S. Application Data

(60) Provisional application No. 62/415,666, filed on Nov. 1, 2016, provisional application No. 62/260,565, filed on Nov. 29, 2015.

(51) Int. Cl.
G01R 33/56 (2006.01)
G01R 33/563 (2006.01)
(Continued)

(52) U.S. Cl.
CPC ... *G01R 33/5608* (2013.01); *G01R 33/56308* (2013.01); *G06N 3/02* (2013.01);
(Continued)

(58) Field of Classification Search
CPC . G01R 33/5608; G01R 33/56308; G06T 7/11; G06N 3/084; G06N 3/0454; G06N 3/02
See application file for complete search history.

(56) References Cited

U.S. PATENT DOCUMENTS 5,115,812 A     5/1992  Sano et al.
6,018,728 A *   1/2000  Spence ............... G06K 9/3233
                                                       706/20
(Continued)

FOREIGN PATENT DOCUMENTS

CN    105822509 A    8/2016
CN    205665697 U   10/2016
(Continued)

OTHER PUBLICATIONS

Communication pursuant to Article 94(3), dated Feb. 25, 2020 for European Application No. 16869356.2-1218, 6 pages.
(Continued)

*Primary Examiner* — Dixomara Vargas
(74) *Attorney, Agent, or Firm* — Seed IP Law Group LLP

(57) ABSTRACT

Systems and methods for automated segmentation of anatomical structures, such as the human heart. The systems and methods employ convolutional neural networks (CNNs) to autonomously segment various parts of an anatomical structure represented by image data, such as 3D MRI data. The convolutional neural network utilizes two paths, a contracting path which includes convolution/pooling layers, and an expanding path which includes upsampling/convolution layers. The loss function used to validate the CNN model may specifically account for missing data, which allows for use
(Continued)

of a larger training set. The CNN model may utilize multi-dimensional kernels (e.g., 2D, 3D, 4D, 6D), and may include various channels which encode spatial data, time data, flow data, etc. The systems and methods of the present disclosure also utilize CNNs to provide automated detection and display of landmarks in images of anatomical structures.

46 Claims, 35 Drawing Sheets

(51) Int. Cl.
*G06T 7/11* (2017.01)
*G06N 3/08* (2006.01)
*G06N 3/04* (2006.01)
*G06N 3/02* (2006.01)
*G01R 33/561* (2006.01)
*G06N 3/00* (2006.01)
*G06T 7/00* (2017.01)

(52) U.S. Cl.
CPC ........... *G06N 3/0454* (2013.01); *G06N 3/084* (2013.01); *G06T 7/11* (2017.01); *G01R 33/561* (2013.01); *G01R 33/5613* (2013.01); *G01R 33/56316* (2013.01); *G06N 3/006* (2013.01); *G06N 3/082* (2013.01); *G06T 7/0012* (2013.01); *G06T 2207/10088* (2013.01); *G06T 2207/10132* (2013.01); *G06T 2207/20081* (2013.01); *G06T 2207/20084* (2013.01); *G06T 2207/30048* (2013.01)

(56) References Cited

U.S. PATENT DOCUMENTS

| | | | |
|---|---|---|---|
| 6,324,532 B1 * | 11/2001 | Spence | G06K 9/3241 |
| | | | 706/27 |
| 6,934,698 B2 | 8/2005 | Judd et al. | |
| 7,139,417 B2 | 11/2006 | Nicolas et al. | |
| 7,254,436 B2 | 8/2007 | Judd et al. | |
| 7,457,656 B2 | 11/2008 | Judd et al. | |
| 7,567,707 B2 * | 7/2009 | Willamowski | G06K 9/0061 |
| | | | 358/518 |
| 7,668,835 B2 | 2/2010 | Judd et al. | |
| 7,764,846 B2 * | 7/2010 | Marchesotti | G06K 9/0061 |
| | | | 382/254 |
| 7,958,100 B2 | 6/2011 | Judd et al. | |
| 8,055,636 B2 | 11/2011 | Judd et al. | |
| 8,166,381 B2 | 4/2012 | Judd et al. | |
| 8,369,590 B2 | 2/2013 | Wang et al. | |
| 8,837,800 B1 | 9/2014 | Bammer et al. | |
| 9,165,360 B1 | 10/2015 | Bates et al. | |
| 9,430,828 B2 | 8/2016 | Wu et al. | |
| 9,569,736 B1 * | 2/2017 | Ghesu | G06K 9/6267 |
| 9,589,374 B1 | 3/2017 | Gao et al. | |
| 9,707,400 B2 * | 7/2017 | Grenz | A61N 1/36514 |
| 10,192,129 B2 * | 1/2019 | Price | G06K 9/4628 |
| 10,600,184 B2 * | 3/2020 | Golden | G06T 7/143 |
| 10,646,156 B1 * | 5/2020 | Schnorr | G16H 10/60 |
| 2002/0146159 A1 | 10/2002 | Nolte | |
| 2003/0174872 A1 | 9/2003 | Chalana et al. | |
| 2003/0234781 A1 | 12/2003 | Laidlaw et al. | |
| 2005/0238233 A1 | 10/2005 | Mulet Parada et al. | |
| 2006/0106877 A1 | 5/2006 | Lee | |
| 2006/0120608 A1 | 6/2006 | Luo et al. | |
| 2006/0155187 A1 | 7/2006 | Zhao et al. | |
| 2006/0241376 A1 | 10/2006 | Noble et al. | |
| 2007/0061460 A1 | 3/2007 | Khan et al. | |
| 2008/0054900 A1 | 3/2008 | Polzin | |
| 2008/0130824 A1 | 6/2008 | Fujisawa | |
| 2009/0226064 A1 | 9/2009 | El Fakhri et al. | |
| 2010/0085052 A1 | 4/2010 | Johnson et al. | |
| 2010/0094122 A1 | 4/2010 | Kiraly | |
| 2010/0145194 A1 | 6/2010 | Joshi et al. | |
| 2010/0158332 A1 * | 6/2010 | Rico | A61B 5/4312 |
| | | | 382/128 |
| 2010/0280352 A1 | 11/2010 | Ionasec et al. | |
| 2011/0064294 A1 | 3/2011 | Abe et al. | |
| 2011/0122226 A1 | 5/2011 | Kamen et al. | |
| 2011/0182493 A1 | 7/2011 | Huber et al. | |
| 2011/0230756 A1 | 9/2011 | Axel Odeen et al. | |
| 2011/0244415 A1 | 10/2011 | Batesole | |
| 2011/0311120 A1 | 12/2011 | Maizeroi-Eugene | |
| 2012/0076380 A1 | 3/2012 | Gühring et al. | |
| 2012/0114205 A1 | 5/2012 | Tang et al. | |
| 2012/0184840 A1 | 7/2012 | Najarian et al. | |
| 2012/0271156 A1 | 10/2012 | Bi et al. | |
| 2013/0066229 A1 | 3/2013 | Wolff | |
| 2013/0259351 A1 | 10/2013 | Wiemker, II | |
| 2013/0343626 A1 * | 12/2013 | Rico | A61B 5/4312 |
| | | | 382/131 |
| 2014/0086465 A1 | 3/2014 | Wu et al. | |
| 2014/0112564 A1 | 4/2014 | Hsiao et al. | |
| 2014/0313222 A1 | 10/2014 | Anderson et al. | |
| 2015/0112182 A1 * | 4/2015 | Sharma | A61B 5/7282 |
| | | | 600/408 |
| 2015/0139517 A1 | 5/2015 | Sigurdsson et al. | |
| 2015/0178938 A1 * | 6/2015 | Gorman, III | G06T 7/143 |
| | | | 382/131 |
| 2015/0213302 A1 | 7/2015 | Madabhushi et al. | |
| 2015/0238148 A1 * | 8/2015 | Georgescu | G06K 9/4628 |
| | | | 600/408 |
| 2015/0324690 A1 | 11/2015 | Chilimbi et al. | |
| 2015/0374237 A1 | 12/2015 | Hu et al. | |
| 2016/0092721 A1 | 3/2016 | Kanagasingam et al. | |
| 2016/0203263 A1 | 7/2016 | Maier et al. | |
| 2016/0292856 A1 | 10/2016 | Niemeijer et al. | |
| 2016/0328643 A1 | 11/2016 | Liu et al. | |
| 2016/0338613 A1 | 11/2016 | Beckers et al. | |
| 2017/0045600 A1 | 2/2017 | Hsiao et al. | |
| 2017/0046616 A1 | 2/2017 | Socher et al. | |
| 2017/0046839 A1 | 2/2017 | Paik et al. | |
| 2017/0084028 A1 | 3/2017 | Vilsmeier | |
| 2017/0103532 A1 * | 4/2017 | Ghesu | A61B 8/4416 |
| 2017/0116497 A1 * | 4/2017 | Georgescu | A61B 8/5223 |
| 2017/0213101 A1 | 7/2017 | Rubens et al. | |
| 2017/0270663 A1 * | 9/2017 | Hoffmann | G06T 17/20 |
| 2017/0287134 A1 | 10/2017 | Abedini et al. | |
| 2018/0005083 A1 * | 1/2018 | Georgescu | A61B 5/055 |
| 2018/0116620 A1 | 5/2018 | Chen et al. | |
| 2018/0218497 A1 | 8/2018 | Golden et al. | |
| 2018/0218502 A1 | 8/2018 | Golden et al. | |
| 2018/0253837 A1 * | 9/2018 | Ghesu | G06T 7/75 |
| 2018/0315193 A1 * | 11/2018 | Paschalakis | G06T 7/0016 |
| 2018/0365824 A1 | 12/2018 | Yuh et al. | |
| 2019/0251688 A1 * | 8/2019 | Madabhushi | G06K 9/6228 |
| 2020/0035351 A1 * | 1/2020 | Kim | G06K 9/00234 |
| 2020/0051274 A1 * | 2/2020 | Siemionow | G06T 7/11 |
| 2020/0077893 A1 * | 3/2020 | Shirai | G06T 7/0012 |
| 2020/0085382 A1 | 3/2020 | Taerum et al. | |
| 2020/0193603 A1 | 6/2020 | Golden et al. | |

FOREIGN PATENT DOCUMENTS

| | | |
|---|---|---|
| CN | 106096616 A | 11/2016 |
| CN | 106096632 A | 11/2016 |
| CN | 106127725 A | 11/2016 |
| CN | 107341265 A | 11/2017 |
| JP | 2-147048 A | 6/1990 |
| JP | 5-84231 A | 4/1993 |
| JP | 8-38444 A | 2/1996 |
| JP | 8-140960 A | 6/1996 |
| JP | 2001-149361 A | 6/2001 |
| JP | 2008-510449 A | 4/2008 |
| JP | 2008-526382 A | 7/2008 |
| JP | 2009-261519 A | 11/2009 |
| JP | 2010-82321 A | 4/2010 |
| JP | 2013-223726 A | 10/2013 |
| KR | 10-2016-0010157 A | 1/2016 |
| WO | 00/67185 A1 | 11/2000 |
| WO | 2009/142167 A1 | 11/2009 |

(56) References Cited

FOREIGN PATENT DOCUMENTS

| | | |
|---|---|---|
| WO | 2010/038138 A1 | 4/2010 |
| WO | 2012/018560 A2 | 2/2012 |
| WO | 2013/006709 A2 | 1/2013 |
| WO | 2015/031641 A1 | 3/2015 |
| WO | 2015/109254 A2 | 7/2015 |
| WO | 2016/141214 A1 | 9/2016 |
| WO | 2017/091833 A1 | 6/2017 |
| WO | 2017/106645 A1 | 6/2017 |
| WO | 2018/140596 A2 | 8/2018 |
| WO | 2018/222755 A1 | 12/2018 |
| WO | 2019/103912 A2 | 5/2019 |

OTHER PUBLICATIONS

Jepson et al., "Image Segmentation," Segmentation, 2503 published Nov. 21, 2011. (38 page) URL: http://www.cs.toronto.edu/~fleet/courses/2503/fall11/Handouts/segmentation.pdf.
Amendment, filed Aug. 21, 2018, for U.S. Appl. No. 15/339,475, Hsiao et al., "Comprehensive Cardiovascular Analysis With Volumetric Phase-Contrast MRI," 11 pages.
Chinese Office Action, dated Jul. 30, 2018, for Chinese Application No. 201580008074.2, 10 pages. (with English Translation).
Chinese Office Action, dated Nov. 1, 2018, for Chinese Application No. 201610702833.1, 13 pages. (with English Machine Translation).
Chinese Office Action, dated Nov. 15, 2019, for Chinese Application No. 201580008074.2, 21 pages.
DiDonato et al., "Machine Learning-Based Automated Abnormality Detection in Medical Images and Presentation Thereof," U.S. Appl. No. 62/770,038, filed Nov. 20, 2018, 37 pages.
European Office Action, dated Feb. 8, 2019, for European Application No. 15737417.4-1115, 6 pages.
European Office Action, dated Nov. 29, 2018, for European Application No. 12807483.8-1022, 9 pages.
Final Office Action, dated Nov. 26, 2018, for U.S. Appl. No. 15/339,475, Hsiao et al., "Comprehensive Cardiovascular Analysis With Volumetric Phase-Contrast MRI," 15 pages.
International Search Report and Written Opinion, dated Jul. 26, 2018, for International Application No. PCT/US2018/015222, 13 pages.
International Search Report and Written Opinion, dated Oct. 17, 2018, for International Application No. PCT/US2018/035192, 22 pages.
Japanese Office Action, dated Sep. 18, 2018, for Japanese Application No. 2016-565120, 12 pages. (with English Translation).
Norman et al., "Deep Learning-Based Coregistration," U.S. Appl. No. 62/722,663, filed Aug. 24, 2018, 33 pages.
Notice of Allowance, dated Jun. 29, 2018, for U.S. Appl. No. 15/112,130, Beckers et al., "Apparatus, Methods and Articles for Four Dimensional (4D) Flow Magnetic Resonance Imaging," 8 pages.
Office Action, dated Dec. 31, 2018, for U.S. Appl. No. 16/181,038, Beckers et al., "Apparatus, Methods and Articles for Four Dimensional (4D) Flow Magnetic Resonance Imaging," 37 pages.
Preliminary Amendment, filed Nov. 13, 2018, for U.S. Appl. No. 15/782,005, Yuh et al., "Interpretation and Quantification of Emergency Features on Head Computed Tomography," 6 pages.
Stalder et al., "Fully automatic visualization of 4D Flow data," 21st Annual Meeting & Exhibition of the International Society for Magnetic Resonance in Medicine, Salt Lake City, Utah, USA, Apr. 20-26, 2013, p. 1434.
Taerum et al., "Systems and Methods for High Bit Depth Rendering of Medical Images in a Web Browser," U.S. Appl. No. 62/770,989, filed Nov. 23, 2018, 28 pages.
Unterhinninghofen et al., "Consistency of Flow Quantifications in tridirectional Phase-Contrast MRI," Proceedings of SPIE 7259:72592C, 2009. (8 pages).
Lieman-Sifry et al., "FastVentricle: Cardiac Segmentation with ENet." In: Wright G. et al. (eds), Functional Imaging and Modelling of the Heart, 9th International Conference, Toronto, ON, Canada, Jun. 11-13, FIMH 2017, Proceedings. (11 pages).
Poudel et al., "Recurrent Fully Convolutional Neural Networks for Multi-slice MRI Cardiac Segmentation," Zuluaga et al., (eds) Reconstruction, Segmentation, and Analysis of Medical Images, First International Workshops, RAMBO 2016 and HVSMR 2016, Held in Conjunction with MICCAI 2016, Athens, Greece, Oct. 17, 2016, Revised Selected Papers. (12 pages).
Supplementary European Search Report and Communication dated Jul. 2, 2019, for European Application No. 16 86 9356, 11 pages.
Abadi et al., "TensorFlow: Large-Scale Machine Learning on Heterogeneous Distributed Systems," *The Computing Research Repository 1603.04467*, 2016. (19 pages).
Amendment, filed Feb. 20, 2018, for U.S. Appl. No. 15/112,130, Beckers et al., "Apparatus, Methods and Articles for Four Dimensional (4D) Flow Magnetic Resonance Imaging," 10 pages.
Amendment, filed Jan. 18, 2016, for U.S. Appl. No. 14/118,964, Hsiao et al., "Comprehensive Cardiovascular Analysis With Volumetric Phase-Contrast MRI," 20 pages.
Amendment, filed Jun. 5, 2018, for U.S. Appl. No. 15/112,130, Beckers et al., "Apparatus, Methods and Articles for Four Dimensional (4D) Flow Magnetic Resonance Imaging," 15 pages.
Amendment, filed Jun. 6, 2016, for U.S. Appl. No. 14/118,964, Hsiao et al., "Comprehensive Cardiovascular Analysis With Volumetric Phase-Contrast MRI," 21 pages.
American College of Radiology, "Liver Reporting & Data System," URL=https://www.acr.org/Clinical-Resources/Reporting-and-Data-Systems/LI-RADS, download date Jun. 28, 2018, 4 pages.
American College of Radiology, "Lung CT Screening Reporting & Data System," URL=https://www.acr.org/Clinical-Resources/Reporting-and-Data-Systems/Lung-Rads, download date Jun. 28, 2018, 4 pages.
Armato III et al., "The Lung Image Database Consortium (LIDC) and Image Database Resource Initiative (IDRI): A Completed Reference Database of Lung Nodules on CT Scans," *Medical Physics* 38(2):915-931, 2011.
Avendi et al., A combined deep-learning and deformable-model approach to fully automatic segmentation of the left ventricle in cardiac MRI, *Medical Image Analysis* 30:108-119, 2016. (34 pages).
Baur et al., "MelanoGANs: High Resolution Skin Lesion Synthesis with GANs," arXiv:1804.04338v1 [cs.CV], Apr. 12, 2018, 8 pages.
Beckers et al., "Apparatus, Methods and Articles for Four Dimensional (4D) Flow Magnetic Resonance Imaging," U.S. Appl. No. 61/928,702, filed Jan. 17, 2014, 106 pages.
Berens et al., "ZNET—Lung Nodule Detection," Lung Nodule Analysis 2016, URL=https://luna16.grand-challenge.org/serve/public_html/.../ZNET_NDET_160831.pdf/, download date Jun. 28, 2018, 4 pages.
Bergstra et al., "Random Search for Hyper-Parameter Optimization," *Journal of Machine Learning Research* 13(Feb):281-305, 2012.
Bock et al., "4D Phase Contrast MRI at 3 T: Effect of Standard and Blood-Pool Contrast Agents on SNR, PC-MRA, and Blood Flow Visualization," *Magnetic Resonance in Medicine* 63(2):330-338, 2010.
Bock et al., "Optimized pre-processing of time-resolved 2D and 3D Phase Contrast MRI data," *15th Annual Meeting and Exhibition of the International Society for Magnetic Resonance in Medicine*, Berlin, Germany, May 19-25, 2007, p. 3138.
Chen et al., "Automatic Detection of Cerebral Microbleeds via Deep Learning Based 3D Feature Representation," *IEEE 12th International Symposium on Biomedical Imaging*, New York City, New York, USA, Apr. 16-19, 2015, pp. 764-767.
Chernobelsky et al., "Baseline Correction of Phase Contrast Images Improves Quantification of Blood Flow in the Great Vessels," *Journal of Cardiovascular Magnetic Resonance* 9(4):681-685, 2007.
Chinese Office Action, dated Aug. 24, 2015, for Chinese Application No. 201280042949.7, 21 pages. (with English Translation).
Chinese Office Action, dated Jan. 21, 2016, for Chinese Application No. 201280042949.7, 8 pages. (with English Translation).

(56) References Cited

OTHER PUBLICATIONS

Chung et al., "Malignancy estimation of Lung-RADS criteria for subsolid nodules on CT: accuracy of low and high risk spectrum when using NLST nodules," *European Radiology* 27(11):4672-4679, 2017.
Chuquicusma et al., "How to Fool Radiologists with Generative Adversarial Networks? A Visual Turing Test for Lung Cancer Diagnosis," arXiv:1710.09762v2 [cs.CV], Jan. 9, 2018, 5 pages.
Costa et al., "Towards Adversarial Retinal Image Synthesis," arXiv:1701.08974v1 [cs.CV], Jan. 31, 2017, 11 pages.
Delles et al., "Quadratic phase offset error correction of velocity-encoded magnetic resonance imaging data," *International Journal of Computer Assisted Radiology and Surgery* 4(Supplement 1):S10-S11, 2009.
Díaz et al., "Fast Noncontinuous Path Phase-Unwrapping Algorithm Based on Gradients and Mask," *9th Iberoamerican Congress on Pattern Recognition*, Puebla, Mexico, Oct. 26-29, 2004, pp. 116-123.
Dong et al., "Image Super-Resolution Using Deep Convolutional Networks," *IEEE Transactions on Pattern Analysis and Machine Intelligence* 38(2):295-307, 2016. (14 pages).
Esteva et al., "Dermatologist-level classification of skin cancer with deep neural networks," *Nature* 542(7639):115-118, 2017. (12 pages).
European Office Action, dated May 29, 2018, for European Application No. 15737417.4-1115, 5 pages.
Extended European Search Report, dated Jul. 14, 2017, for European Application No. 15737417.4-1657, 8 pages.
Extended European Search Report, dated Jul. 7, 2015, for European Application No. 12807483.8-1560, 11 pages.
Final Office Action, dated Mar. 3, 2016, for U.S. Appl. No. 14/118,964, Hsiao et al., "Comprehensive Cardiovascular Analysis With Volumetric Phase-Contrast MRI," 12 pages.
Firmino et al., "Computer-aided detection (CADe) and diagnosis (CADx) system for lung cancer with likelihood of malignancy," *BioMedical Engineering OnLine* 15:2, 2016. (17 pages).
Fluckiger et al., "Left Atrial Flow Velocity Distribution and Flow Coherence Using Four-Dimensional FLOW MRI: A Pilot Study Investigating the Impact of Age and Pre- and Postintervention Atrial Fibrillation on Atrial Hemodynamics," *Journal of Magnetic Resonance Imaging* 38(3):580-587, 2013.
Frid-Adar et al., "GAN-based Synthetic Medical Image Augmentation for increased CNN Performance in Liver Lesion Classification," arXiv:1803.01229v1 [cs.CV], Mar. 3, 2018, 10 pages.
Frydrychowicz et al., "Four-dimensional phase contrast magnetic resonance angiography: Potential clinical applications," *European Journal of Radiology* 80(1):24-35, 2011. (26 pages).
Gatehouse et al., "Flow measurement by cardiovascular magnetic resonance: a multi-centre multi-vendor study of background phase offset errors that can compromise the accuracy of derived regurgitant or shunt flow measurements," *Journal of Cardiovascular Magnetic Resonance* 12:5, 2010. (8 pages).
Giese et al., "Optimized Pre-Processing Strategy for the Correction of Gradient Field Inhomogeneities in 3D-PC-MRI," *16th Annual Meeting and Exhibition of the International Society for Magnetic Resonance in Medicine*, Toronto, Canada, May 3-9, 2008, p. 1371.
Golden et al., "Automated Segmentation Utilizing Fully Convolutional Networks," U.S. Appl. No. 62/451,482, filed Jan. 27, 2017, 113 pages.
Golden et al., "Content Based Image Retrieval for Lesion Analysis," U.S. Appl. No. 62/589,805, filed Nov. 22, 2017, 189 pages.
Golden et al., "Patient Outcomes Prediction System," U.S. Appl. No. 62/589,838, filed Nov. 22, 2017, 187 pages.
Goodfellow et al., "Generative Adversarial Nets," arXiv:1406.2661v1 [stat.ML], Jun. 10, 2014, 9 pages.
Gulshan et al., "Development and Validation of a Deep Learning Algorithm for Detection of Diabetic Retinopathy in Retinal Fundus Photographs," *Journal of the American Medical Association* 316(22):2402-2410, 2016.
He et al., "Deep Residual Learning for Image Recognition," *IEEE Conference on Computer Vision and Pattern Recognition*, Las Vegas, Nevada, USA, Jun. 27-30, 2016, pp. 770-778.
He et al., "Identity Mappings in Deep Residual Networks," *14th European Conference on Computer Vision*, Amsterdam, The Netherlands, Oct. 8-16, 2016, 15 pages.
Hennemuth et al., "Fast Interactive Exploration of 4D MRI Flow Data," *Proceedings of SPIE* 7964:79640E, 2011. (11 pages).
Hsiao et al., "An Integrated Visualization and Quantitative Analysis Platform for Volumetric Phase-Contrast MRI," U.S. Appl. No. 61/571,908, filed Jul. 7, 2011, 18 pages.
Hsiao et al., "Evaluation of Valvular Insufficiency and Shunts with Parallel-imaging Compressed-sensing 4D Phase-contrast MR Imaging with Stereoscopic 3D Velocity-fusion Volume-rendered Visualization," *Radiology* 265(1): 87-95, 2012.
Hsiao et al., "Improved cardiovascular flow quantification with time-resolved volumetric phase-contrast MRI," *Pediatric Radiology* 41(6):711-720, 2011.
Hsiao et al., "Rapid Pediatric Cardiac Assessment of Flow and Ventricular Volume With Compressed Sensing Parallel Imaging Volumetric Cine Phase-Contrast MRI," *American Journal of Roentgenology* 198(3):W250-W259, 2012.
Huhdanpaa et al., "Image Coregistration: Quantitative Processing Framework for the Assessment of Brain Lesions," *Journal of Digital Imaging* 27(3):369-379, 2014.
International Preliminary Report on Patentability, dated Jun. 19, 2018, for International Application No. PCT/US2016/067170, 7 pages.
International Preliminary Report on Patentability, dated May 29, 2018, for International Application No. PCT/US2016/064028, 13 pages.
International Preliminary Report on Patentability, dated Jan. 7, 2014, for International Application No. PCT/US2012/045575, 6 pages.
International Preliminary Report on Patentability, dated Jul. 19, 2016, for International Application No. PCT/US2015/011851, 13 pages.
International Search Report and Written Opinion, dated Jan. 14, 2013, for International Application No. PCT/US2012/045575, 8 pages.
International Search Report and Written Opinion, dated Jul. 17, 2015, for International Application No. PCT/US2015/011851, 17 pages.
International Search Report and Written Opinion, dated Mar. 13, 2017, for International Application No. PCT/US2016/064028, 15 pages.
International Search Report and Written Opinion, dated Mar. 16, 2017, for International Application No. PCT/US2016/067170 9 pages.
Isola et al., "Image-to-Image Translation with Conditional Adversarial Networks," arXiv:1611.07004v2 [cs.CV], Nov. 22, 2017, 17 pages.
Japanese Office Action, dated Apr. 12, 2016, for Japanese Application No. 2014-519295, 6 pages. (with English Translation).
Japanese Office Action, dated Aug. 29, 2017, for Japanese Application No. 2016-175588, 8 pages. (with English Translation).
Japanese Office Action, dated Mar. 13, 2018, for Japanese Application No. 2016-175588, 4 pages. (with English Translation).
Kainz et al., "In vivo interactive visualization of four-dimensional blood flow patterns," *The Visual Computer* 25(9):853-862, 2009.
Kass et al., "Snakes: Active Contour Models," *International Journal of Computer Vision* 1(4):321-331, 1988.
Kilner et al., "Flow Measurement by Magnetic Resonance: A Unique Asset Worth Optimising," *Journal of Cardiovascular Magnetic Resonance* 9(4):723-728, 2007.
Kingma et al., "Adam: A Method for Stochastic Optimization," *3rd International Conference for Learning Representations*, San Diego, California, USA, May 7-9, 2015, 15 pages.
Kuhn, "The Hungarian Method for the Assignment Problem," *Naval Research Logistics Quarterly* 2(1-2):83-97, 1955. (16 pages).
Lankhaar et al., "Correction of Phase Offset Errors in Main Pulmonary Artery Flow Quantification," *Journal of Magnetic Resonance Imaging* 22(1):73-79, 2005.

(56) References Cited

OTHER PUBLICATIONS

Lau et al., "DeepVentricle: Automated Cardiac MRI Ventricle Segmentation with Deep Learning," *Conference on Machine Intelligence in Medical Imaging*, Alexandria, Virginia, USA, Sep. 12-13, 2016, 5 pages.
Lau et al., "Simulating Abnormalities in Medical Images With Generative Adversarial Networks," U.S. Appl. No. 62/683,461, filed Jun. 11, 2018, 39 pages.
Law et al., "Automated Three Dimensional Lesion Segmentation," U.S. Appl. No. 62/589,876, filed Nov. 22, 2017, 182 pages.
Lecun et al., "Gradient-Based Learning Applied to Document Recognition," *Proceedings of the IEEE 86*(11):2278-2324, 1998.
Leibowitz et al., "Systems and Methods for Interaction With Medical Image Data," U.S. Appl. No. 62/589,872, filed Nov. 22, 2017, 187 pages.
Lieman-Sifry et al., "Automated Lesion Detection, Segmentation, and Longitudinal Identification," U.S. Appl. No. 62/512,610, filed May 30, 2017, 87 pages.
Long et al., "Fully convolutional networks for semantic segmentation," *IEEE Conference on Computer Vision and Pattern Recognition*, Boston, Massachusetts, USA, Jun. 7-12, 2015, pp. 3431-3440.
Maier et al., "Classifiers for Ischemic Stroke Lesion Segmentation: A Comparison Study," *PLoS ONE 10*(12):e0145118, 2015. (16 pages).
Mao et al., "Least Squares Generative Adversarial Networks," arXiv:1611.04076v3 [cs.CV], Apr. 5, 2017, 16 pages.
Mariani et al., "BAGAN: Data Augmentation with Balancing GAN," arXiv:1803.09655v2 [cs.CV], Jun. 5, 2018, 9 pages.
Markl et al., "Comprehensive 4D velocity mapping of the heart and great vessels by cardiovascular magnetic resonance," *Journal of Cardiovascular Magnetic Resonance 13*(1):7, 2011. (22 pages).
Markl et al., "Generalized Modeling of Gradient Field Non-Linearities and Reconstruction of Phase Contrast MRI Measurements," *11th Annual Meeting and Exhibition of the International Society for Magnetic Resonance in Medicine*, Toronto, Canada, Jul. 10-16, 2003, p. 1027.
Markl et al., "Generalized Reconstruction of Phase Contrast MRI: Analysis and Correction of the Effect of Gradient Field Distortions," *Magnetic Resonance in Medicine 50*(4):791-801, 2003.
Mirza et al., "Conditional Generative Adversarial Nets," arXiv:1411.1784v1 [cs.LG], Nov. 6, 2014, 7 pages.
Mordvintsev et al., "Inceptionism: Going Deeper into Neural Networks," Jun. 17, 2015, URL=http://googleresearch.blogspot.co.uk/2015/06/inceptionism-going-deeper-into-neural.html, download date Jul. 18, 2017, 8 pages.
Muja et al., "Fast Approximate Nearest Neighbors with Automatic Algorithm Configuration," *International Conference on Computer Vision Theory and Applications*, Lisboa, Portugal, Feb. 5-8, 2009, pp. 331-340.
National Lung Screening Trial Research Team, "Reduced Lung-Cancer Mortality with Low-Dose Computed Tomographic Streaming," *The New England Journal of Medicine 365*(5):395-409, 2011.
Newton et al., "Three Dimensional Voxel Segmentation Tool," U.S. Appl. No. 62/589,772, filed Nov. 22, 2017, 180 pages.
Noh et al., "Learning Deconvolution Network for Semantic Segmentation," *IEEE International Conference on Computer Vision*, Santiago, Chile, Dec. 7-13, 2015, pp. 1520-1528.
Notice of Allowance, dated Aug. 4, 2016, for U.S. Appl. No. 14/118,964, Hsiao et al., "Comprehensive Cardiovascular Analysis With Volumetric Phase-Contrast MRI," 8 pages.
Öberg, "Segmentation of cardiovascular tree in 4D from PC-MRI images," master's thesis, Lund University, Lund, Sweden, Apr. 8, 2013, 49 pages.
Odena et al., "Conditional Image Synthesis with Auxiliary Classifier GANs," arXiv:1610.09585v4 [stat.ML], Jul. 20, 2017, 12 pages.
Office Action, dated Apr. 23, 2018, for U.S. Appl. No. 15/339,475, Hsiao et al., "Comprehensive Cardiovascular Analysis With Volumetric Phase-Contrast MRI," 12 pages.

Office Action, dated Mar. 12, 2018, for U.S. Appl. No. 15/112,130, Beckers et al., "Apparatus, Methods and Articles for Four Dimensional (4D) Flow Magnetic Resonance Imaging," 23 pages.
Office Action, dated Oct. 20, 2015, for U.S. Appl. No. 14/118,964, Hsiao et al., "Comprehensive Cardiovascular Analysis With Volumetric Phase-Contrast MRI," 9 pages.
Paszke et al., "ENet: A Deep Neural Network Architecture for Real-Time Semantic Segmentation," *The Computing Research Repository 1606.02147*, 2016. (10 pages).
Payer et al., "Regressing Heatmaps for Multiple Landmark Localization using CNNs,"*19th International Conference on Medical Image Computing and Computer-Assisted Intervention*, Athens, Greece, Oct. 17-21, 2016, pp. 230-238. (8 pages).
Peeters et al., "Analysis and Correction of Gradient Nonlinearity and $B_0$ Inhomogeneity Related Scaling Errors in Two-Dimensional Phase Contrast Flow Measurements," *Magnetic Resonance in Medicine 53*(1):126-133, 2005.
Plassard et al., "Revealing Latent Value of Clinically Acquired CTs of Traumatic Brain Injury Through Multi-Atlas Segmentation in a Retrospective Study of 1,003 with External Cross-Validation," *Proceedings of SPIE 9413*:94130K, 2015. (13 pages).
Preliminary Amendment, filed Jan. 8, 2014, for U.S. Appl. No. 14/118,964, Hsiao et al., "Comprehensive Cardiovascular Analysis With Volumetric Phase-Contrast MRI," 16 pages.
Preliminary Amendment, filed Jul. 15, 2016, for U.S. Appl. No. 15/112,130, Beckers et al., "Apparatus, Methods and Articles for Four Dimensional (4D) Flow Magnetic Resonance Imaging," 14 pages.
Preliminary Amendment, filed Nov. 2, 2016, for U.S. Appl. No. 15/339,475, Hsiao et al., "Comprehensive Cardiovascular Analysis With Volumetric Phase-Contrast MRI," 8 pages.
Preliminary Amendment, filed Nov. 20, 2013, for U.S. Appl. No. 14/118,964, Hsiao et al., "Comprehensive Cardiovascular Analysis With Volumetric Phase-Contrast MRI," 3 pages.
Radford et al., "Unsupervised Representation Learning with Deep Convolutional Generative Adversarial Networks," arXiv:1511.06434v2 [cs.LG], Jan. 7, 2016, 16 pages.
Restriction Requirement, dated Dec. 20, 2017, for U.S. Appl. No. 15/112,130, Beckers et al., "Apparatus, Methods and Articles for Four Dimensional (4D) Flow Magnetic Resonance Imaging," 7 pages.
Restriction Requirement, dated Sep. 9, 2015, for U.S. Appl. No. 14/118,964, Hsiao et al., "Comprehensive Cardiovascular Analysis With Volumetric Phase-Contrast MRI," 7 pages.
Ronneberger et al., "U-Net: Convolutional Networks for Biomedical Image Segmentation," *18th International Conference on Medical Image Computing and Computer-Assisted Intervention*, Munich, Germany, Oct. 5-9, 2015, pp. 234-241.
Rosenfeld et al., "An Improved Method of Angle Detection on Digital Curves," *IEEE Transactions on Computers C-24*(9):940-941, 1975.
Russakovsky et al., "ImageNet Large Scale Visual Recognition Challenge," *International Journal of Computer Vision 115*(3):211-252, 2015.
Salehinejad et al., "Generalization of Deep Neural Networks for Chest Pathology Classification in X-Rays Using Generative Adversarial Networks," arXiv:1712.01636v2 [cs.CV], Feb. 12, 2018, 5 pages.
Schulz-Menger, "Standardized image interpretation and post processing in cardiovascular magnetic resonance: Society for Cardiovascular Magnetic Resonance (SCMR) Board of Trustees Task Force on Standardized Post Processing," *Journal of Cardiovascular Magnetic Resonance 15*:35, 2013. (19 pages).
Shrivastava et al., "Learning from Simulated and Unsupervised Images through Adversarial Training," arXiv:1612.07828v2 [cs.CV], Jul. 19, 2017, 16 pages.
Simard et al., "Best Practices for Convolutional Neural Networks Applied to Visual Document Analysis," *7th International Conference on Document Analysis and Recognition*, Edinburgh, United Kingdom, Aug. 3-6, 2003, pp. 958-963.
Simpson et al., "Estimation of Coherence Between Blood Flow and Spontaneous EEG Activity in Neonates," *IEEE Transactions on Biomedical Engineering 52*(5):852-858, 2005.

(56) References Cited

OTHER PUBLICATIONS

Sixt et al., "RenderGAN: Generating Realistic Labeled Data," arXiv:1611.01331v5 [cs.NE], Jan. 12, 2017, 15 pages.
Supplemental Amendment, filed Jun. 6, 2016, for U.S. Appl. No. 14/118,964, Hsiao et al., "Comprehensive Cardiovascular Analysis With Volumetric Phase-Contrast MRI," 21 pages.
Suzuki, "Pixel-Based Machine Learning in Medical Imaging," *International Journal of Biomedical Imaging 2012*:792079, 2012. (18 pages).
Taerum et al., "Automated Lesion Detection, Segmentation, and Longitudinal Identification," U.S. Appl. No. 62/589,825, filed Nov. 22, 2017, 192 pages.
Töger et al., "Vortex Ring Formation in the Left Ventricle of the Heart: Analysis by 4D Flow MRI and Lagrangian Coherent Structures," *Annals of Biomedical Engineering 40*(12):2652-2662, 2012.
Tran, "A Fully Convolutional Neural Network for Cardiac Segmentation in Short-Axis MRI," *The Computing Research Repository 1604.00494*, 2016. (21 pages).
Van Riel et al., "Observer Viability for Classification of Pulmonary Nodules on Low-Dose CT Images and Its Effect on Nodule Management," *Radiology 277*(3):863-871, 2015.
Walker et al., "Semiautomated method for noise reduction and background phase error correction in MR phase velocity data," *Journal of Magnetic Resonance Imaging 3*(3):521-530, 1993.
Wolterink et al., "Deep MR to CT Synthesis using Unpaired Data," arXiv:1708.01155v1 [cs.CV], Aug. 3, 2017, 10 pages.
Wong et al., "Segmentation of Myocardium Using Velocity Field Constrained Front Propagation," *6th IEEE Workshop on Applications of Computer Vision*, Orlando, Florida, USA, Dec. 3-4, 2002, pp. 84-89.
Yu et al., "Multi-Scale Context Aggregation by Dilated Convolutions," *International Conference on Learning Representations*, San Juan, Puerto Rico, May 2-4, 2016, 13 pages.
Yuh et al., "Interpretation and Quantification of Emergency Features on Head Computed Tomography," U.S. Appl. No. 62/269,778, filed Dec. 18, 2015, 44 pages.
Zhao et al., "Performance of computer-aided detection of pulmonary nodules in low-dose CT: comparison with double reading by nodule volume," *European Radiology 22*(10):2076-2084, 2012.
Zhao et al., "Synthesizing Filamentary Structured Images with GANs," arXiv:1706.02185v1 [cs.CV], Jun. 7, 2017, 10 pages.
Zhu et al., "A geodesic-active-contour-based variational model for short-axis cardiac MR image segmentation," *International Journal of Computer Mathematics 90*(1):124-139, 2013. (18 pages).
Zhu et al., "Unpaired Image-to-Image Translation using Cycle-Consistent Adversarial Networks," arXiv:1703.10593v4 [cs.CV], Feb. 19, 2018, 20 pages.
Cerqueira et al., "Standardization myocardial segmentation and nomenclature for tomographic imaging of the heart," *Circulation* 105.4:539-542, 2002.
Chen et al., "Iterative Multi-Domain Regularized Deep Learning for Anatomical Structure Detection and Segmentation from Ultrasound Images," arXiv, Jul. 7, 2016.
Chinese Office Action and Search Report, dated Mar. 2, 2020, for Chinese Application No. 201680080450.3, 31 pages. (with English Translation).
Christian et al., "Absolute myocardial perfusion in canines measured by using dual-bolus first-pass MR imaging," *Radiology 232. 3*:677-684, 2004.
Drozdzal et al., "The Importance of Skip Connections in Biomedical Image Segmentation," arXiv, Sep. 22, 2016.
Extendend European Search Report, dated Jul. 2, 2019, for European Application No. 16869356.2-1210 / 3380859, 10 pages.
Golden et al., "Automated Cardiac Volume Segmentation," U.S. Appl. No. 62/415,666, filed Nov. 1, 2016, 119 pages.
International Preliminary Report on Patentability, dated Dec. 3, 2019, for International Application No. PCT/US2018/035192, 18 pages.
International Preliminary Report on Patentability, dated Jul. 30, 2019, for International Application No. PCT/US2018/015222, 10 pages.
International Preliminary Report on Patentability, dated May 26, 2020, for International Application No. PCT/US2018/061352, 34 pages.
International Search Report and Written Opinion, dated May 31, 2019, for International Application No. PCT/US2018/061352, 40 pages.
Karim et al., "Evaluation of current algorithms for segmentation of scar tissue from late gadolinium enhancement cardiovascular magnetic resonance of the left atrium: an open-access grand challenge," *Journal of Cardiovascular Magnetic Resonance 15.1*:105, 2013.
Lin et al., "Focal Loss for Dense Object Detection," arXiv:1708.02002v1 [cs.CV], Aug. 7, 2017, 10 pages.
Ronneberger et al., "U-Net: Convolutional Networks for Biomedical Image Segmentation," arXiv:1505.04597v1 [cs.CV], May 18, 2015, 8 pages.
Silverman, "Density estimation for statistics and data analysis," vol. 26m CRC Press, 1986.
Vilarino et al., "Discrete-time CNN for image segmentation by active contours," *Pattern Recognition Letters 19*:721-734, 1998.

\* cited by examiner

AUTOMATED CARDIAC VOLUME SEGMENTATION

BACKGROUND

Technical Field

The present disclosure generally relates to automated segmentation of anatomical structures.

Description of the Related Art

Magnetic Resonance Imaging (MRI) is often used in cardiac imaging to assess patients with known or suspected cardiac pathologies. In particular, cardiac MRI may be used to quantify metrics related to heart failure and similar pathologies through its ability to accurately capture high-resolution cine images of the heart. These high-resolution images allow the volumes of relevant anatomical regions of the heart (such as the ventricles and muscle) to be measured, either manually, or with the help of semi- or fully-automated software.

A cardiac MRI cine sequence consists of one or more spatial slices, each of which contains multiple time points (e.g., 20 time points) throughout a full cardiac cycle. Typically, some subset of the following views are captured as separate series: The short axis (SAX) view, which consists of a series of slices along the long axis of the left ventricle. Each slice is in the plane of the short axis of the left ventricle, which is orthogonal to the ventricle's long axis; the 2-chamber (2CH) view, a long axis (LAX) view that shows either the left ventricle and left atrium or the right ventricle and right atrium; the 3-chamber (3CH) view, an LAX view that shows the either the left ventricle, left atrium and aorta, or the right ventricle, right atrium and aorta; and the 4-chamber (4CH) view, a LAX view that shows the left ventricle, left atrium, right ventricle and right atrium.

Depending on the type of acquisition, these views may be captured directly in the scanner (e.g., steady-state free precession (SSFP) MRI) or may be created via multi-planar reconstructions (MPRs) of a volume aligned in a different orientation (such as the axial, sagittal or coronal planes, e.g., 4D Flow MRI). The SAX view has multiple spatial slices, usually covering the entire volume of the heart, but the 2CH, 3CH and 4CH views often only have a single spatial slice. All series are cine, and have multiple time points encompassing a complete cardiac cycle.

Several important measurements of cardiac function depend on accurate measurements of ventricular volume. For example, ejection fraction (EF) represents the fraction of blood in the left ventricle (LV) that is pumped out with every heartbeat. Abnormally low EF readings are often associated with heart failure. Measurement of EF depends on the ventricular blood pool volume both at the end systolic phase, when the LV is maximally contracted, and at the end diastolic phase, when the LV is maximally dilated.

In order to measure the volume of the LV, the ventricle is typically segmented in the SAX view. The radiologist reviewing the case will first determine the end systole (ES) and end diastole (ED) time points by manually cycling through time points for a single slice and determining the time points at which the ventricle is maximally contracted or dilated, respectively. After determining those two time points, the radiologist will draw contours around the LV in all slices of the SAX series where the ventricle is visible.

Once the contours are created, the area of the ventricle in each slice may be calculated by summing the pixels within the contour and multiplying by the in-plane pixel spacing (e.g., in mm per pixel) in the x and y directions. The total ventricular volume can then be determined by summing the areas in each spatial slice and multiplying by the distance between slices (e.g., in millimeters (mm)). This yields a volume in cubic mm. Other methods of integrating over the slice areas to determine the total volume may also be used, such as variants of Simpson's rule, which, instead of approximating the discrete integral using straight line segments, does so using quadratic segments. Volumes are typically calculated at ES and ED, and ejection fraction and similar metrics may be determined from the volumes.

To measure the LV blood pool volume, the radiologist typically creates contours along the LV endocardium (interior wall of the myocardial muscle) on about 10 spatial slices at each of two time points (ES and ED), for a total of about 20 contours. Although some semi-automated contour placement tools exist (e.g., using an active contours or "snakes" algorithm), these still typically require some manual adjustment of the contours, particularly with images that have noise or artifacts. The whole process of creating these contours may take 10 minutes or more, mostly involving manual adjustments. Example LV endocardium contours are shown as images $100a$-$100k$ in FIG. 1, which shows the contours at a single time point over a full SAX stack. From $100a$ to $100k$, the slices proceed from the apex of the left ventricle to the base of the left ventricle.

Although the above description is specific to measurements of the LV blood pool (via contouring of the LV endocardium) the same volume measurements often need to be performed on the right ventricle (RV) blood pool for assessing functional pathology in the right ventricle. In addition, measurements are sometimes needed of the myocardial (heart muscle) mass, which requires contouring the epicardium (the outer surface of the myocardium). Each of these four contours (LV endocardium, LV epicardium, RV endocardium, RV epicardium) can take an experienced radiologist on the order of 10 minutes or more to create and correct, even using semi-automated tools. Creating all four contours can take 30 minutes or longer.

The most obvious consequence of the onerousness of this process is that reading cardiac MRI studies is expensive. Another important consequence is that contour-based measurements are generally not performed unless absolutely necessary, which limits the diagnostic information that can be extracted from each performed cardiac MRI study. Fully automated contour generation and volume measurement would clearly have a significant benefit, not only to radiologist throughput, but also to the quantity of diagnostic information that can be extracted from each study.

Limitations of Active Contours-Based Methods

The most basic method of creating ventricular contours is to complete the process manually with some sort of polygonal or spline drawing tool, without any automated algorithms or tools. In this case, the user may, for example, create a freehand drawing of the outline of the ventricle, or drop spline control points which are then connected with a smoothed spline contour. After initial creation of the contour, depending on the software's user interface, the user typically has some ability to modify the contour, e.g., by moving, adding or deleting control points or by moving the spline segments.

To reduce the onerousness of this process, most software packages that support ventricular segmentation include semi-automated segmentation tools. One algorithm for semi-automated ventricular segmentation is the "snakes" algorithm (known more formally as "active contours"). See Kass, M., Witkin, A., & Terzopoulos, D. (1988). "Snakes: Active contour models." *International Journal of Computer Vision,* 1(4), 321-331. The snakes algorithm generates a deformable spline, which is constrained to wrap to intensity gradients in the image through an energy-minimization approach. Practically, this approach seeks to both constrain the contour to areas of high gradient in the image (edges) and also minimize "kinks" or areas of high orientation gradient (curvature) in the contour. The optimal result is a smooth contour that wraps tightly to the edges of the image. An example successful result from the snakes algorithm on the left ventricle endocardium in a 4D Flow cardiac study is shown in an image 200 FIG. 2, which shows a contour 202 for the LV endocardium.

Although the snakes algorithm is common, and although modifying its resulting contours can be significantly faster than generating contours from scratch, the snakes algorithm has several significant disadvantages. In particular, the snakes algorithm requires a "seed." The "seed contour" that will be improved by the algorithm must be either set by the user or by a heuristic. Moreover, the snakes algorithm knows only about local context. The cost function for snakes typically awards credit when the contour overlaps edges in the image; however, there is no way to inform the algorithm that the edge detected is the one desired; e.g., there is no explicit differentiation between the endocardium versus the border of other anatomical entities (e.g., the other ventricle, the lungs, the liver). Therefore, the algorithm is highly reliant on predictable anatomy and the seed being properly set. Further, the snakes algorithm is greedy. The energy function of snakes is often optimized using a greedy algorithm, such as gradient descent, which iteratively moves the free parameters in the direction of the gradient of the cost function. However, gradient descent, and many similar optimization algorithms, are susceptible to getting stuck in local minima of the cost function. This manifests as a contour that is potentially bound to the wrong edge in the image, such as an imaging artifact or an edge between the blood pool and a papillary muscle. Additionally, the snakes algorithm has a small representation space. The snakes algorithm generally has only a few dozen tunable parameters, and therefore doesn't have the capacity to represent a diverse set of possible images on which segmentation is desired. Many different factors can affect the perceived captured image of the ventricle, including anatomy (e.g., size, shape of ventricle, pathologies, prior surgeries, papillary muscles), imaging protocol (e.g., contrast agents, pulse sequence, scanner type, receiver coil quality and type, patient positioning, image resolution) and other factors (e.g., motion artifacts). Because of the great diversity on recorded images and the small number of tunable parameters, a snakes algorithm can only perform well on a small subset of "well-behaved" cases.

Despite these and other disadvantages of the snakes algorithm, the snakes algorithm's popularity primarily stems from the fact that the snakes algorithm can be deployed without any explicit "training," which makes it relatively simple to implement. However, the snakes algorithm cannot be adequately tuned to work on more challenging cases.

Challenges of Excluding Papillary Muscles from Blood Pool

Papillary muscles are muscles on the interior of the endocardium of both the left and right ventricles. Papillary muscles serve to keep the mitral and tricuspid valves closed when the pressure on the valves increases during ventricular contraction. FIG. 3 shows example SSFP MRI images 300*a* (end diastole) and 300*b* (end systole) which show the papillary muscles and myocardium of the left ventricle. Note that at end diastole (image 300*a*), the primary challenge is in distinguishing the papillary muscles from the blood pool in which they are embedded, while at end systole (image 300*b*), the primary challenge is in distinguishing the papillary muscles from the myocardium.

When performing a segmentation of the ventricular blood pool (either manual or automated), the papillary muscles may be either included within the contour or excluded from the contour. Note that the contour that surrounds the blood pool is often colloquially referred to as an "endocardium contour," regardless of whether the papillary muscles are included within the contour or excluded from the contour. In the latter case, the term "endocardium" is not strictly accurate because the contour does not smoothly map to the true surface of the endocardium; despite this, the term "endocardium contour" is used for convenience.

Endocardium contours are typically created on every image in the SAX stack to measure the blood volume within the ventricle. The most accurate measure of blood volume will therefore be made if the papillary muscles are excluded from the endocardium contour. However, because the muscles are numerous and small, excluding them from a manual contour requires significantly more care to be taken when creating the contour, dramatically increasing the onerousness of the process. As a result, when creating manual contours, the papillary muscles are typically included within the endocardium contour, resulting in a modest overestimate of the ventricular blood volume. Technically, this measures the sum of the blood pool volume and the papillary muscle volume.

Automated or semi-automated utilities may speed up the process of excluding the papillary muscles from the endocardium contour, but they have significant caveats. The snakes algorithm (discussed above) is not appropriate for excluding the papillary muscles at end diastole because its canonical formulation only allows for contouring of a single connected region without holes. Although the algorithm may be adapted to handle holes within the contour, the algorithm would have to be significantly reformulated to handle both small and large connected regions simultaneously since the papillary muscles are so much smaller than the blood pool. In short, it is not possible for the canonical snakes algorithm to be used to segment the blood pool and exclude the papillary muscles at end diastole.

At end systole, when the majority of the papillary muscle mass abuts the myocardium, the snakes algorithm will by default exclude the majority of the papillary muscles from the endocardium contour and it cannot be made to include them (since there is little or no intensity boundary between the papillary muscles and the myocardium). Therefore, in the standard formulation, the snakes algorithm can only include the papillary muscles at end diastole and only exclude them at end systole, resulting in inconsistent measurements of blood pool volume over the course of a cardiac cycle. This is a major limitation of the snakes algorithm, preventing clinical use of its output without significant correction by the user.

An alternate semi-automated method of creating a blood pool contour is using a "flood fill" algorithm. Under the flood fill algorithm, the user selects an initial seed point, and all pixels that are connected to the seed point whose intensity gradients and distance from the seed point do not exceed a threshold are included within the selected mask. Although, like the snakes algorithm, flood fill requires the segmented region to be connected, flood fill carries the advantage that it allows for the connected region to have holes. Therefore, because papillary muscles can be distinguished from the blood pool based on their intensity, a flood fill algorithm can be formulated—either dynamically through user input, or in a hard-coded fashion—to exclude papillary muscles from the segmentation. Flood fill could also be used to include papillary muscles from the endocardium segmentation at end diastole; however, at end systole, because the bulk of the papillary muscles are connected to the myocardium (making the two regions nearly indistinguishable from one another), flood fill cannot be used to include the papillary muscles within the endocardium segmentation.

Beyond the inability to distinguish papillary muscles from myocardium at end systole, the major disadvantage of flood fill is that, though it may significantly reduce the effort required for the segmentation process when compared to a fully-manual segmentation, it still requires a great deal of user input to dynamically determine the flood fill gradient and distance thresholds. The applicant has found that, while accurate segmentations can be created using a flood fill tool, creating them with acceptable clinical precision still requires significant manual adjustment.

Challenges of Segmenting Basal Slices on the Short Axis View

Cardiac segmentations are typically created on images from a short axis or SAX stack. One major disadvantage of performing segmentations on the SAX stack is that the SAX plane is nearly parallel to the plane of the mitral and tricuspid valves. This has two effects. First, the valves are very difficult to distinguish on slices from the SAX stack. Second, assuming the SAX stack is not exactly parallel to the valve plane, there will be at least one slice near the base of the heart that is partially in the ventricle and partially in the atrium.

An example case where both the left ventricle and left atrium are visible in a single slice is shown in images 400a and 400b of FIG. 4. If the clinician fails to refer to the current SAX slice projected on a corresponding LAX view, it may not be obvious that the SAX slice spans both the ventricle and atrium. Further, even if the LAX view is available, it may be difficult to tell on the SAX slice where the valve is located, and therefore, where the segmentation of the ventricle should end, since the ventricle and atrium have similar signal intensities. Segmentation near the base of the heart is therefore one of the major sources of error for ventricular segmentation.

Landmarks

In the 4D Flow workflow of a cardiac imaging application, the user may be required to define the regions of different landmarks in the heart in order to see different cardiac views (e.g., 2CH, 3CH, 4CH, SAX) and segment the ventricles. The landmarks required to segment the LV and see 2CH, 3CH, and 4CH left heart views include LV apex, mitral valve, and aortic valve. The landmarks required to segment the RV and see the corresponding views include RV apex, tricuspid valve and pulmonary valve.

A pre-existing method to locate landmarks on 3D T1-weighted MRI is described in Payer, Christian, Darko Štern, Horst Bischof, and Martin Urschler. "Regressing Heatmaps for Multiple Landmark Localization using CNNs." In Proc Medical Image Computing & Computer Assisted Intervention (MICCAI) 2016. Springer Verlag. The method developed in this paper is referred to herein as "LandMarkDetect." LandMarkDetect is based on two notable components. First, a variation of the U-Net neural network is used, as discussed in Ronneberger, Olaf, Philipp Fischer, and Thomas Brox. "U-net: Convolutional networks for biomedical image segmentation." In International Conference on Medical Image Computing and Computer-Assisted Intervention, pp. 234-241. Springer International Publishing, 2015. Second, the landmark is encoded during training using a Gaussian function of arbitrarily chosen standard deviation. The LandMarkDetect neural network 500 of FIG. 5 differs from U-Net in the use of average pooling layers in place of max pooling layers.

One limitation of LandMarkDetect is the lack of method to handle missing landmarks. It is assumed that every single landmark has been precisely located on each image. Another limitation is the absence of hyperparameter search except for the kernel and layer size. Yet another limitation is the fixed upsampling layer with no parameter to learn. Further, LandMarkDetect relies on a limited pre-processing strategy which consists in removing the mean (i.e. centering the input data) of the 3D image.

Accordingly, there is a need for systems and methods which address some or all of the above-discussed shortcomings.

BRIEF SUMMARY

A machine learning system may be summarized as including at least one nontransitory processor-readable storage medium that stores at least one of processor-executable instructions or data; and at least one processor communicably coupled to the at least one nontransitory processor-readable storage medium, the at least one processor: receives learning data including a plurality of batches of labeled image sets, each image set including image data representative of an anatomical structure, and each image set including at least one label which identifies the region of a particular part of the anatomical structure depicted in each image of the image set; trains a fully convolutional neural network (CNN) model to segment at least one part of the anatomical structure utilizing the received learning data; and stores the trained CNN model in the at least one nontransitory processor-readable storage medium of the machine learning system. The CNN model may include a contracting path and an expanding path, the contracting path may include a number of convolutional layers and a number of pooling layers, each pooling layer preceded by at least one convolutional layer, and the expanding path may include a number of convolutional layers and a number of upsampling layers, each upsampling layer preceded by at least one convolutional layer and includes a transpose convolution operation which performs upsampling and interpolation with a learned kernel. Subsequent to each upsampling layer, the CNN model may include a concatenation of feature maps from a corresponding layer in the contracting path through a skip connection. The image data may be representative of a heart during one or more time points throughout a cardiac cycle. The image data may include ultrasound data or visible light photograph data. The CNN model may include a contracting path which may include a first convolutional layer which has between 1 and 2000 feature maps. The CNN model may include a number of convolutional layers, and each convolutional layer may include a convolutional kernel of size 3×3 and a stride of 1. The CNN model may include a number of pooling layers, and each pooling layer may include a 2×2 max-pooling layer with a stride of 2. The CNN model may include four pooling layers and four upsampling layers. The CNN model may include a number of convolutional layers, and the CNN model may pad the input to each convolutional layer using a zero padding operation. The CNN model may include a plurality of nonlinear activation function layers.

The at least one processor may augment the learning data via modification of at least some of the image data in the plurality of batches of labeled image sets.

The at least one processor may modify at least some of the image data in the plurality of batches of labeled image sets according to at least one of: a horizontal flip, a vertical flip, a shear amount, a shift amount, a zoom amount, a rotation amount, a brightness level, or a contrast level.

The CNN model may include a plurality of hyperparameters stored in the at least one nontransitory processor-readable storage medium, and the at least one processor may configure the CNN model according to a plurality of configurations, each configuration including a different combination of values for the hyperparameters; for each of the plurality of configurations, validate the accuracy of the CNN model; and select at least one configuration based at least in part on the accuracies determined by the validations.

The at least one processor may, for each image set, identify whether the image set is missing a label for any of a plurality of parts of the anatomical structure; and for image sets identified as missing at least one label, modify a training loss function to account for the identified missing labels. The image data may include volumetric images, and each label may include a volumetric label mask or contour. Each convolutional layer of the CNN model may include a convolutional kernel of size N×N×K pixels, where N and K are positive integers. Each convolutional layer of the CNN model may include a convolutional kernel of size N×M pixels, where N and M are positive integers. The image data may be representative of a heart during one or more time points throughout a cardiac cycle, wherein a subset of the plurality of batches of labeled image sets may include labels which exclude papillary muscles. For each processed image, the CNN model may utilize data for at least one image which may be at least one of: adjacent to the processed image with respect to space or adjacent to the processed image with respect to time. For each processed image, the CNN model may utilize data for at least one image which may be adjacent to the processed image with respect to space and may utilize data for at least one image which is adjacent to the processed image with respect to time. For each processed image, the CNN model may utilize at least one of temporal information or phase information. The image data may include at least one of steady-state free precession (SSFP) magnetic resonance imaging (MRI) data or 4D flow MRI data.

A method of operating a machine learning system may include at least one nontransitory processor-readable storage medium that may store at least one of processor-executable instructions or data, and at least one processor communicably coupled to the at least one nontransitory processor-readable storage medium, and may be summarized as including receiving, by the at least one processor, learning data including a plurality of batches of labeled image sets, each image set including image data representative of an anatomical structure, and each image set including at least one label which identifies the region of a particular part of the anatomical structure depicted in each image of the image set; training, by the at least one processor, a fully convolutional neural network (CNN) model to segment at least one part of the anatomical structure utilizing the received learning data; and storing, by the at least one processor, the trained CNN model in the at least one nontransitory processor-readable storage medium of the machine learning system. Training the CNN model may include training a CNN model including a contracting path and an expanding path, the contracting path may include a number of convolutional layers and a number of pooling layers, each pooling layer preceded by at least one convolutional layer, and the expanding path may include a number of convolutional layers and a number of upsampling layers, each upsampling layer preceded by at least one convolutional layer and may include a transpose convolution operation which performs upsampling and interpolation with a learned kernel. Training a CNN model may include training a CNN model to segment at least one part of the anatomical structure utilizing the received learning data and, subsequent to each upsampling layer, the CNN model may include a concatenation of feature maps from a corresponding layer in the contracting path through a skip connection. Receiving learning data may include receiving image data that may be representative of a heart during one or more time points throughout a cardiac cycle. Training a CNN model may include training a CNN model to segment at least one part of the anatomical structure utilizing the received learning data, and the CNN model may include a contracting path which may include a first convolutional layer which has between 1 and 2000 feature maps. Training a CNN model may include training a CNN model which may include a plurality of convolutional layers to segment at least one part of the anatomical structure utilizing the received learning data, and each convolutional layer may include a convolutional kernel of size 3×3 and a stride of 1. Training a CNN model may include training a CNN model which may include a plurality of pooling layers to segment at least one part of the anatomical structure utilizing the received learning data, and each pooling layer may include a 2×2 max-pooling layer with a stride of 2.

A CNN model may include training a CNN model to segment at least one part of the anatomical structure utilizing the received learning data, and the CNN model may include four pooling layers and four upsampling layers.

A CNN model may include training a CNN model which may include a plurality of convolutional layers to segment at least one part of the anatomical structure utilizing the received learning data, and the CNN model may pad the input to each convolutional layer using a zero padding operation.

A CNN model may include training a CNN model to segment at least one part of the anatomical structure utilizing the received learning data, and the CNN model may include a plurality of nonlinear activation function layers.

The method may further include augmenting, by the at least one processor, the learning data via modification of at least some of the image data in the plurality of batches of labeled image sets.

The method may further include modifying, by the at least one processor, at least some of the image data in the plurality of batches of labeled image sets according to at least one of: a horizontal flip, a vertical flip, a shear amount, a shift amount, a zoom amount, a rotation amount, a brightness level, or a contrast level.

The CNN model may include a plurality of hyperparameters stored in the at least one nontransitory processor-readable storage medium, and may further include configuring, by the at least one processor, the CNN model according to a plurality of configurations, each configuration comprising a different combination of values for the hyperparameters; for each of the plurality of configurations, validating, by the at least one processor, the accuracy of the CNN model; and selecting, by the at least one processor, at least one configuration based at least in part on the accuracies determined by the validations.

The method may further include for each image set, identifying, by the at least one processor, whether the image set is missing a label for any of a plurality of parts of the anatomical structure; and for image sets identified as missing at least one label, modifying, by the at least one processor, a training loss function to account for the identified missing labels. Receiving learning data may include receiving image data which may include volumetric images, and each label may include a volumetric label mask or contour.

A CNN model may include training a CNN model which may include a plurality of convolutional layers to segment at least one part of the anatomical structure utilizing the received learning data, and each convolutional layer of the CNN model may include a convolutional kernel of size N×N×K pixels, where N and K are positive integers.

A CNN model may include training a CNN model which may include a plurality of convolutional layers to segment at least one part of the anatomical structure utilizing the received learning data, and each convolutional layer of the CNN model may include a convolutional kernel of size N×M pixels, where N and M are positive integers. Receiving learning data may include receiving image data representative of a heart during one or more time points throughout a cardiac cycle, and wherein a subset of the plurality of batches of labeled image sets may include labels which exclude papillary muscles. Training a CNN model may include training a CNN model to segment at least one part of the anatomical structure utilizing the received learning data, and for each processed image, the CNN model may utilize data for at least one image which is at least one of: adjacent to the processed image with respect to space or adjacent to the processed image with respect to time. Training a CNN model may include training a CNN model to segment at least one part of the anatomical structure utilizing the received learning data, and for each processed image, the CNN model may utilize data for at least one image which is adjacent to the processed image with respect to space and utilizes data for at least one image which is adjacent to the processed image with respect to time. Training a CNN model may include training a CNN model to segment at least one part of the anatomical structure utilizing the received learning data, and for each processed image, the CNN model may utilize at least one of temporal information or phase information. Receiving learning data may include receiving image data which may include at least one of steady-state free precession (SSFP) magnetic resonance imaging (MRI) data or 4D flow MRI data.

A machine learning system may be summarized as including at least one nontransitory processor-readable storage medium that stores at least one of processor-executable instructions or data; and at least one processor communicably coupled to the at least one nontransitory processor-readable storage medium, the at least one processor: receives image data which represents an anatomical structure; processes the received image data through a fully convolutional neural network (CNN) model to generate per-class probabilities for each pixel of each image of the image data, each class corresponding to one of a plurality of parts of the anatomical structure represented by the image data; and for each image of the image data, generates a probability map for each of the plurality of classes using the generated per-class probabilities; and stores the generated probability maps in the at least one nontransitory processor-readable storage medium. The CNN model may include a contracting path and an expanding path, the contracting path may include a number of convolutional layers and a number of pooling layers, each pooling layer preceded by at least one convolutional layer, and the expanding path may include a number of convolutional layers and a number of upsampling layers, each upsampling layer preceded by at least one convolutional layer and may include a transpose convolution operation which performs upsampling and interpolation with a learned kernel. The image data may be representative of a heart during one or more time points throughout a cardiac cycle.

The at least one processor may autonomously cause an indication of at least one of the plurality of parts of the anatomical structure to be displayed on a display based at least in part on the generated probability maps. The at least one processor may post-process the processed image data to ensure at least one physical constraint is met. The image data may be representative of a heart during one or more time points throughout a cardiac cycle, and the at least one physical constraint may include at least one of: the volume of the myocardium is the same at all time points, or the right ventricle and the left ventricle cannot overlap each other. The at least one processor may, for each image of the image data, transform the plurality of probability maps into a label mask by setting the class of each pixel to the class with the highest probability. The at least one processor may, for each image of the image data, set the class of each pixel to a background class when all of the class probabilities for the pixel are below a determined threshold. The at least one processor may, for each image of the image data, set the class of each pixel to a background class when the pixel is not part of a largest connected region for the class to which the pixel is associated. The at least one processor may convert each of the label masks for the image data into respective spline contours. The at least one processor may autonomously cause the generated contours to be displayed with the image data on a display. The at least one processor may receive a user modification of at least one of the displayed contours; and store the modified contour in the at least one nontransitory processor-readable storage medium. The at least one processor may determine the volume of at least one of the plurality of parts of the anatomical structure utilizing the generated contours. The anatomical structure may include a heart, and the at least one processor may determine the volume of at least one of the plurality of parts of the heart at a plurality of time points of a cardiac cycle utilizing the generated contours. The at least one processor may automatically determine which of the plurality of time points of the cardiac cycle correspond to an end systole phase and an end diastole phase of the cardiac cycle based on the time points determined to have a minimum volume and a maximum volume, respectively. The at least one processor may cause the determined volume of the at least one of the plurality of parts of the anatomical structure to be displayed on a display. The image data may include volumetric images. Each convolutional layer of the CNN model may include a convolutional kernel of sizes N×N×K pixels, where N and K are positive integers.

A method of operating a machine learning system may include at least one nontransitory processor-readable storage medium that stores at least one of processor-executable instructions or data, and at least one processor communicably coupled to the at least one nontransitory processor-readable storage medium, and may be summarized as including receiving, by the at least one processor, image data which represents an anatomical structure; processing, by the at least one processor, the received image data through a fully convolutional neural network (CNN) model to generate per-class probabilities for each pixel of each image of the image data, each class corresponding to one of a plurality of parts of the anatomical structure represented by the image data; and for each image of the image data, generating, by the at least one processor, a probability map for each of the plurality of classes using the generated per-class probabilities; and storing, by the at least one processor, the generated probability maps in the at least one nontransitory processor-readable storage medium. Processing the received image data through the CNN model may include processing the received image data through a CNN model which may include a contracting path and an expanding path, the contracting path may include a number of convolutional layers and a number of pooling layers, each pooling layer preceded by at least one convolutional layer, and the expanding path may include a number of convolutional layers and a number of upsampling layers, each upsampling layer preceded by at least one convolutional layer and may include a transpose convolution operation which performs upsampling and interpolation with a learned kernel. Receiving image data may include receiving image data that is representative of a heart during one or more time points throughout a cardiac cycle.

The method may further include autonomously causing, by the at least one processor, an indication of at least one of the plurality of parts of the anatomical structure to be displayed on a display based at least in part on the generated probability maps.

The method may further include post-processing, by the at least one processor, the processed image data to ensure at least one physical constraint is met. Receiving image data may include receiving image data that may be representative of a heart during one or more time points throughout a cardiac cycle, and the at least one physical constraint may include at least one of: the volume of the myocardium is the same at all time points, or the right ventricle and the left ventricle cannot overlap each other.

The method may further include for each image of the image data, transforming, by the at least one processor, the plurality of probability maps into a label mask by setting the class of each pixel to the class with the highest probability.

The method may further include for each image of the image data, setting, by the at least one processor, the class of each pixel to a background class when all of the class probabilities for the pixel are below a determined threshold.

The method may further include for each image of the image data, setting, by the at least one processor, the class of each pixel to a background class when the pixel is not part of a largest connected region for the class to which the pixel is associated.

The method may further include converting, by the at least one processor, each of the label masks for the image data into respective spline contours.

The method may further include autonomously causing, by the at least one processor, the generated contours to be displayed with the image data on a display.

The method may further include receiving, by the at least one processor, a user modification of at least one of the displayed contours; and storing, by the at least one processor, the modified contour in the at least one nontransitory processor-readable storage medium.

The method may further include determining, by the at least one processor, the volume of at least one of the plurality of parts of the anatomical structure utilizing the generated contours.

The anatomical structure may include a heart, and the method may further include determining, by the at least one processor, the volume of at least one of the plurality of parts of the heart at a plurality of time points of a cardiac cycle utilizing the generated contours.

The method may further include automatically determining, by the at least one processor, which of the plurality of time points of the cardiac cycle correspond to an end systole phase and an end diastole phase of the cardiac cycle based on the time points determined to have a minimum volume and a maximum volume, respectively.

The method may further include causing, by the at least one processor, the determined volume of the at least one of the plurality of parts of the anatomical structure to be displayed on a display. Receiving image data may include receiving volumetric image data. Processing the received image data through a CNN model may include processing the received image data through a CNN model in which each convolutional layer may include a convolutional kernel of sizes N×N×K pixels, where N and K are positive integers.

A machine learning system may be summarized as including at least one nontransitory processor-readable storage medium that stores at least one of processor-executable instructions or data; and at least one processor communicably coupled to the at least one nontransitory processor-readable storage medium, the at least one processor: receives a plurality of sets of 3D MRI images, the images in each of the plurality of sets represent an anatomical structure of a patient; receives a plurality of annotations for the plurality of sets of 3D MRI images, each annotation indicative of a landmark of an anatomical structure of a patient depicted in a corresponding image; trains a convolutional neural network (CNN) model to predict the locations of the plurality of landmarks utilizing the 3D MRI images; and stores the trained CNN model in the at least one nontransitory processor-readable storage medium of the machine learning system. The at least one processor may train a fully convolutional neural network (CNN) model to predict the locations of the plurality of landmarks utilizing the 3D MRI images. The at least one processor may train a CNN model which has an output which is one or more sets of spatial coordinates, each set of the one or more spatial coordinates identifying a location of one of the plurality of landmarks. The CNN model may include a contracting path followed by one or more fully connected layers. The CNN model may include a contracting path and an expanding path, the contracting path may include a number of convolutional layers and a number of pooling layers, each pooling layer preceded by one or more convolutional layers, and the expanding path may include a number of convolutional layers and a number of upsampling layers, each upsampling layer preceded by one or more convolutional layers and comprises a transpose convolution operation which performs upsampling and interpolation with a learned kernel.

The at least one processor may, for each of one or more landmarks of the anatomical structure, define a 3D label map based at least in part on the received sets of 3D MRI images and the received plurality of annotations, each 3D label map may encode a likelihood that the landmark is located at a particular location on the 3D label map, wherein the at least one processor may train the CNN model to segment the one or more landmarks utilizing the 3D MRI images and the generated 3D label maps. The images in each of the plurality of sets may represent a heart of a patient at different respective time points of a cardiac cycle, and each annotation may be indicative of a landmark of a heart of a patient depicted in a corresponding image.

The at least one processor may, receive a set of 3D MRI images; process the received 3D MRI images through the CNN model to detect at least one of the one or more landmarks; and cause the detected at least one of the plurality of landmarks to be presented on a display. The at least one processor may process the received 3D MRI images through the CNN model and outputs at least one of: a point or a label map. The at least one processor may process the received 3D MRI images through the CNN model to detect at least one of the plurality of landmarks at a plurality of time points; and cause the detected at least one of the plurality of landmarks at a plurality of time points to be presented on a display. The CNN model may utilize phase information associated with the received 3D MRI images.

A method of operating a machine learning system may include at least one nontransitory processor-readable storage medium that may store at least one of processor-executable instructions or data, and at least one processor communicably coupled to the at least one nontransitory processor-readable storage medium, and may be summarized as including receiving, by the at least one processor, a plurality of sets of 3D MRI images, the images in each of the plurality of sets represent an anatomical structure of a patient; receiving, by the at least one processor, a plurality of annotations for the plurality of sets of 3D MRI images, each annotation indicative of a landmark of an anatomical structure of a patient depicted in a corresponding image; training, by the at least one processor, a convolutional neural network (CNN) model to predict the locations of the plurality of landmarks utilizing the 3D MRI images; and storing, by the at least one processor, the trained CNN model in the at least one nontransitory processor-readable storage medium of the machine learning system. Training a CNN model may include training a fully convolutional neural network (CNN) model to predict the locations of the plurality of landmarks utilizing the 3D MRI images. Training a CNN model may include training a CNN model which has an output which is one or more sets of spatial coordinates, each set of the one or more spatial coordinates identifying a location of one of the plurality of landmarks. Training a CNN model may include training a CNN model which may include a contracting path followed by one or more fully connected layers. Training the CNN model may include training a CNN model which may include a contracting path and an expanding path, the contracting path may include a number of convolutional layers and a number of pooling layers, each pooling layer preceded by at least one convolutional layer, and the expanding path may include a number of convolutional layers and a number of upsampling layers, each upsampling layer preceded by at least one convolutional layer and includes a transpose convolution operation which performs upsampling and interpolation with a learned kernel.

The method may further include for each of a plurality of landmarks of the anatomical structure, defining, by the at least one processor, a 3D label map based at least in part on the received sets of 3D MRI images and the received plurality of annotations, each 3D label map encodes a likelihood that the landmark is located at a particular location on the 3D label map; Receiving a plurality of sets of 3D MRI images may include receiving a plurality of sets of 3D MRI images, and the images in each of the plurality of sets may represent a heart of a patient at different respective time points of a cardiac cycle, and each annotation may be indicative of a landmark of a heart of a patient depicted in a corresponding image.

The method may further include receiving, by the at least one processor, a set of 3D MRI images; processing, by the at least one processor, the received 3D MRI images through the CNN model to detect at least one of the plurality of landmarks; and causing, by the at least one processor, the detected at least one of the plurality of landmarks to be presented on a display.

The method may further include processing, by the at least one processor, the received 3D MRI images through the CNN model to detect at least one of the plurality of landmarks at a plurality of time points; and causing, by the at least one processor, the detected at least one of the plurality of landmarks at a plurality of time points to be presented on a display.

Training a CNN model may include training a CNN model which may utilize phase information associated with the received 3D MRI images.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. For example, the shapes of various elements and angles are not necessarily drawn to scale, and some of these elements may be arbitrarily enlarged and positioned to improve drawing legibility. Further, the particular shapes of the elements as drawn, are not necessarily intended to convey any information regarding the actual shape of the particular elements, and may have been solely selected for ease of recognition in the drawings.

DETAILED DESCRIPTION

In the following description, certain specific details are set forth in order to provide a thorough understanding of various disclosed implementations. However, one skilled in the relevant art will recognize that implementations may be practiced without one or more of these specific details, or with other methods, components, materials, etc. In other instances, well-known structures associated with computer systems, server computers, and/or communications networks have not been shown or described in detail to avoid unnecessarily obscuring descriptions of the implementations.

Unless the context requires otherwise, throughout the specification and claims that follow, the word "comprising" is synonymous with "including," and is inclusive or open-ended (i.e., does not exclude additional, unrecited elements or method acts).

Reference throughout this specification to "one implementation" or "an implementation" means that a particular feature, structure or characteristic described in connection with the implementation is included in at least one implementation. Thus, the appearances of the phrases "in one implementation" or "in an implementation" in various places throughout this specification are not necessarily all referring to the same implementation. Furthermore, the particular features, structures, or characteristics may be combined in any suitable manner in one or more implementations.

As used in this specification and the appended claims, the singular forms "a," "an," and "the" include plural referents unless the context clearly dictates otherwise. It should also be noted that the term "or" is generally employed in its sense including "and/or" unless the context clearly dictates otherwise.

The headings and Abstract of the Disclosure provided herein are for convenience only and do not interpret the scope or meaning of the implementations.

SSFP Automated Ventricle Segmentation

DeepVentricle Architecture

Figure 1:
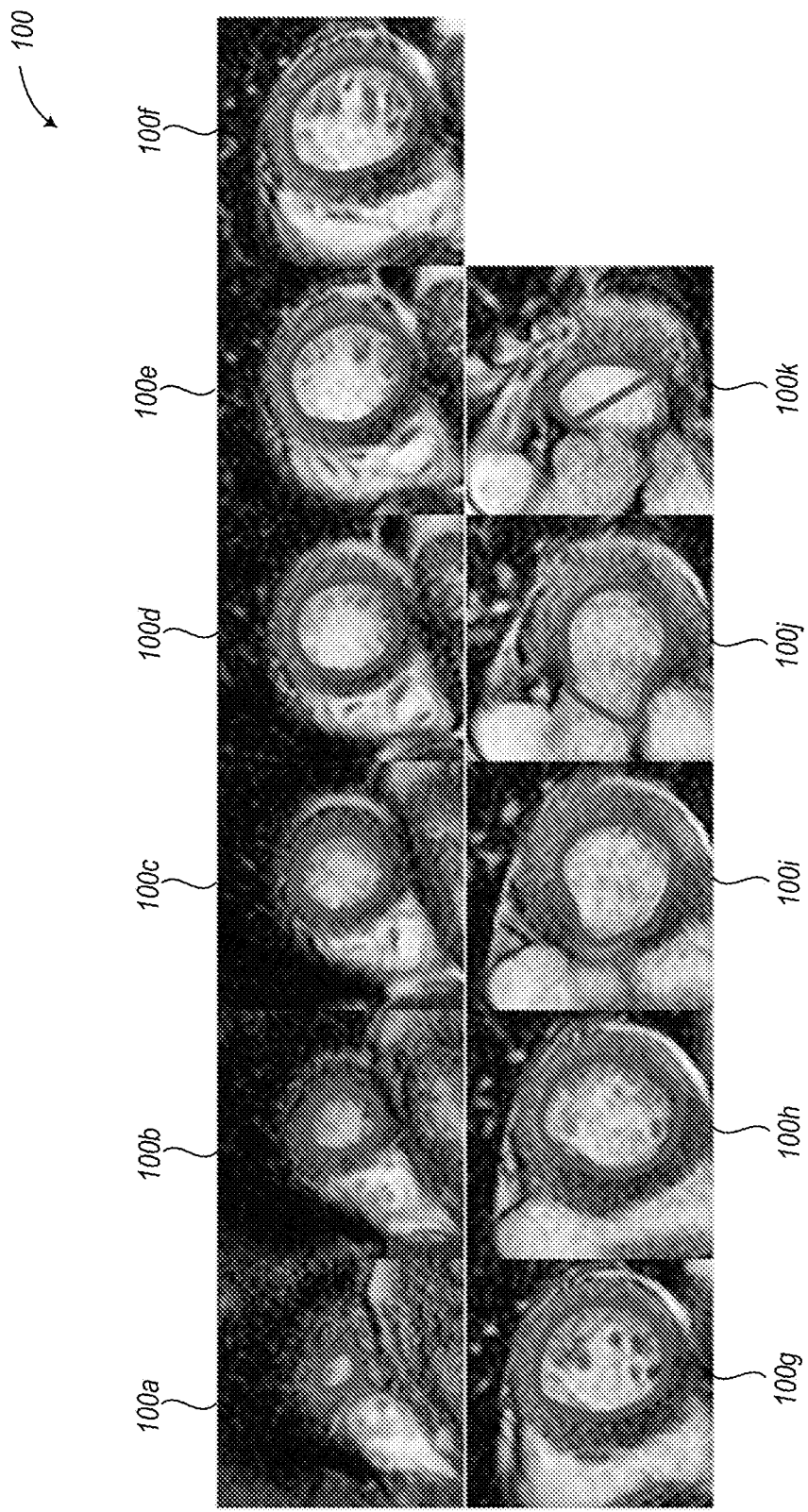
FIG. 1 is an example of a number of LV endocardium segmentations at a single time point over a full SAX (short axis) stack. From left to right, top to bottom, slices proceed from the apex of the left ventricle to the base of the left ventricle.
Figure 2:
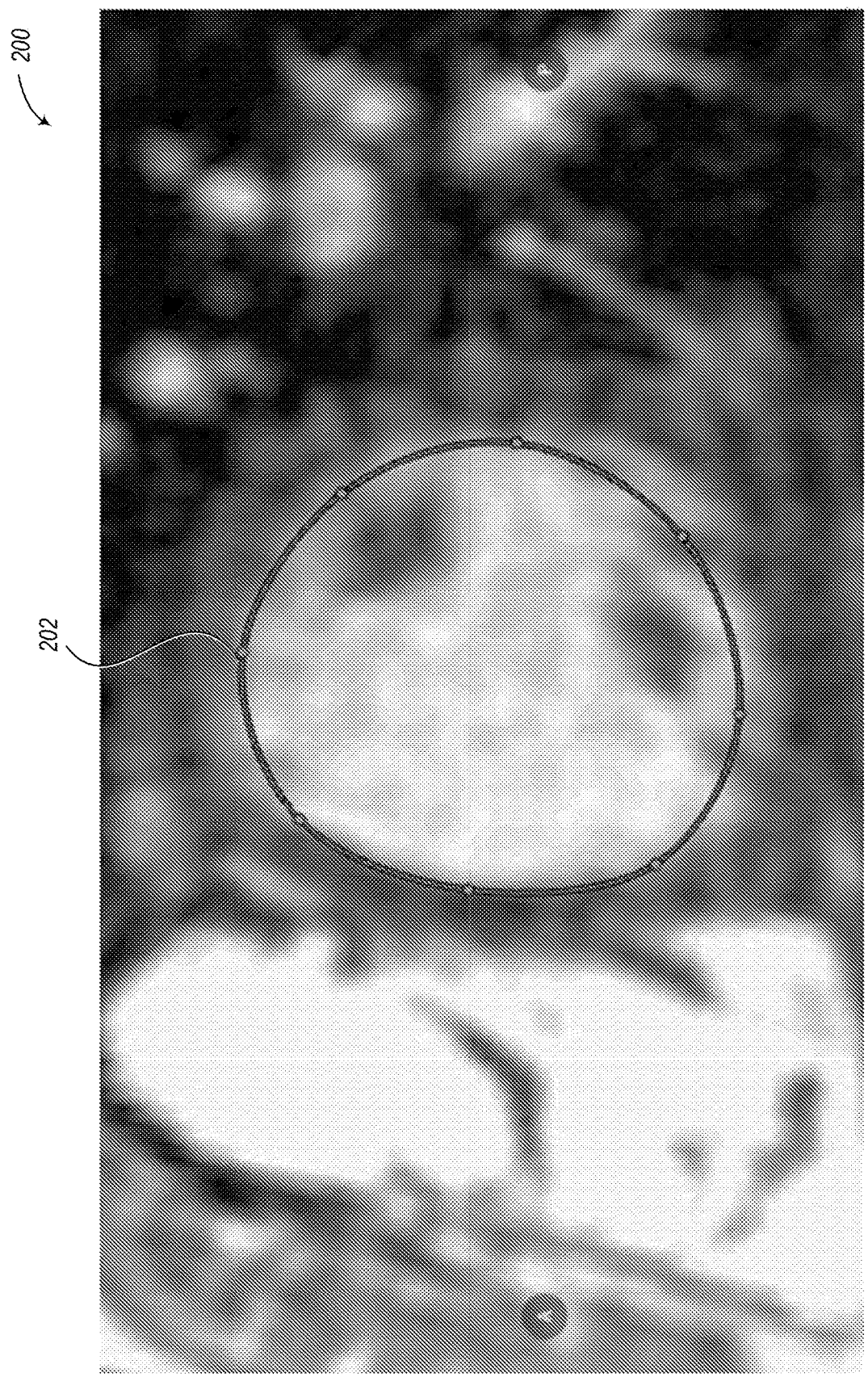
FIG. 2 is an example of an LV endocardium contour generated using a snakes algorithm.
Figure 3:
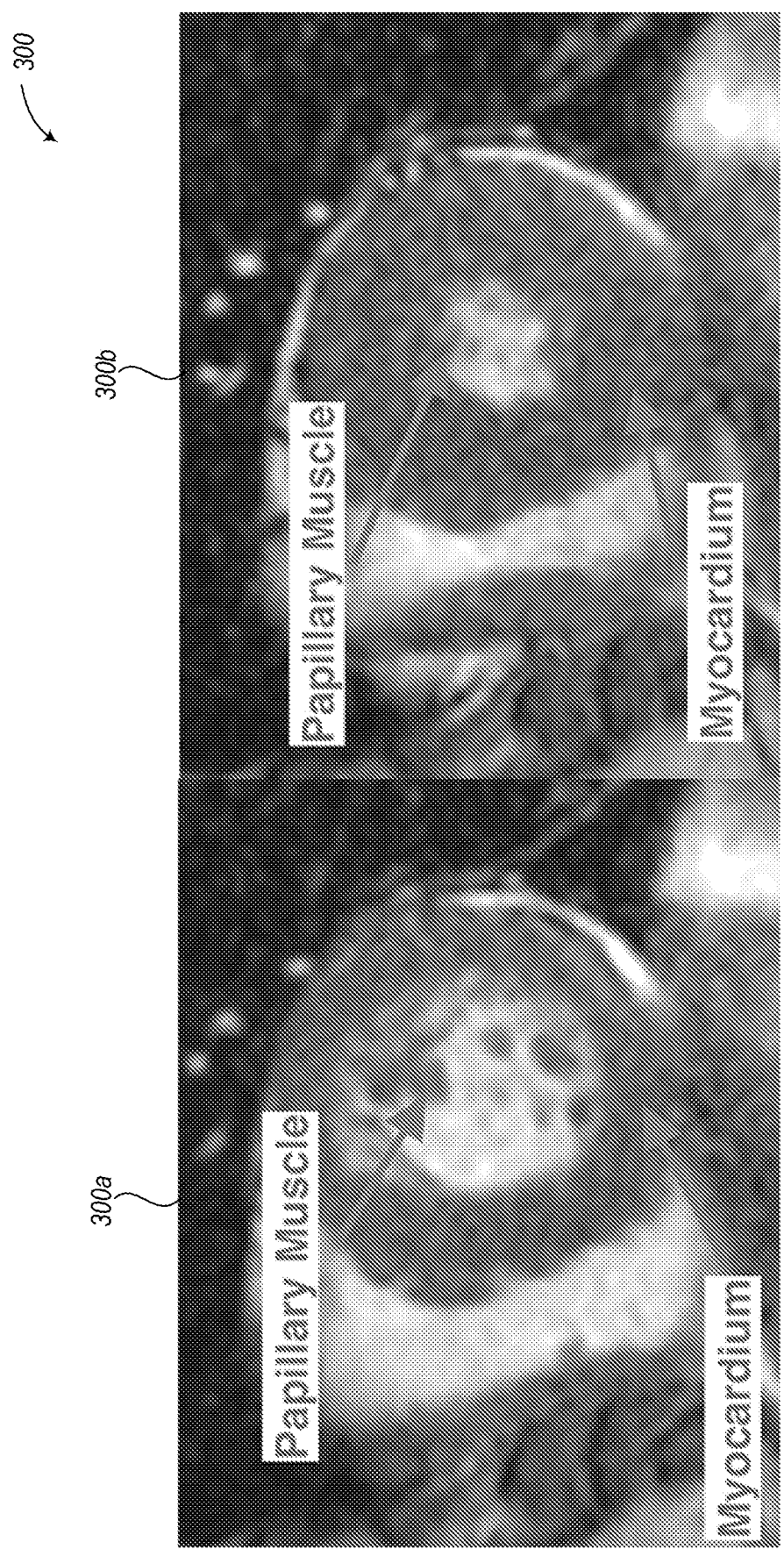
FIG. 3 is two SSFP images showing ventricles, myocardium, and papillary muscles on the interior of the left ventricle endocardium. The SSFP image on the left shows end diastole, and the SSFP image on the right shows end systole.
Figure 4:
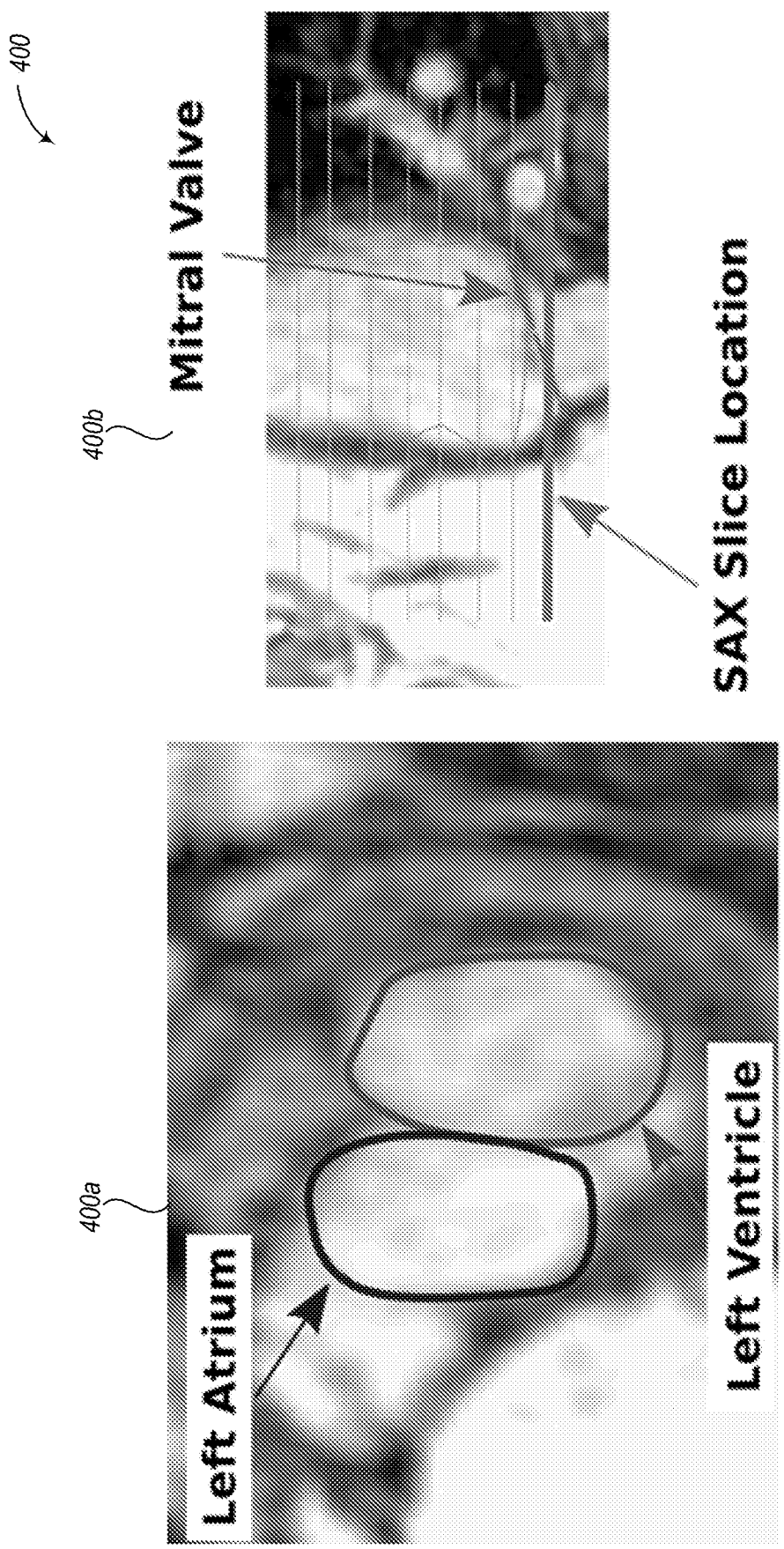
FIG. 4 is two images which show the challenges of distinguishing between the ventricle and atrium on the basal slice in the SAX plane.
Figure 5:
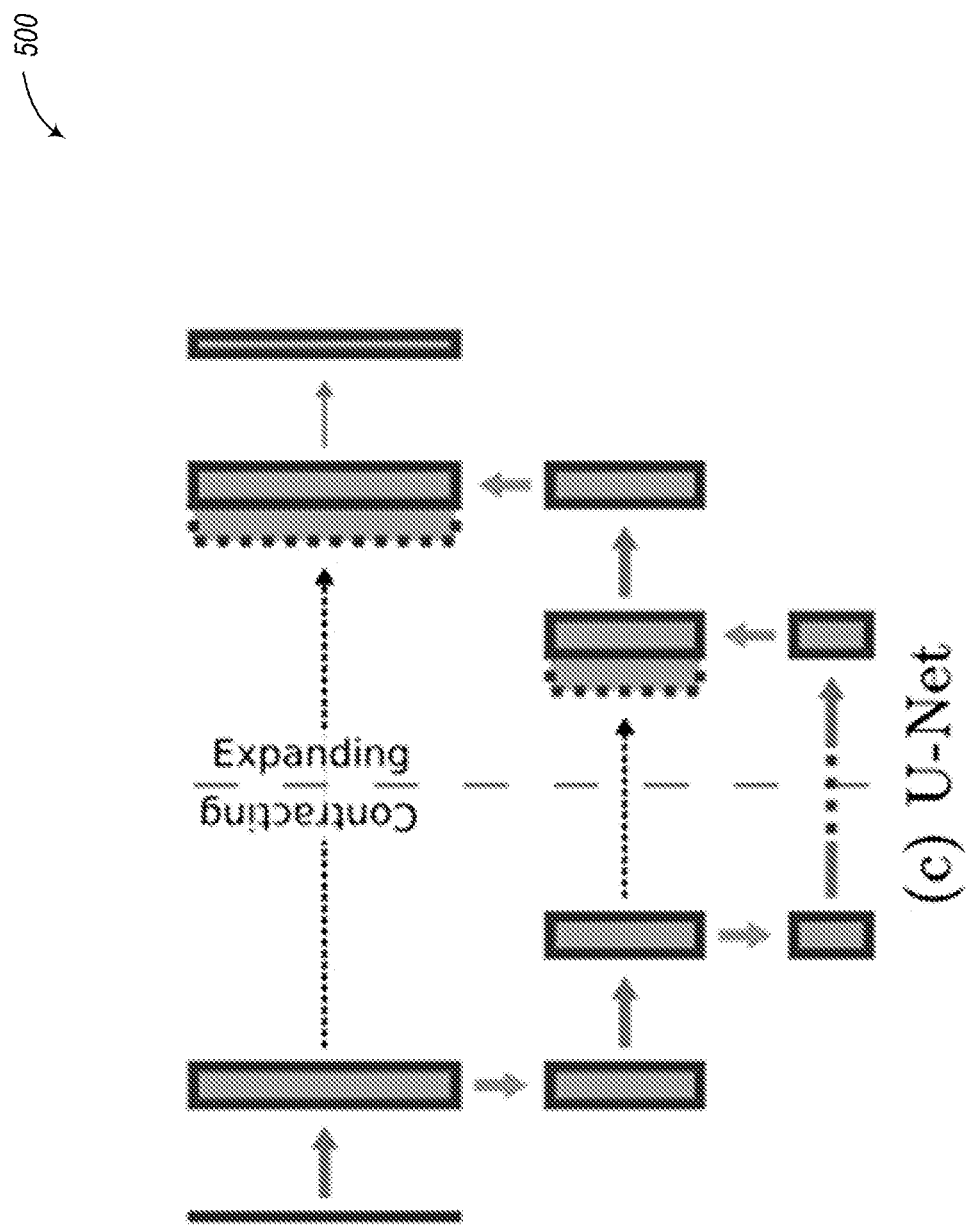
FIG. 5 is a diagram of the U-Net network architecture used in LandMarkDetect.
Figure 6:
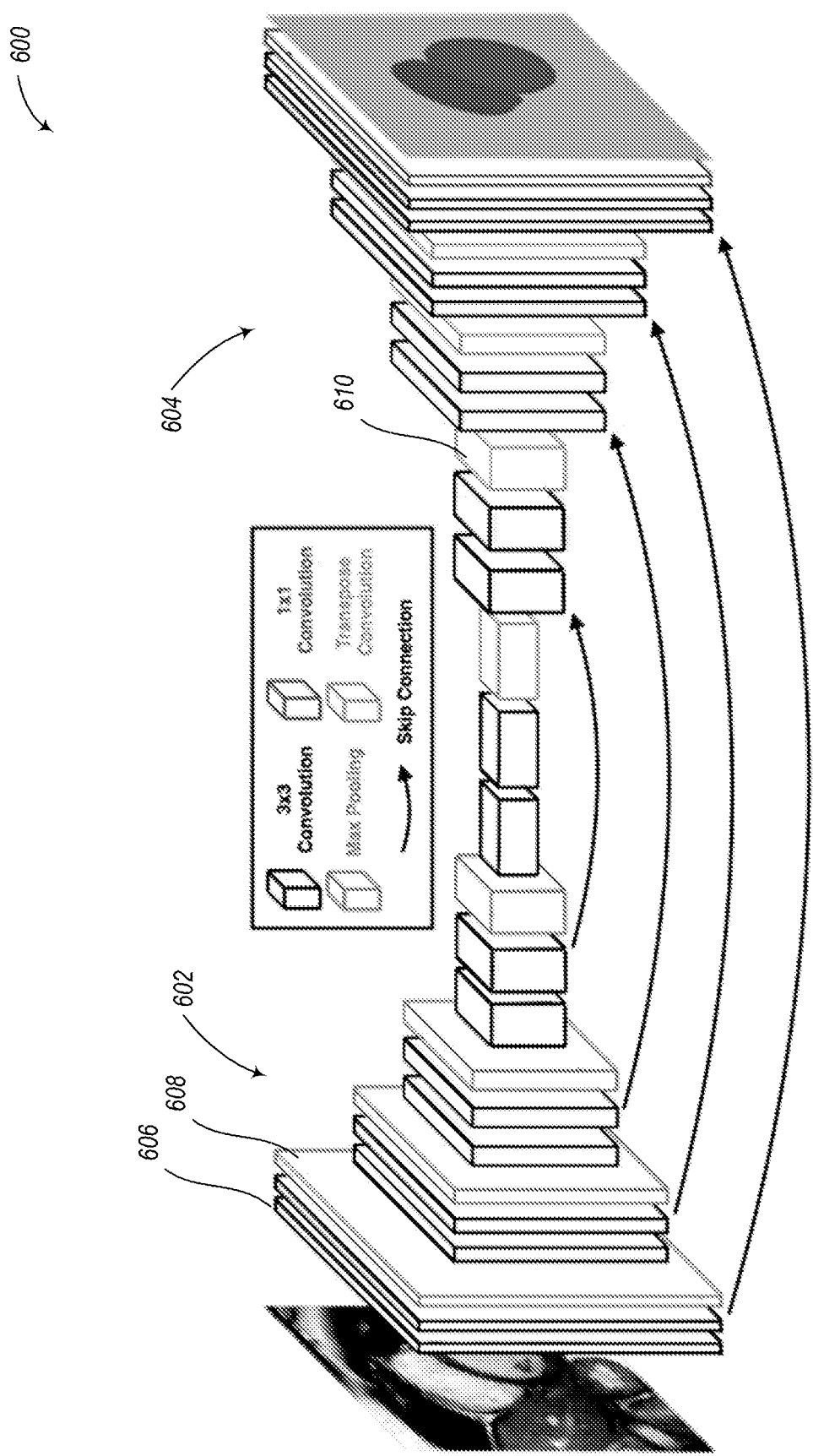
FIG. 6 is a diagram of the DeepVentricle network architecture with two convolutional layers per pooling layer and four pooling/upsampling operations, according to one illustrated implementation.

FIG. 6 shows a convolutional neural network (CNN) architecture 600, referred to herein as DeepVentricle, utilized for ventricular segmentation on cardiac SSFP studies. The network 600 includes two paths: the left side is a contracting path 602, which includes convolution layers 606 and pooling layers 608, and the right side is an expanding path 604, which includes upsampling or transpose convolution layers 610 and convolution layers 606.

The number of free parameters in the network 600 determines the entropic capacity of the model, which is essentially the amount of information the model can remember. A significant fraction of these free parameters reside in the convolutional kernels of each layer in the network 600. The network 600 is configured such that, after every pooling layer 608, the number of feature maps doubles and the spatial resolution is halved. After every upsampling layer 610, the number of feature maps is halved and the spatial resolution is doubled. With this scheme, the number of feature maps for each layer across the network 600 can be fully described by the number (e.g., between 1 and 2000 feature maps) in the first layer. In at least some implementations, the number of features maps in the first layer is 128. It was found that using additional feature maps improved model accuracy, with a moderate cost of increased computational complexity, memory usage and trained model disk usage. Other values for the number of initial feature maps could also suffice, dependent on the amount of training data and desired tradeoffs between available computational resources and model performance.

In at least some implementations, the network 600 includes two convolutional layers 606 before every pooling layer 608, with convolution kernels of size 3×3 and stride 1. Different combinations of these parameters (number of layers, convolution kernel size, convolution stride) may also be used. Based on a hyperparameter search, it was found that four pooling and upsampling operations worked best for the data under examination, though the results are only moderately sensitive to this number.

Without applying any padding to input images (this lack of padding is called "valid" padding), convolutions that are larger than 1×1 naturally reduce the size of the output feature maps, as only (image_size−conv_size+1) convolutions can fit across a given image. Using valid padding, output segmentation maps are only 388×388 pixels for input images which are 572×572 pixels. Segmenting the full image therefore requires a tiling approach, and segmentation of the borders of the original image is not possible. In the network 600 according to at least some implementations of the present disclosure, zero-padding of width (conv_size−2) is utilized before every convolution such that segmentation maps are always the same resolution as the input (known as "same" padding). Valid padding may also be used.

Downsampling the feature maps with a pooling operation may be an important step for learning higher level abstract features by means of convolutions that have a larger field of view in the space of the original image. In at least some implementations, the network 600 utilizes a 2×2 max pooling operation with stride 2 to downsample images after every set of convolutions. Learned downsampling, i.e., convolving the input volume with a 2×2 convolution with stride 2 may also be used, but such may increase computational complexity. Generally, different combinations of pooling size and stride may also be used.

Upsampling the activation volumes back to the original resolution is necessary in a fully convolutional network for pixel-wise segmentation. To increase the resolution of the activation volumes in the network, some systems may use an upsampling operation, then a 2×2 convolution, then a concatenation of feature maps from the corresponding contracting layer through a skip connection, and finally two 3×3 convolutions. In at least some implementations, the network 600 replaces the upsampling and 2×2 convolution with a single transpose convolution layer 610, which performs upsampling and interpolation with a learned kernel, improving the ability of the model to resolve fine details. That operation is followed with the skip connection concatenation, as shown by the bold arrows from the contracting path 602 to the expanding path 604 in FIG. 6. Following this concatenation, two 3×3 convolutional layers are applied.

In at least some implementations, rectified linear units (ReLUs) are used for all activations following convolutions. Other nonlinear activation functions, including PReLU (parametric ReLU) and ELU (exponential linear unit) may also be used.

Model Hyperparameters

Model hyperparameters may be stored in at least one nontransitory processor-readable storage medium (e.g., configuration file) that is read during training. Parameters that describe the model may include:
  num_pooling_layers: the total number of pooling (and upsampling) layers;
  pooling_type: the type of pooling operation to use (e.g., max);
  num_init_filters: the number of filters (convolutional kernels) for the first layer;
  num_conv_layers: the number of convolution layers between each pooling operation;
  conv_kernel_size: the edge length, in pixels, of the convolutional kernel;
  dropout_prob: the probability that a particular node's activation is set to zero on a given forward/backward pass of a batch through the network;
  border_mode: the method of zero-padding the input feature map before convolution;
  activation: the nonlinear activation function to use after each convolution;
  weight_init: the means for initializing the weights in the network;
  batch_norm: whether or not to utilize batch normalization after each nonlinearity in the down-sampling/contracting part of the network;
  batch_norm_momentum: momentum in the batch normalization computation of means and standard deviations on a per-feature basis;
  down_trainable: whether to allow the downsampling part of the network to learn upon seeing new data;
  bridge_trainable: whether to allow the bridge convolutions to learn;
  up_trainable: whether to allow the upsampling part of the network to learn; and
  out_trainable: whether to allow the final convolution that produces pixel-wise probabilities to learn.

Parameters that describe the training data to use may include:
  crop_frac: the fractional size of the images in the LMDB relative to the originals;
  height: the height of the images, in pixels; and
  width: the width of the images, in pixels.

Parameters that describe the data augmentation to use during training may include:
  horizontal_flip: whether to randomly flip the input/label pair in the horizontal direction;
  vertical_flip: whether to randomly flip the input/label pair in the vertical direction;
  shear_amount: the positive/negative limiting value by which to shear the image/label pair;
  shift_amount: the max fractional value by which to shift the image/label pair;
  zoom_amount: the max fractional value by which to zoom in on the image/label pair;
  rotation_amount: the positive/negative limiting value by which to rotate the image/label pair;
  zoom_warping: whether to utilize zooming and warping together;
  brightness: the positive/negative limiting value by which to change the image brightness;
  contrast: the positive/negative limiting value by which to change the image contrast; and
  alpha, beta: the first and second parameters describing the strength of elastic deformation.

Parameters that describe training include:
  batch_size: the number of examples to show the network on each forward/backward pass;

max_epoch: the maximum number of iterations through the data;
optimizer_name: the name of the optimizer function to use;
optimizer_lr: the value of the learning rate;
objective: the objective function to use;
early_stopping_monitor: the parameter to monitor to determine when model training should stop training; and
early_stopping_patience: the number of epochs to wait after the early_stopping_monitor value has not improved before stopping model training.

To choose the optimal model, a random search may be performed over these hyperparameters and the model with the highest validation accuracy may be chosen.

Training Database

In at least some implementations, a Lightning Memory-mapped Database (LMDB) that stores preprocessed image/segmentation mask pairs for training may be used. This database architecture holds many advantages over other means of storing the training data. Such advantages include: mapping of keys is lexicographical for speed; image/segmentation mask pairs are stored in the format required for training so they require no further preprocessing at training time; and reading image/segmentation mask pairs is a computationally cheap transaction.

The training data may generally be stored in a variety of other formats, including named files on disk and real-time generation of masks from the ground truth database for each image. These methods may achieve the same result, though they likely slow down the training process.

A new LMDB may be created for every unique set of inputs/targets that are to be used to train a model on. This ensures that there is no slowdown during training for image preprocessing.

Treatment of Missing Data During Training

Unlike previous models which were only concerned with two classes for a cell discrimination task, foreground and background, the SSFP model disclosed herein attempts to distinguish four classes, namely, background, LV Endocardium, LV Epicardium and RV Endocardium. To accomplish this, the network output may include three probability maps, one for each non-background class. During training, ground truth binary masks for each of the three classes are provided to the network, along with the pixel data. The network loss may be determined as the sum of the loss over the three classes. If any of the three ground truth masks are missing for an image (meaning that we have no data, as opposed to the ground truth being an empty mask), that mask may be ignored when calculating the loss.

Missing ground truth data is explicitly accounted for during the training process. For example, the network may be trained on an image for which the LV endocardium contour is defined, even if the LV epicardium and RV endocardium contour locations are not known. A more basic architecture that could not account for missing data could only have been trained on a subset (e.g., 20 percent) of training images that have all three types of contours defined. Reducing the training data volume in this way would result in significantly reduced accuracy. Thus, by explicitly modifying the loss function to account for missing data, the full training data volume is used, allowing the network to learn more robust features.

Training Database Creation

Figure 7:
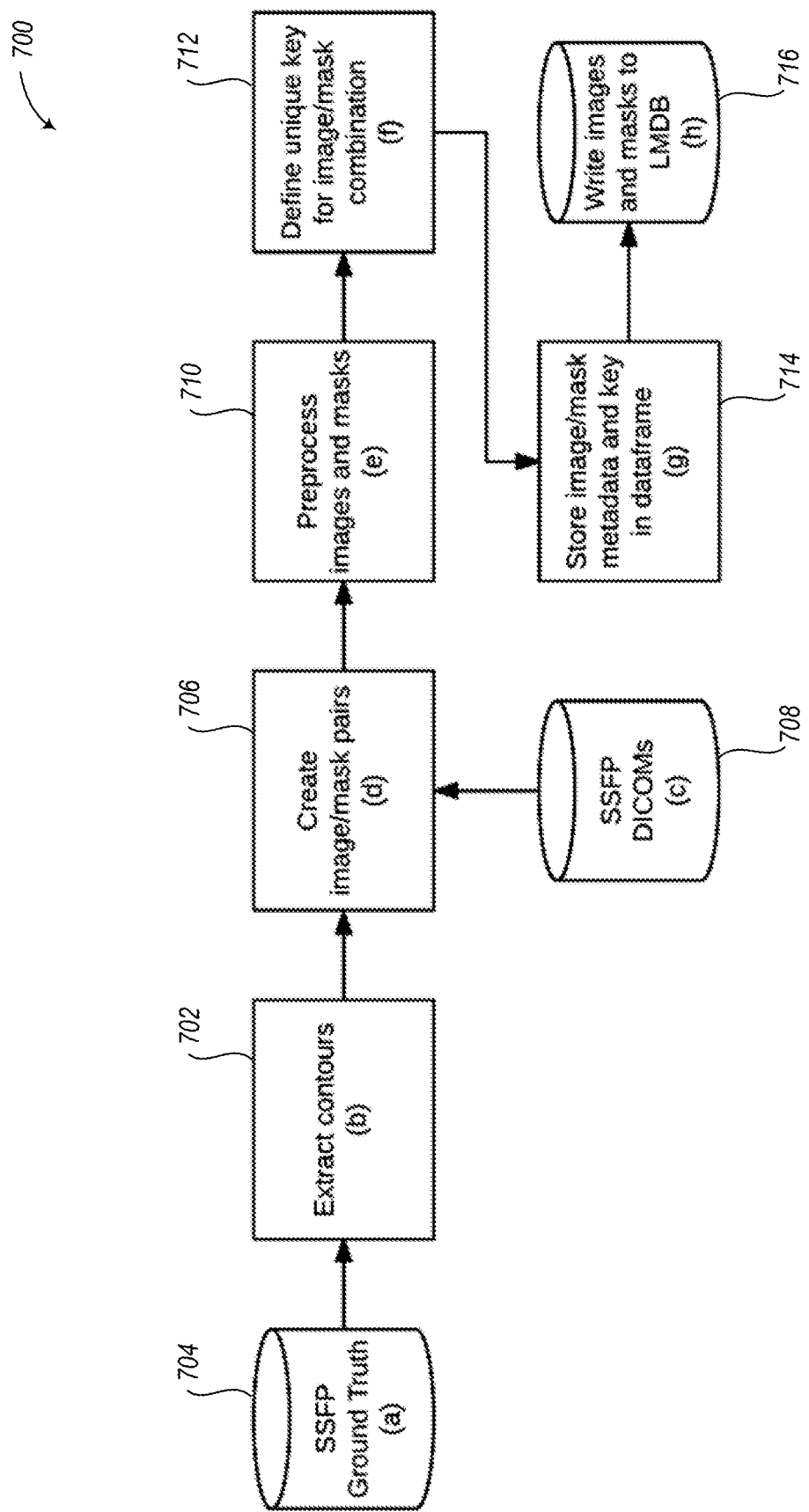
FIG. 7 is a flow diagram of the creation of an lightning memory-mapped database (LMDB) for training with SSFP data, according to one illustrated implementation.

FIG. 7 shows a process 700 for creation of an SSFP LMDB. At 702, contour information is extracted from an SSFP ground truth database 704. These contours are stored in the ground truth database 704 as dictionaries of contour X positions and Y positions, associated with specific SSFP slice locations and time points. At 706, the pixel data from the corresponding SSFP DICOM (Digital Imaging and Communications in Medicine) image 708 is paired with a Boolean mask created from this information. At 710, the system preprocesses the images and masks by normalizing the images, cropping the images/masks, and resizing the images/masks. In at least some implementations, the MRIs are normalized such that they have a mean of zero and that the 1st and 99th percentile of a batch of images fall at −0.5 and 0.5, i.e., their "usable range" falls between −0.5 and 0.5. The images may be cropped and resized such that the ventricle contours take up a larger percentage of the image. This results in more total foreground class pixels, making it easier to resolve fine details (especially the corners) of the ventricles and helping the model converge, all with less computing power.

At 712, a unique key for SSFP LMDBs is defined to be the combination of the series instance UID and SOP instance UID. At 714, the image and mask metadata, including the time point, slice index and LMDB key are stored in a dataframe. At 716, the normalized, cropped, and resized image and the cropped and resized mask are stored in the LMDB for each key.

DeepVentricle Training

Figure 8:
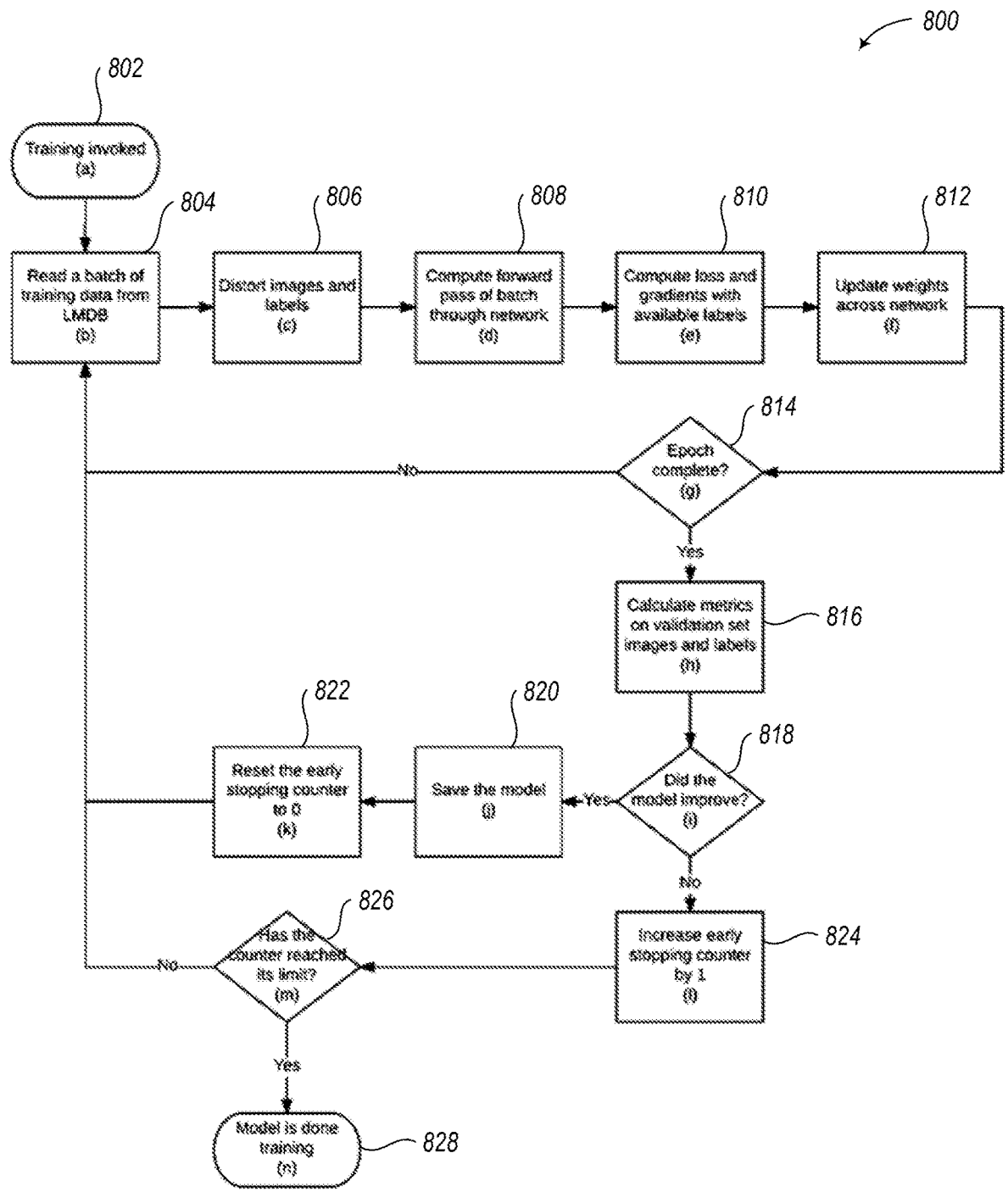
FIG. 8 is a flow diagram of a pipeline process for training a convolutional neural network model, according to one illustrated implementation.

FIG. 8 shows a process 800 that illustrates model training. In at least some implementations, Keras, an open-source wrapper built on TensorFlow, may be used to train models. However, equivalent results may be achieved using raw TensorFlow, Theano, Caffe, Torch, MXNet, MATLAB, or other libraries for tensor math.

In at least some implementations, a dataset may be split into a training set, validation set, and test set. The training set is used for model gradient updates, the validation set is used to evaluate the model on "held out" data during training (e.g., for early stopping), and the test set is not used at all in the training process.

At 802, training is invoked. At 804, image and mask data is read from the LMDB training set, one batch at a time. At 806, in at least some implementations the images and masks are distorted according to the distortion hyperparameters stored in a model hyperparameter file, as discussed above. At 808, the batch is processed through the network. At 810, the loss/gradients are calculated. At 810, weights are updated as per the specified optimizer and optimizer learning rate. In at least some implementations, loss may be calculated using a per-pixel cross-entropy loss function and the Adam update rule.

At 814, the system may determine whether the epoch is complete. If the epoch is not complete, the process returns to act 804 to read another batch of training data. At 816, if the epoch is complete, metrics are calculated on the validation set. Such metrics may include, for example, validation loss, validation accuracy, relative accuracy versus a naive model that predicts only the majority class, f1 score, precision, and recall.

At 818, validation loss may be monitored to determine if the model improved. At 820, if the model did improve, the weights of the model at that time may be saved. At 822, the early stopping counter may be reset to zero, and training for another epoch may begin at 804. Metrics other than validation loss, such as validation accuracy, could also be used to indicate evaluate model performance. At 824, if the model did not improve after an epoch, the early stopping counter is incremented by 1. At 826, if the counter has not reached its limit, training is begun for another epoch at 804. At 828, if the counter has reached its limit, training the model is stopped. This "early stopping" methodology is used to prevent overfitting, but other methods of overfitting prevention exist, such as utilizing a smaller model, increasing the level of dropout or L2 regularization, for example.

At no point is data from the test set used when training the model. Data from the test set may be used to show examples of segmentations, but this information is not used for training or for ranking models with respect to one another.

Inference

Figure 9:
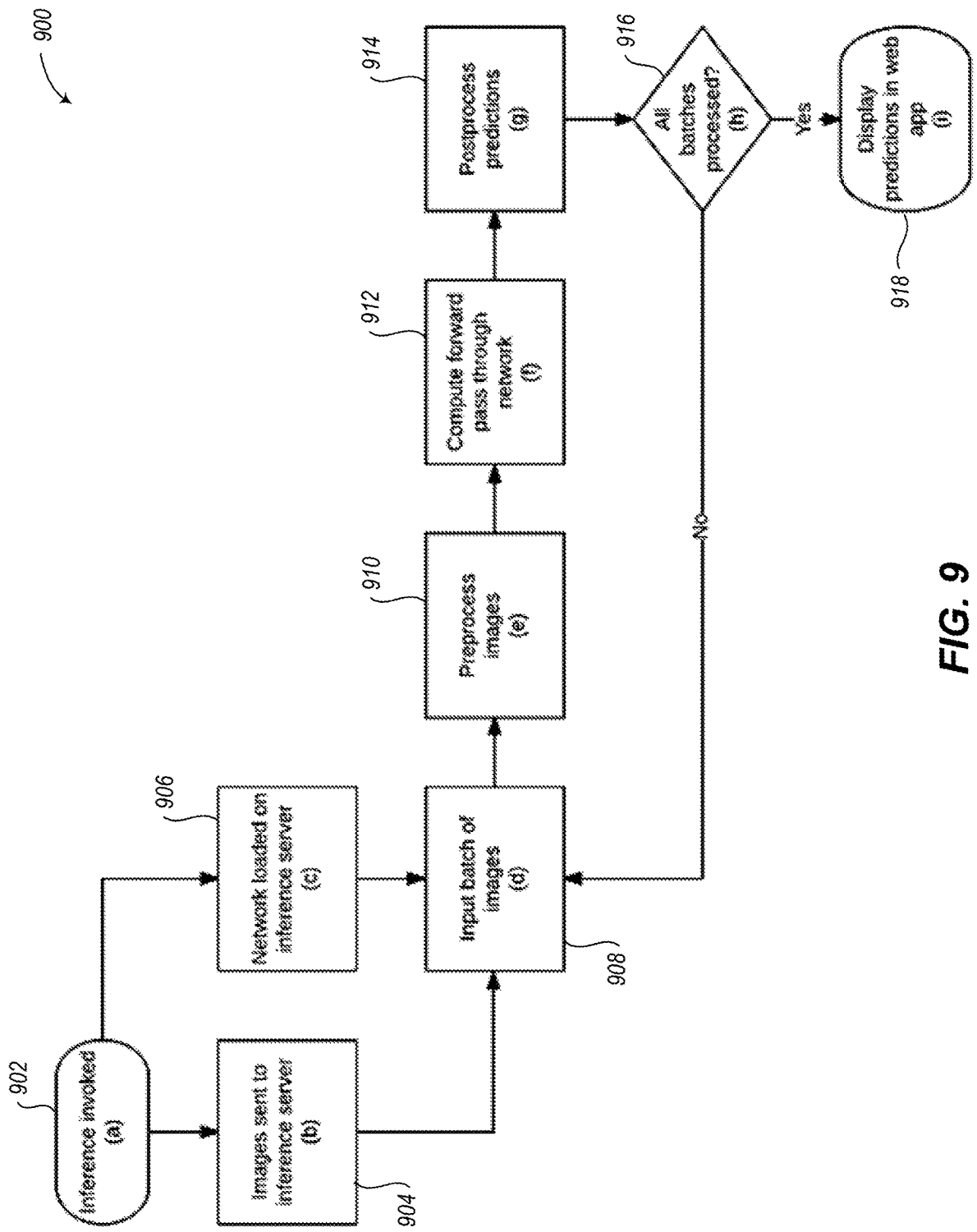
FIG. 9 is a flow diagram which illustrates a process for an inference pipeline for SSFP data, according to one illustrated implementation.

Inference is the process of utilizing a trained model for prediction on new data. In at least some implementations, a web application (or "web app") may be used for inference. FIG. 9 displays an example pipeline or process 900 by which predictions may be made on new SSFP studies. At 902, after a user has loaded a study in the web application, the user may invoke the inference service (e.g., by clicking a "generate missing contours" icon), which automatically generates any missing (not yet created) contours. Such contours may include LV Endo, LV Epi, or RV Endo, for example. In at least some implementations, inference may be invoked automatically when the study is either loaded by the user in the application or when the study is first uploaded by the user to a server. If inference is performed at upload time, the predictions may be stored in a nontransitory processor-readable storage medium at that time but not displayed until the user opens the study.

The inference service is responsible for loading a model, generating contours, and displaying them for the user. After inference is invoked at 902, at 904 images are sent to an inference server. At 906, the production model or network that is used by the inference service is loaded onto the inference server. The network may have been previously selected from the corpus of models trained during hyperparameter search. The network may be chosen based on a tradeoff between accuracy, memory usage and speed of execution. The user may alternatively be given a choice between a "fast" or "accurate" model via a user preference option.

At 908, one batch of images at a time is processed by the inference server. At 910, the images are preprocessed (e.g., normalized, cropped) using the same parameters that were utilized during training, discussed above. In at least some implementations, inference-time distortions are applied and the average inference result is taken on, for example, 10 distorted copies of each input image. This feature creates inference results that are robust to small variations in brightness, contrast, orientation, etc.

Inference is performed at the slice locations and time points in the requested batch. At 912, a forward pass through the network is computed. For a given image, the model generates per-class probabilities for each pixel during the forward pass, which results in a set of probability maps, one for each class, with values ranging from 0 to 1. The probability maps are transformed into a single label mask by setting the class of each pixel to the class with the highest label map probability.

At 914, the system may perform postprocessing. For example, in at least some implementations, if all probabilities for a pixel are below 0.5, the pixel class for that pixel is set to background. Further, to remove spurious predicted pixels, any pixels in the label map that are not part of the largest connected region for that class may be converted to background. In at least some implementations, spurious pixels may be removed by comparing neighboring segmentation maps in time and space and removing outliers. Alternately, because a given ventricles may occasionally appear in a single slice as two distinct connected regions because, for example, the RV is non-convex near the base of the heart, multiple connected regions may be allowed but small regions or regions that are distant from centroid of all detected regions across slice locations and times may be removed.

In at least some implementations, postprocessing to satisfy one or more physical constraints may be performed at 914. For example, postprocessing may ensure that the myocardium volume is the same at all time points. To achieve this, the system may dynamically adjust the threshold used to binarize the endocardium and epicardium probability maps before converting them to contours. The thresholds can be adjusted to minimize the discrepancy in reported myocardium volume using nonlinear least squares, for example. As another example of a physical constraint, the postprocessing act may ensure that the RV and LV do not overlap. To achieve this, the system may only allow any given pixel to belong to one class, which is the class with the highest inferred probability. The user may have a configuration option to enable or disable imposition of selected constraints.

At 916, if not all batches have been processed, a new batch is added to the processing pipeline at 908 until inference has been performed at all slice locations and all time points.

In at least some implementations, once the label mask has been created, to ease viewing, user interaction, and database storage, the mask may be converted to a spline contour. The first step is to convert the mask to a polygon by marking all the pixels on the border of the mask. This polygon is then converted to a set of control points for a spline using a corner detection algorithm, based on A. Rosenfeld and J. S. Weszka. "An improved method of angle detection on digital curves." Computers, IEEE Transactions on, C-24(9):940-941, September 1975. A typical polygon from one of these masks will have hundreds of vertices. The corner detection attempts to reduce this to a set of approximately sixteen spline control points. This reduces storage requirements and results in a smoother-looking segmentation.

At 918, these splines are stored in a database and displayed to the user in the web application. If the user modifies a spline, the database may be updated with the modified spline.

In at least some implementations, volumes are calculated by creating a volumetric mesh from all vertices for a given time point. The vertices are ordered on every slice of the 3D volume. An open cubic spline is generated that connects the first vertex in each contour, a second spline that connects the second vertex, etc., for each vertex in the contour, until a cylindrical grid of vertices is obtained which is used to define the mesh. The internal volume of the polygonal mesh is then calculated. Based on calculated volumes, which time points represent the end systole phase and end diastole phase is autonomously determined based on the times with the minimum and maximum volumes, respectively, and these time points are labeled for the user.

Figure 10:
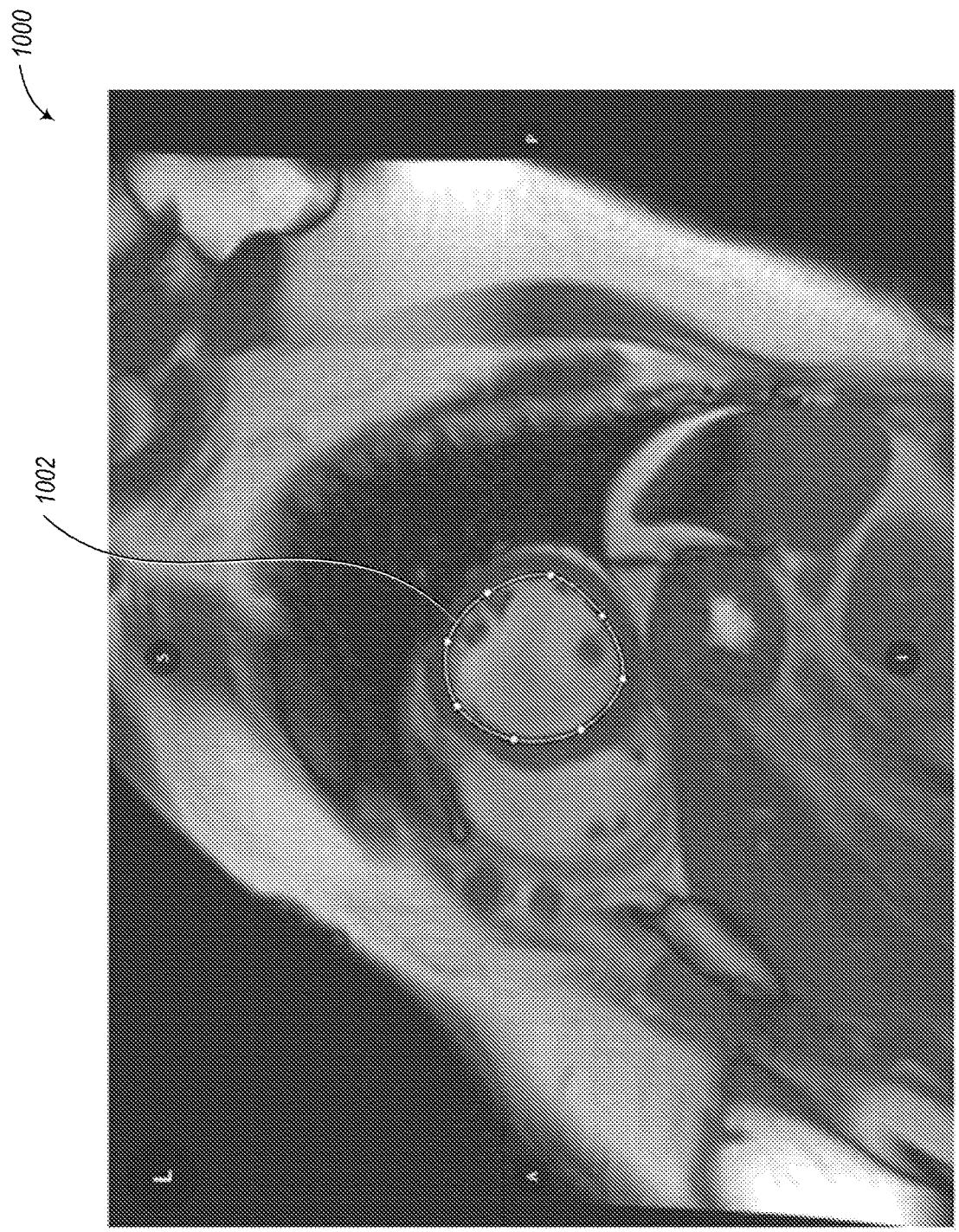
FIG. 10 is a screenshot of an in-application SSFP inference result for LV endo at one time point and slice index.
Figure 11:
FIG. 11 is a screenshot of an in-application SSFP inference result for LV epi at one time point and slice index.
Figure 12:
FIG. 12 is a screenshot of an in-application SSFP inference result for RV endo at one time point and slice index.

FIGS. 10, 11, and 12 show example images 1000, 1100 and 1200, respectively, of in-application inference results for LV Endo contour 1002, LV Epi contour 1102, and RV Endo contour 1202, respectively, at a single time point and slice location.

Figure 13:
FIG. 13 is a screenshot of an in-application SSFP calculated parameters from automatically segmented ventricles.

At the same time that contours (e.g., contours 1002, 1102 and 1202) are displayed to the user, the system calculates and shows ventricle volumes at ED and ES to the user, as well as multiple computed measurements. An example interface 1300 is shown in FIG. 13 which displays multiple computed measurements. In at least some implementations, these measurements include stroke volume (SV) 1302, which is the volume of blood ejected from the ventricle in one cardiac cycle; ejection fraction (EF) 1304, which is the fraction of the blood pool ejected from the ventricle in one cardiac cycle; cardiac output (CO) 1306, which is the average rate at which blood leaves the ventricle, ED mass 1308, which is the mass of the myocardium (i.e., epicardium-endocardium) for the ventricle at end diastole; and ES mass 1310, which is the mass of the myocardium for the ventricle at end systole.

For 4D Flow data, the same DeepVentricle architecture, hyperparameter search methodology, and training database as described above for SSFP data may be used. Training a 4D Flow model may be the same as in the SSFP operation discussed above, but the creation of an LMDB and inference may be different for the 4D Flow implementation.

Training Database Creation for 4D Flow Data

Figure 14:
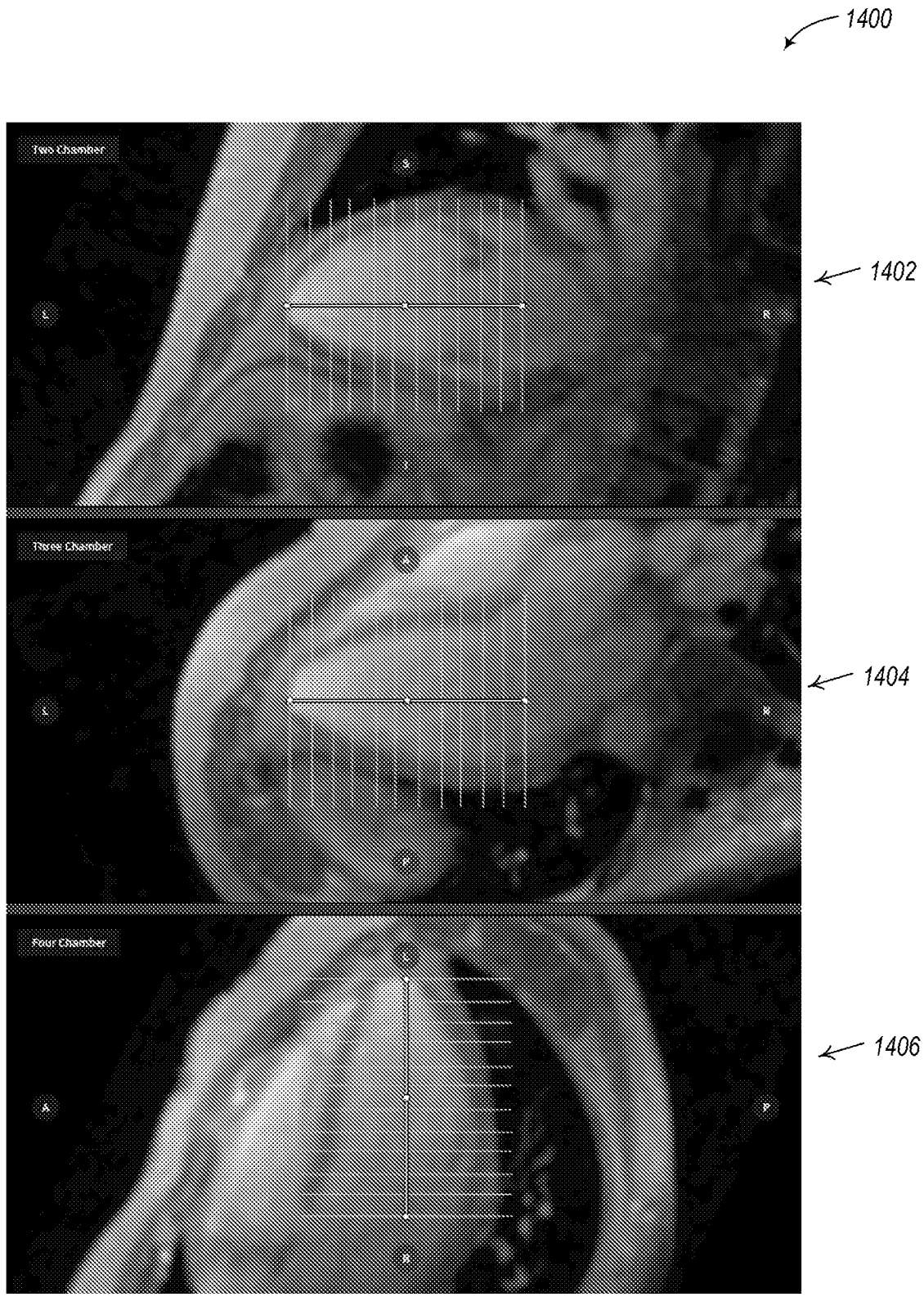
FIG. 14 is a screenshot which depicts two, three, and four chamber views with parallel lines that indicate the planes of a SAX stack.

Whereas the SSFP DICOM files are acquired and stored in SAX orientation, 4D Flow DICOMs are collected and stored as axial slices. In order to create a SAX multi-planar reconstruction (MPR) of the data, the user may need to place the relevant landmarks for the left and/or right heart. These landmarks are then used to define unique SAX planes for each ventricle as defined by the ventricle apex and valves. FIG. 14 shows a set 1400 of SAX planes (also referred to as a SAX stack) for the LV in which each SAX plane is parallel for a two chamber view 1402, a three chamber view 1404 and a four chamber view 1406.

Figure 15:
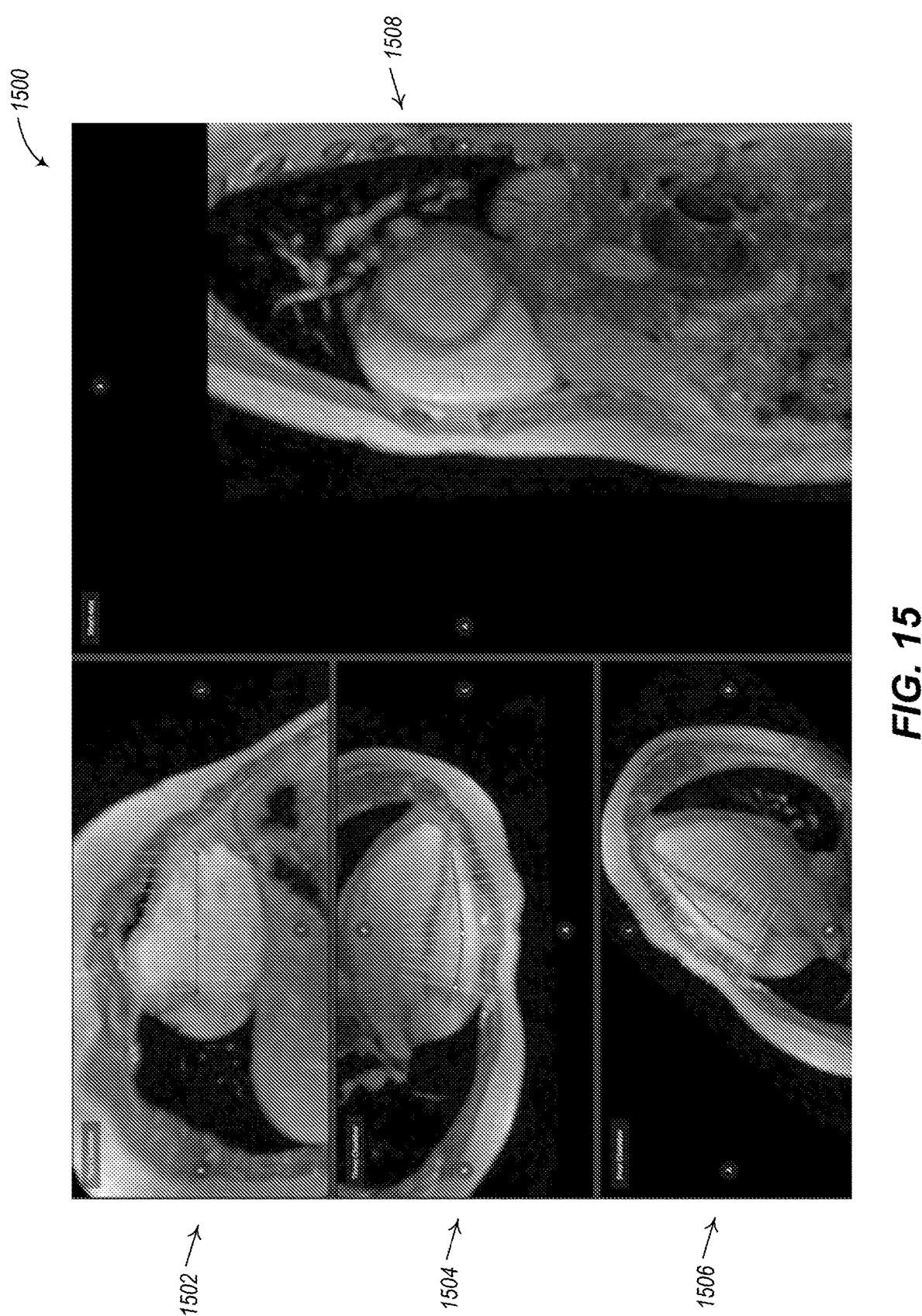
FIG. 15 is a screenshot which depicts in a left panel two, three, and four chamber views showing a series of segmentation planes that are not parallel for the right ventricle. A right panel depicts a reconstructed image along the highlighted plane seen in the two, three, and four chamber views.

The application may also allow the user to have SAX planes that are not parallel if desired. FIG. 15 shows a set 1500 of views of a SAX stack in which the segmentation planes are not parallel for the RV for a two chamber view 1502, a three chamber view 1504, a four chamber view 1506 and a reconstructed image 1508. This is motivated by the fact that it is slightly easier to segment the ventricle if the segmentation plane does not intersect the valve plane but rather is parallel to it. However, this is not a requirement, and it is possible to get accurate results without using this feature.

Figure 16:
FIG. 16 is a screenshot which illustrates segmenting the RV. Points in the contour (right panel) define the spline and are what is stored in a database. The contour is projected into the LAX views (left panel).
Figure 17:
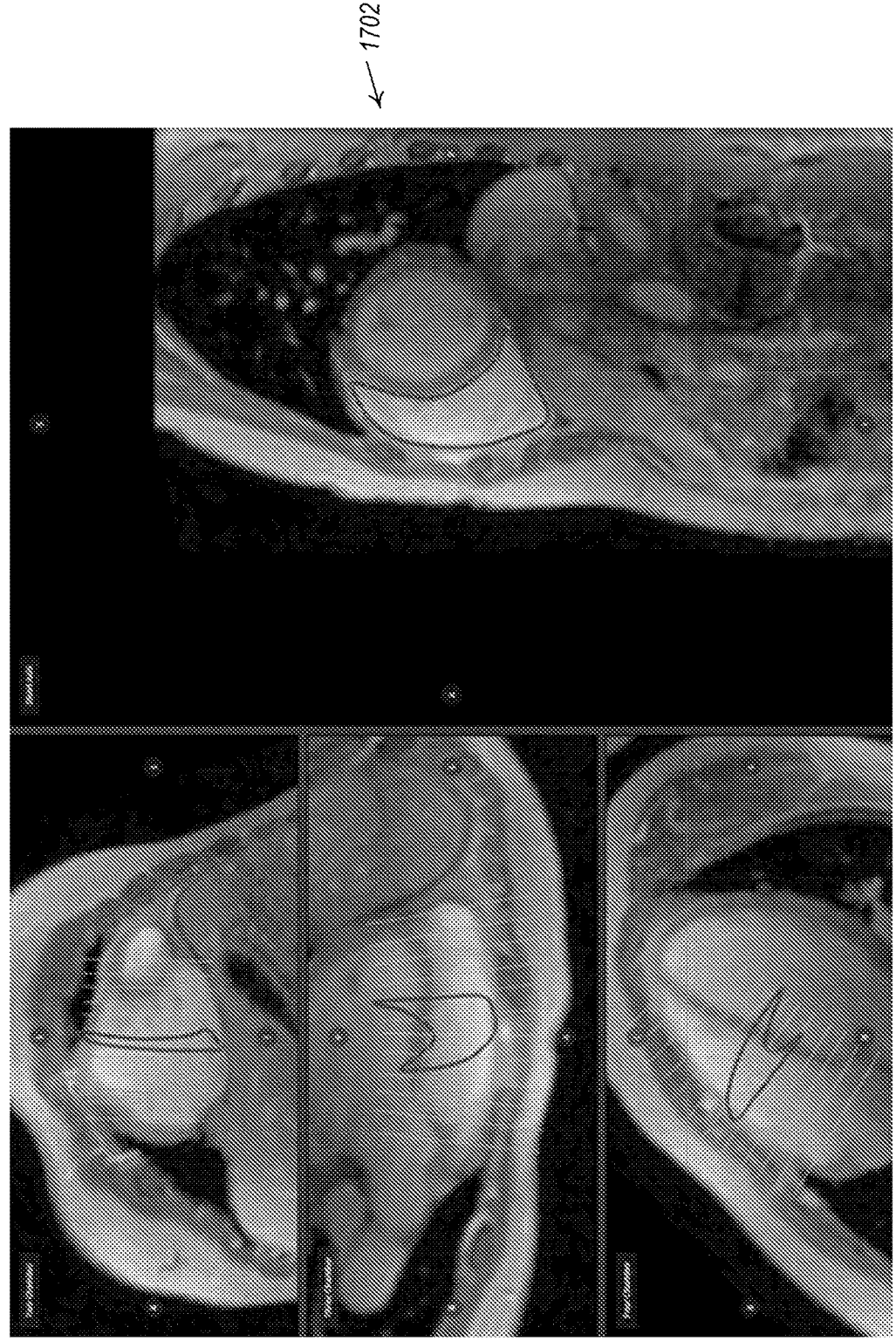
FIG. 17 is a screenshot which illustrates segmenting the same slice of the RV as in FIG. 16, but with each of the two, three, and four chamber views slightly rotated to emphasize the segmentation plane with a depth effect.

As shown in the images 1600 and 1700 of FIGS. 16 and 17, respectively, segmentations are performed on a multi-planar reconstruction of the image data on each SAX plane. Points 1602 on a contour 1604 in an image 1606 define the spline and are what is stored in the database. The contour 1604 is projected into a two chamber LAX view 1608, three chamber LAX view 1610 and four chamber LAX view 1612. FIG. 17 shows images 1702, 1704, 1706 and 1708 in which the same slice of FIG. 16 is segmented, but with each of the two chamber view 1704, three chamber view 1706 and four chamber view 1708 slightly rotated to emphasize the segmentation plane with a depth effect.

Figure 18:
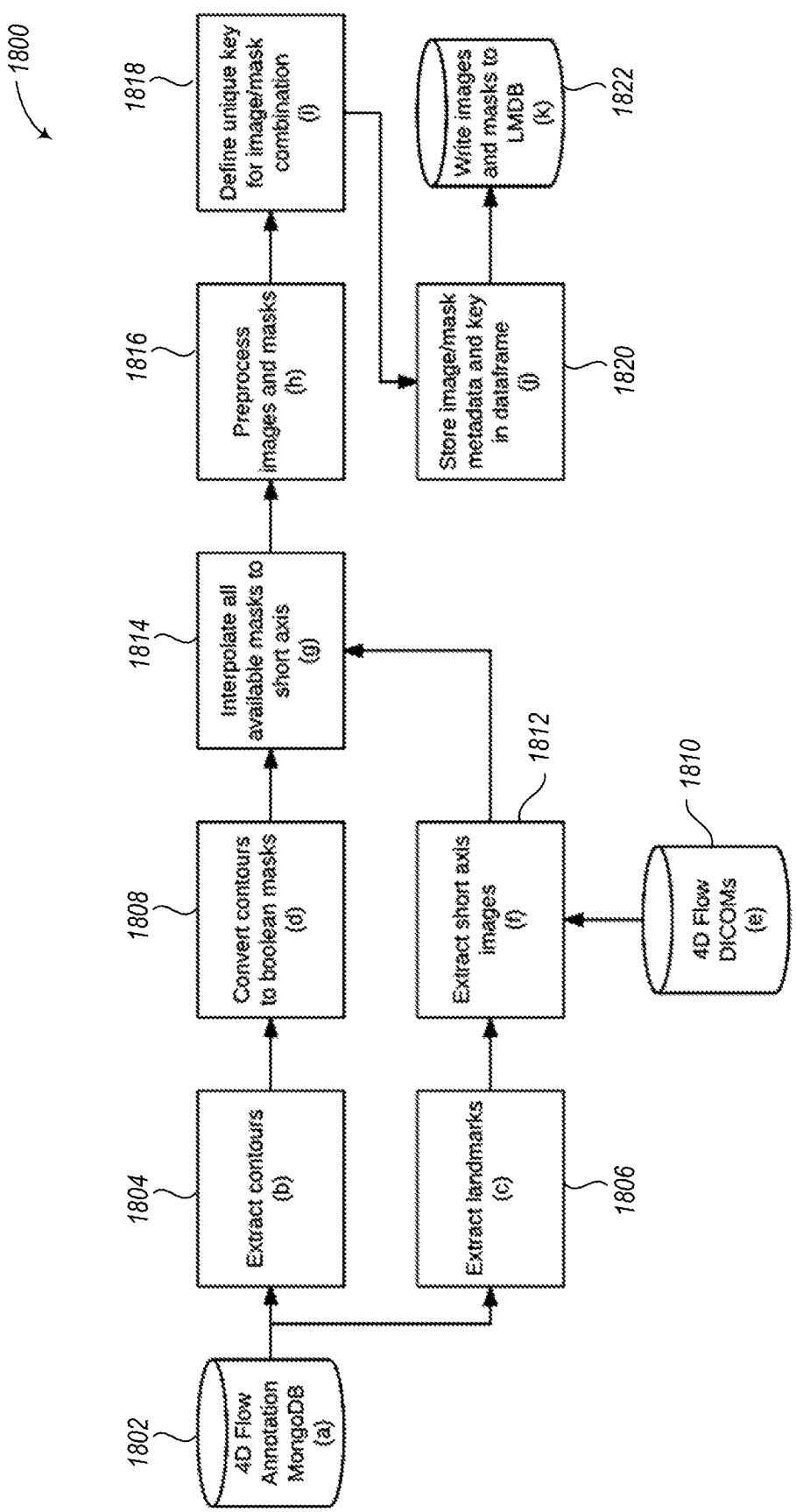
FIG. 18 is a schematic diagram which illustrates creation of a lightning memory-mapped database (LMDB) for training with 4D Flow data, according to one illustrated implementation.

FIG. 18 shows a process 1800 of creating a training LMDB from clinician annotations. 4D Flow annotations may be stored in a MongoDB 1802. At 1804 and 1806, the system extracts the contours and landmarks, respectively. Contours are stored as a series of (x, y, z) points defining the splines of the contour. Landmarks are stored as a single four-dimensional coordinate (x, y, z, t) for each landmark.

At 1808, in order to convert the contours into boolean masks, the system calculates a rotation matrix to rotate the contour points onto the x-y plane. The system may also define a sampling grid, i.e., a set of (x, y, z) points, on the original plane of the contour. The system rotates both the contour and the sampling grid by the same rotation matrix such that they are in the x-y plane. It is now a simple task to determine which points of the sampling grid are within the 2D vertices defining the contour. This is a simple computational geometry problem for 2D polygons.

4D Flow DICOMs are stored in a database 1810. At 1812, the system uses the landmark annotations from act 1806 and the 4D Flow DICOMs from the database 1810 to define and generate images along a SAX stack. In general, this SAX stack is different from that of the original SAX stacks in which the ground truth contours were defined. The system defines the stack to be orthogonal to the line connecting the left ventricle apex (LVA) and the mitral valve (MV). Other combinations of appropriate landmarks, such as the right ventricle apex (RVA) and tricuspid valve (TV), would work similarly.

In at least some implementations, the system defines there to be a number (e.g., 14) of slices between the LVA and MV, as this is similar to the number of slices in most SSFP SAX stacks. Different numbers of slices may also be used. More slices would increase the training set diversity, though the actual on-disk size would increase more rapidly than the increase in diversity. The results are expected to be insensitive to the exact number of slices.

Four slices may be appended to the SAX stack past the LVA and four more past the MV. This ensures that the full ventricle is within the SAX stack. The results are likely insensitive to the exact number of additional slices used. The SAX stack may be oriented such that the RV is always on the left of the image (as is conventional in cardiac MR) by ensuring that aortic valve (AV) is oriented to the right of the line connecting the LVA to the MV. Although consistency of orientation is likely important for achieving good results, the exact chosen orientation is arbitrary.

Figure 19:
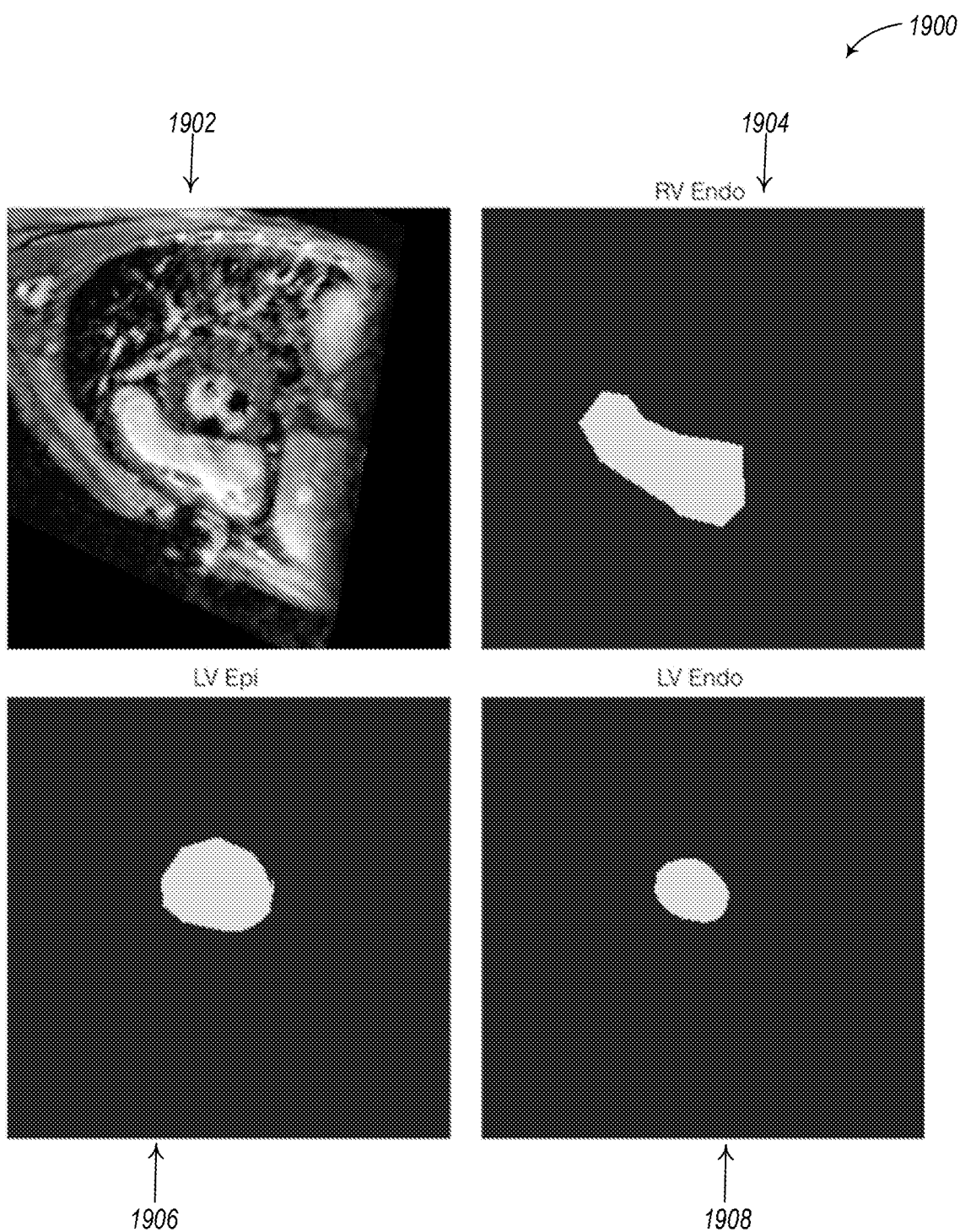
FIG. 19 is a diagram which shows a multi-planar reconstruction (top left), an RV endo mask (top right), a LV epi mask (bottom left), and an LV endo mask (bottom right) generated from a SAX plane, available labels, and the image data. These masks may be stored in one array, and along with the image, may be stored in an LMDB under a single unique key.
Figure 20:
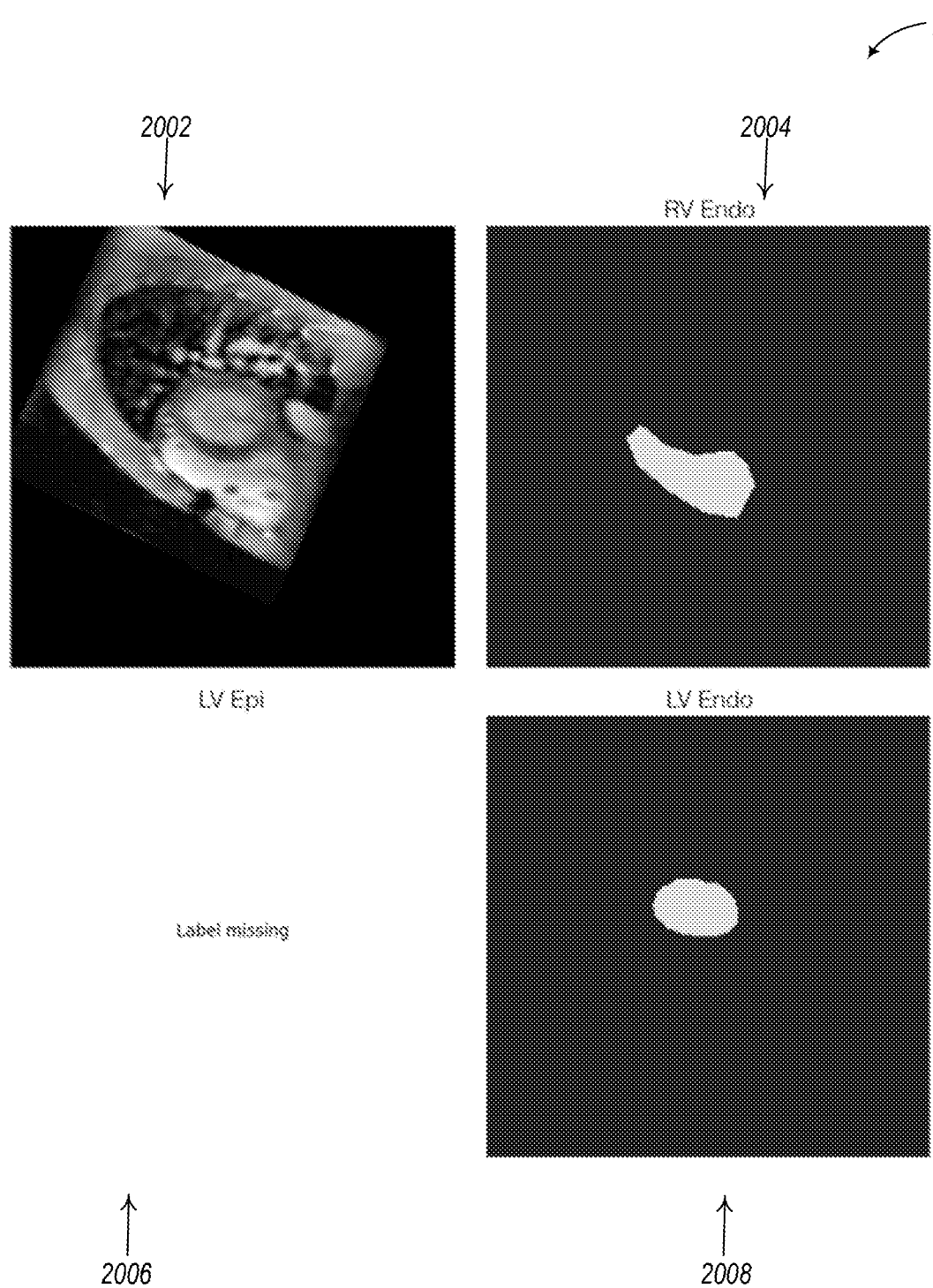
FIG. 20 is a diagram which is similar to the diagram of FIG. 19, except the LV epi mask is missing.

At 1814, in at least some implementations, all the available contours for a given study are interpolated to be on a single non-curved SAX stack for simplicity and speed in training and inference. Once the planes of the SAX stack are defined, a linear interpolator is set up for each ventricle and time point described by the original sampling grids, i.e., series of (x, y, z) points, and their corresponding masks. The system then interpolates the ground truth masks from their original SAX stacks onto the study's common SAX stack. An example of this is shown in the view 1900 of FIG. 19, which shows a multi-planar reconstruction 1902, an RV endo mask 1904, an LV epi mask 1906 and an LV endo mask 1908. A sentinel is used within the interpolated ground truth masks to indicate when labels are missing. An example visualization 2000 of this is shown in FIG. 20, which shows a multi-planar reconstruction 2002, an RV endo mask 2004, a missing LV epi mask 2006, and an LV endo mask 2008.

In at least some implementations, instead of projecting the ground truth masks to a common SAX stack, the masks may be projected onto the axial plane and perform training and inference in the axial plane. This may achieve similar accuracy, but may result in a slight loss of resolution due to the need to re-project inferred contours back into the SAX stack to display within the application's user interface.

At 1816, the system performs preprocessing operations. For example, preprocessing acts may include normalizing the images, cropping the images/masks, and resizing the images/masks.

At 1818, the system defines a unique key for 4D Flow LMDBs to be a 32 character hash of the string combination of the time index, slice index, side ("right" or "left"), layer ("endo" or "epi"), upload ID, workspace ID (unique identifier for one person's annotations), and workflow key (unique identifier for a given user's workflow in which they did the work). Any of a number of other unique keys for each image/mask pair may alternatively be used. At 1820, the system stores the image and mask metadata, including the time point, slice index and LMDB key in a dataframe. The normalized, cropped, and resized image and the cropped and resized mask are stored in an LMDB 1822 for each key.

DeepVentricle Inference for 4D Flow Data

Figure 21:
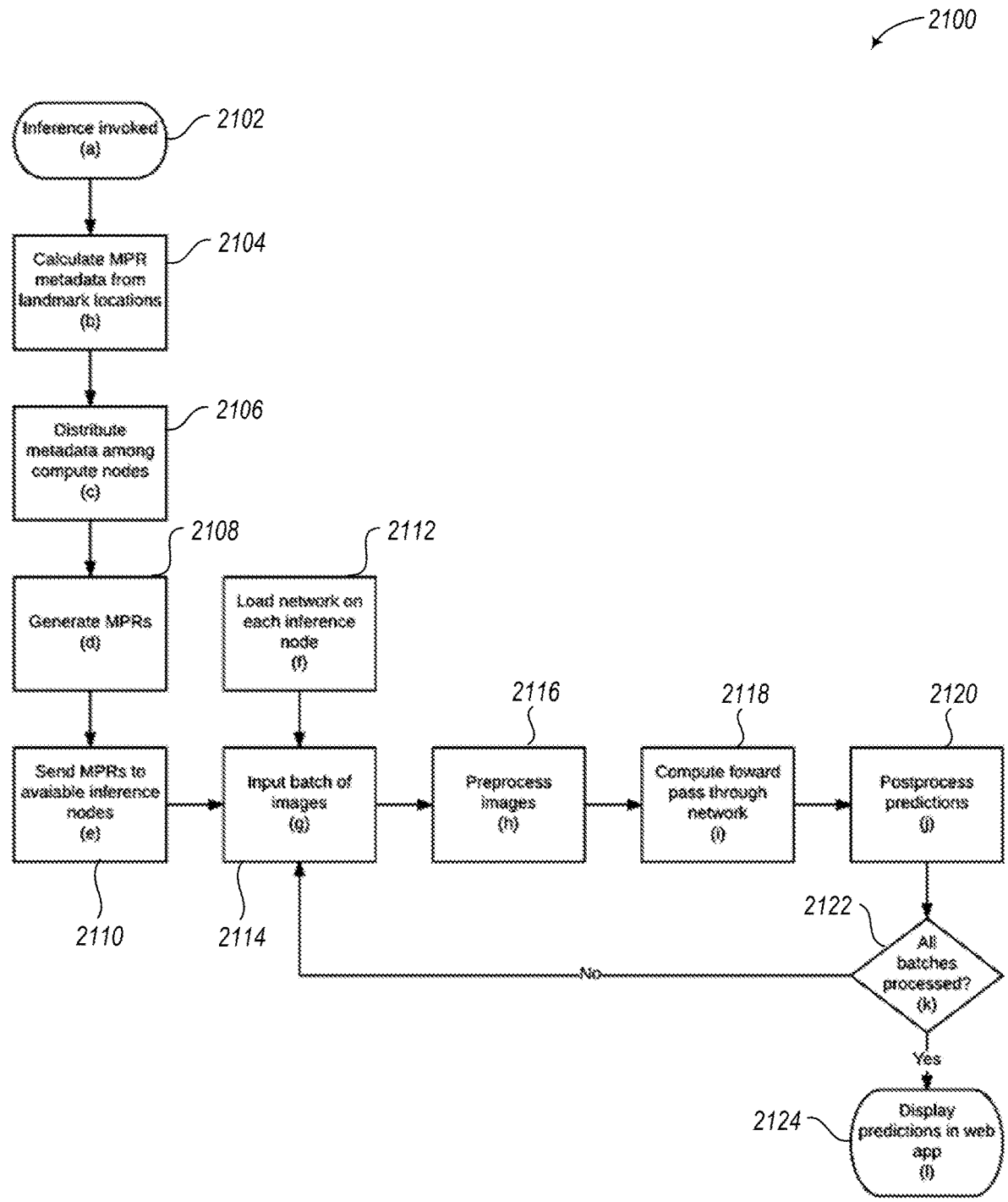
FIG. 21 is a flow diagram which illustrates an inference pipeline for 4D Flow, according to one illustrated implementation.

As with SSFP DeepVentricle inference discussed above, a web application may be used for inference for 4D Flow data. FIG. 21 shows a pipeline for a process 2100 by which the system makes predictions on new 4D Flow studies. At 2102, after a user has loaded a study in the web application, the user can invoke the inference service through a pipeline that is similar to the inference pipeline described above and shown in FIG. 9. Landmarks have already been defined, either manually or automatically (e.g., by an automatic landmark finding algorithm discussed below).

The landmark positions are used to create a standard LV SAX stack on which to perform inference. The SAX stack is created in the same way that the SAX stack was created during training, described above. At 2104, the metadata required to describe each MPR in the SAX stack is calculated from the landmark locations. The plane of each MPR is fully defined by a point on the plane and the normal of the plane, but the system also passes the vector connecting the mitral valve and aortic valve in this implementation to ensure the image will be oriented correctly. That is, the right ventricle is to the left in the images. Another set of landmarks, such as the mitral valve and tricuspid valve, may also suffice for ensuring the right ventricle was to the left in the images.

At 2106, the MPR metadata is then sent to the compute servers, which hold a distributed version of the data (each compute node has a few time points of data). At 2108, each node renders the requested MPRs for the time points it has available. At 2110, the generated MPR images, along with their metadata, including the time point, orientation, position, and slice index, are then distributed evenly by time point across multiple inference servers. At 2112, the network is loaded onto each inference node.

At 2114, one batch of images at a time is processed by each inference node. At 2116, the images are preprocessed. At 2118, a forward pass is computed. At 2120, the predictions are postprocessed, and spline contours are created in the same way as in the SSFP implementations discussed above.

At 2122, the generated splines are forwarded back to the web server after all batches have been processed, where the splines are joined with the inference results from other inference nodes. The web server ensures that the volume is contiguous (i.e., no missing contours in the middle of the volume) by interpolating between neighboring slices if a contour is missing. At 2124, the web server saves the contours in the database, then presents the contours to the user via the web application. If the user edits a spline, the spline's updated version is saved in the database alongside the original, automatically-generated version. In at least some implementations, comparing manually edited contours with their original, automatically-generated versions, may be used to re-train or fine-tune a model only on inference results that required manual correction.

Figure 22:
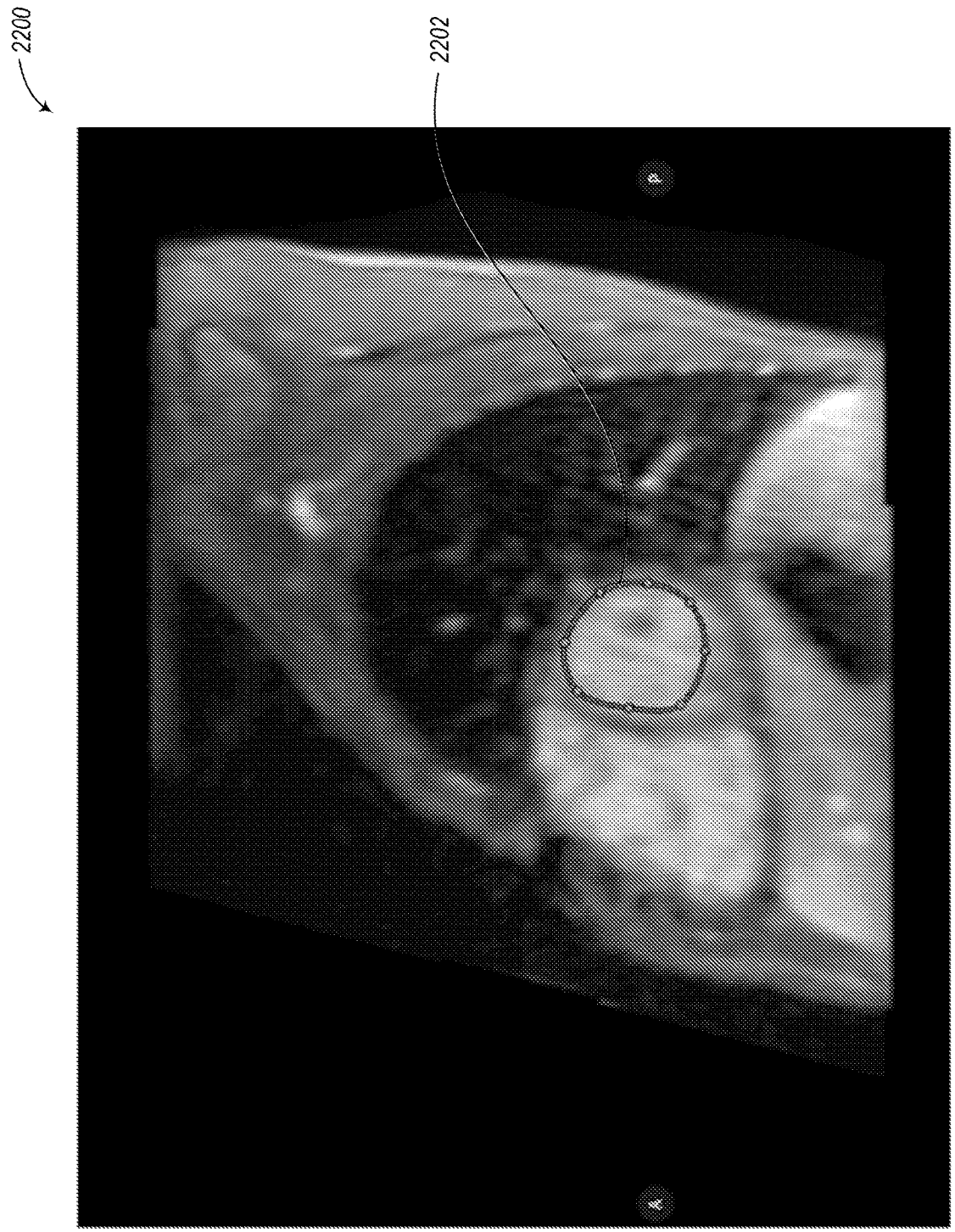
FIG. 22 is a screenshot depicting an in-application inference for LV endo on a 4D Flow study.
Figure 23:
FIG. 23 is a screenshot depicting an in-application inference for LV epi on a 4D Flow study.
Figure 24:
FIG. 24 is a screenshot depicting an in-application inference for RV endo on a 4D Flow study.

FIGS. 22, 23, and 24 show images 2200, 2300 and 2400, respectively, of in-application inference for LV Endo (contour 2202), LV Epi (contour 2302), and RV Endo (contour 2402), respectively at a single time point and slice location. As with SSFP, the calculated volumes at ED and ES may be presented to the user, as well as multiple computed measurements (see FIG. 13).

3D End-To-End Convolutional Architecture

Another approach for end-to-end segmentation of the ventricles is to utilize volumetric images, volumetric masks, and 3D convolutional kernels throughout. Both the description and operation of this implementation closely follow that of the SSFP implementation discussed above, but with a few key differences. Thus, for brevity, the following discussion focuses primarily on such differences.

The DeepVentricle architecture for this implementation is nearly identical to that discussed above, except convolutional kernels are (N×M×K) pixels rather than just (N×M) pixels, where N, M and K are positive integers which may be equal to or different from each other. The model parameters also look similar, but the addition of a depth component in describing the training data may be necessary to fully describe the shape of the volumetric input image.

A training LMDB is utilized for this implementation, as with other implementations. The LMDB for this implementation may be created in a similar way to that of the 4D Flow implementation discussed above. However, for this implementation, many more slices are utilized to define the SAX such that the slice spacing between neighboring slices is similar to that of the pixel spacing in the x and y directions (i.e., pixel spacing is nearly isotropic in three dimensions). It is likely that similar results could be achieved with non-isotropic pixel spacing, as long as the ratio between pixel spacings is conserved across all studies. The SAX MPRs and masks are then ordered by spatial slice and these slices are concatenated into one coherent volumetric image. Model training occurs according to the same pipeline as described above with reference to FIG. 8.

The inference pipeline closely resembles that of the 4D Flow implementation as well. However, in this implementations neighboring MPRs need to be concatenated into one volumetric image before inference.

Exclusion of Papillary Muscles

An additional implementation of the DeepVentricle automatic segmentation model is one in which only the blood pool of the ventricle is segmented and the papillary muscles are excluded. In practice, because the papillary muscles are small and irregularly shaped, they are typically included in the segmented areas for convenience. The architecture, hyperparameters, and training database of this implementation, which excludes the papillary muscles from the blood pool, are all similar to the SSFP implementation discussed above. However, in this implementation the ground truth segmentation database contains left and right ventricle endocardium annotations that exclude the papillary muscles rather than include them.

Because segmentations that exclude the papillary muscles from endocardium contours are onerous to create, the quantity of training data may be significantly less than what can be acquired for segmentations that do not exclude the papillary muscles. To compensate for this, first a convolutional neural network that was trained on data for which papillary muscles were included in endocardium segmentations and excluded from epicardium segmentations may be used. This allows the network to learn to segment the general size and shape of each class. That network is then fine-tuned on a smaller set of data that excludes the papillary muscles from the segmentation. The result is a segmentation model that segments the same classes as before, but with papillary muscles excluded from endocardium segmentations. This results in a more accurate measure of ventricular blood pool volume than has been previously available when the papillary muscles were included within the endocardium contour.

Synthesis of Other Views for Automated Volumes

Traditional image classification or segmentation neural network architectures operate on a single, possibly multi-channel (e.g., RGB), possibly volumetric, image at a time. A standard 2D approach includes the network operating on a single slice from the 3D volume at a time. In this case, only the information from that single slice is used to classify or segment the data in that slice. The problem with this approach is that no context from surrounding time points or slices is incorporated into inference for the slice of interest. A standard 3D approach utilizes a 3D kernel and incorporates volumetric information in order to make volumetric predictions. However, this approach is slow and requires significant computational resources for both training and inference.

A few hybrid approaches, discussed below, may be used optimize the tradeoff between memory/computation and the availability of spatiotemporal context to the model. Spatial context is particularly useful for ventricular segmentation near the base of the heart, where the mitral and tricuspid valves are difficult to distinguish on a single 2D slice. Temporal context, and enforcing consistency of the segmentations, may be useful for all parts of the segmentation.

In a first approach, the problem is interpreted as 2D problem, making predictions on a single slice at a time, but with adjacent slices (either in space, in time or both) interpreted as additional "channels" of the image. For example, at time t=5 and slice=10, a 9-channel image may be created where the data at the following time/slice combinations is packed into the following 9 channels: t=4, slice=9; t=4, slice=10; t=4, slice=11; t=5, slice=9; t=5, slice=10; t=5, slice=11; t=6, slice=9; t=6, slice=10; and t=6, slice=11. In this configuration, the network operates with 2D convolutions, but incorporates data from nearby spatial and temporal locations, and synthesizes the information via the standard neural network technique of creating feature maps via linear combinations of the input channels convolved with learned kernels.

A second approach is specific to some intricacies of cardiac MRI, though it may be used in any scenario in which orthogonal (or oblique) planes of data are acquired. In standard SSFP cardiac MRI, a short axis (SAX) stack is acquired along with one or more long axis (LAX) planes. The LAX planes are orthogonal to the SAX stack, and the LAX planes typically have significantly higher spatial resolution in the direction along the left ventricle's long axis. That is, an LAX image created by an MPR of a SAX stack has poorer resolution than a native LAX image, since the SAX inter-slice spacing is significantly coarser than the LAX in-plane pixel spacing. Because of the higher spatial resolution in the long axis direction, it is much easier to see the valves in the LAX images compared with the SAX images.

Thus, a two-stage ventricle segmentation model may be utilized. In a first stage, the ventricles are segmented in one or more LAX planes. Because of the high spatial resolution of these images, the segmentation can be very precise. A disadvantage is the LAX plane consists of only a single plane instead of a volume. If this LAX segmentation is projected to the SAX stack, the LAX segmentation appears as a line on each of the SAX images. This line may be created precisely if the line is aggregated across segmentations from multiple LAX views (e.g., 2CH, 3CH, 4CH; see the heading "Interface for defining valve planes for manual LV/RV volumes" below). This line may be used to bound the SAX segmentation, which is generated via a different model that operates on the SAX images. The SAX segmentation model uses both the raw SAX DICOM data as well as the predicted projected lines from the LAX model(s) as inputs in order to make its prediction. The predicted LAX lines serve to guide and bound the SAX predictions, and particularly aid the model near the base of the heart and valve plane, where the segmentations are often ambiguous when viewed on the SAX stack alone.

This technique may be used for any cardiac imaging, including 4D Flow in which the entire volume is acquired at once (and SAX and LAX images are not collected separately), and has the advantage of requiring only 2D kernels to be employed, albeit in two chained models.

Use of Time or Flow Information for Automated Volumes

SSFP cine studies contain of 4 dimensions of data (3 space, 1 time), and 4D Flow studies contain 5 dimensions of data (3 space, 1 time, 4 channels of information). These 4 channels of information are the anatomy (i.e. signal intensity), x axis phase, y axis phase, and z axis phase. The simplest way to build a model uses only signal intensities at each 3D spatial point, and does not incorporate the temporal information or, for 4D Flow, the flow information. This simple model takes as input 3D data cubes of shape (x, y, z).

To capitalize on all the data available, in at least some implementations, the time and phase data are incorporated as well. This is particularly useful for at least a few reasons. First, because the movement of the heart usually follows a predictable pattern during the cardiac cycle, relative movement of pixels can particularly help identify anatomical regions. Second, usually around 20 time points are recorded for a cardiac cycle, which means that the heart moves only slightly between frames. Knowing that predictions should change only slightly between frames can serve as a way of regularizing the model output. Third, flow information can be used to locate structures, such as valves, which have very regular flow patterns that vary between low and high flow.

To incorporate time data, time may be added as an additional "channel" to the intensity data. In such implementations, the model then takes as input 3D data blobs of shape (X, Y, NTIMES) or 4D data blobs of shape (X, Y, Z, NTIMES), where NTIMES is the number of time points to include. This may be all time points, or a few time points surrounding the time point of interest. If all time points are included, it may be desirable or necessary to pad the data with a few "wrapped around" time points, since time represents a cardiac cycle and is intrinsically cyclical. The model may then either involve 2D/3D convolutions with time points as additional "channels" of the data, or 3D/4D convolutions. In the former case, the output may be 2D/3D at a single time of interest. In the latter case, the output may be 3D/4D and may include data at the same time points as were included in the input.

Phase data, as acquired in 4D Flow, may also be incorporated in an analogous way, using either each direction of phase (x, y, z) as an additional channel of the input data, or using only the phase magnitude as a single additional channel. Without time, and with all three components of flow, the input has shape (X, Y, Z, 4) where the 4 indicates pixel intensity and the three components of phase. With time, this shape is (X, Y, Z, NTIMES, 4). In such implementations, the model therefore operates with 4 or 5-dimensional convolutions.

Automated 4D Flow Landmarks

Systems and methods discussed herein also allow for automated detection of the region of multiple cardiac landmarks in a 3D MRI. The system handles diverse sets of MRIs with varying position, orientation, and appearance of the imaged heart. Moreover, the system effectively deals with the problem of learning from a database with incomplete annotations. More specifically, the system addresses the problem of detecting every landmark in an image, when only some landmarks have been located for each input volumetric image on the training set.

Generally, the pipeline is an end-to-end machine learning algorithm which autonomously outputs the required landmark position from raw 3D images. Advantageously, the system requires no pre-processing or prior knowledge from the user. Further, the detected landmarks in the volumetric image may be used to project the image along the 2CH, 3CH, 4CH, and SAX views. Such allows these views to be created automatically, with no intervention by the user.

Initially, a first implementation of the solution is discussed. In this implementation, cardiac landmarks are located using a neural network with many layers. The architecture is three dimensional (3D) and uses 3D convolutions. This description focuses on the detection of three left ventricle landmarks (LV apex, mitral valve, and aortic valve), and three right ventricle landmarks (RV apex, tricuspid valve, and pulmonary valve). However, it is noted that this method may be applied for the detection of more diverse cardiac landmarks with comparable results, if these annotations are available as part of the ground truth.

Figure 25:
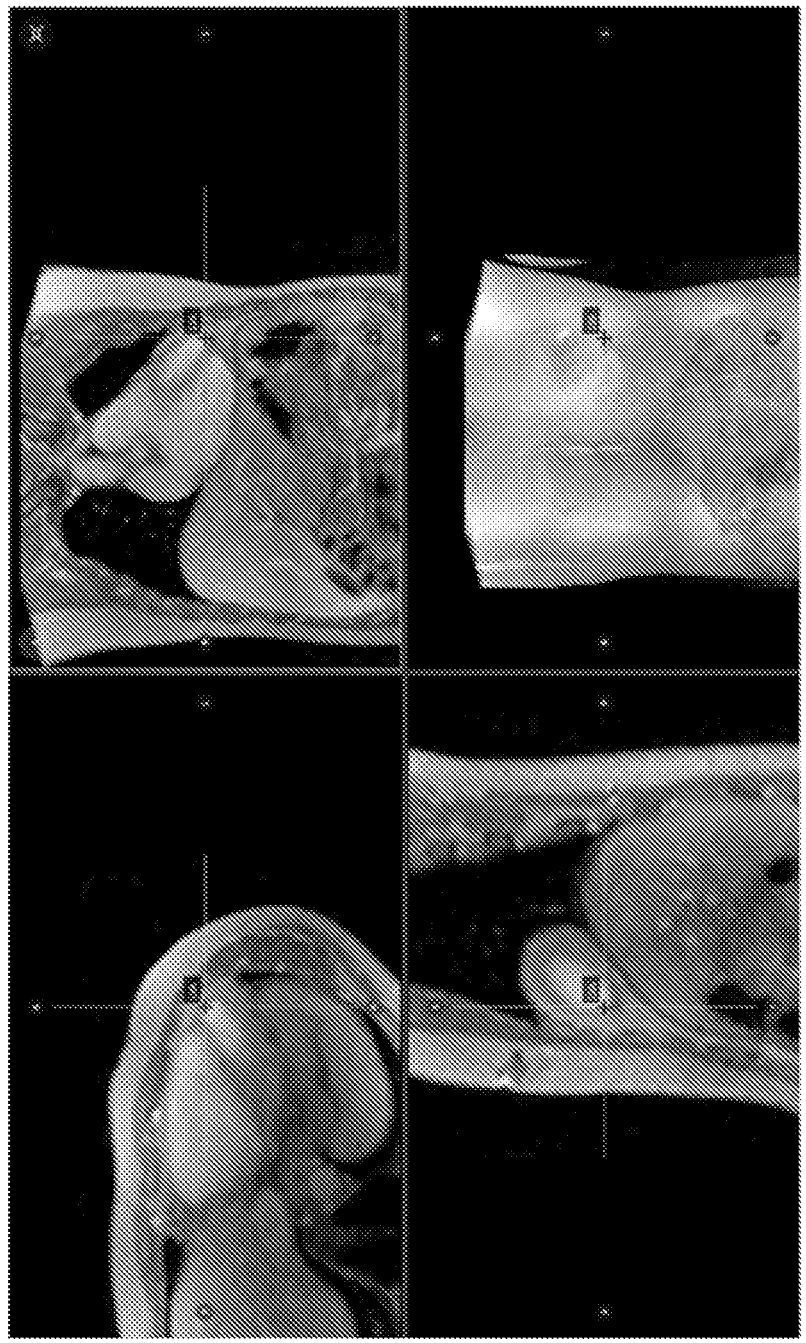
FIG. 25 is a screenshot which illustrates locating the left ventricle apex (LVA) using a web application, according to one illustrated implementation.
Figure 26:
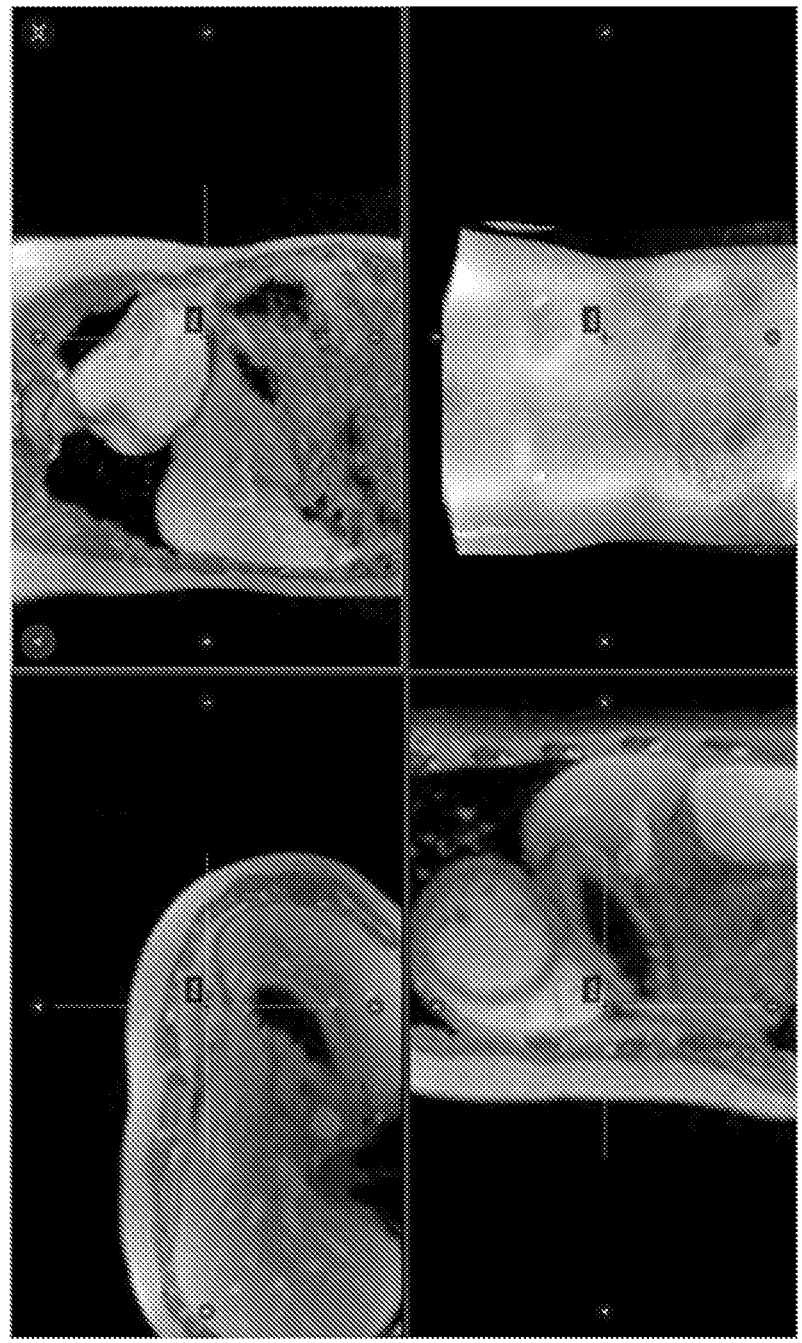
FIG. 26 is a screenshot which illustrates locating the right ventricle apex (RVA) using a web application, according to one illustrated implementation.
Figure 27:
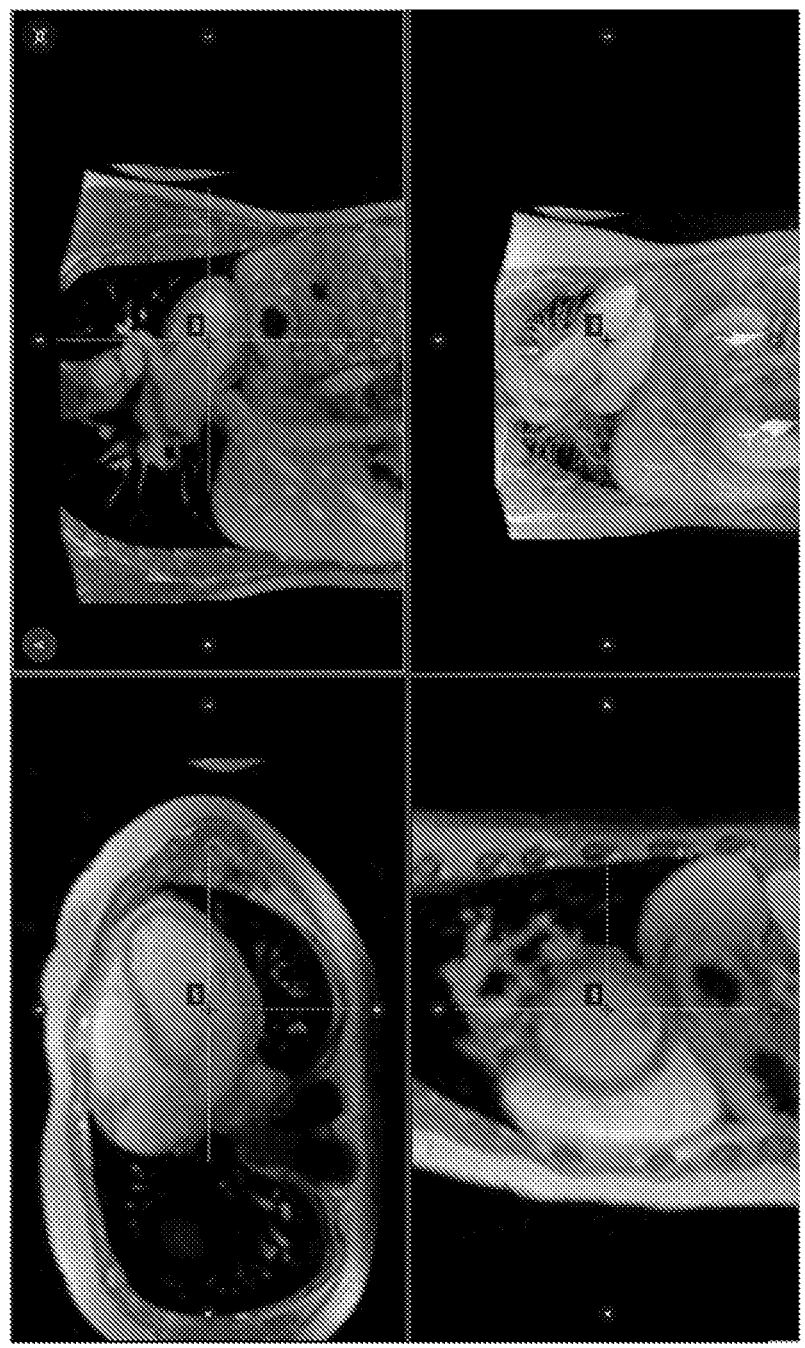
FIG. 27 is a screenshot which illustrates locating the mitral valve (MV) using a web application, according to one illustrated implementation.

Similar to the previously described DeepVentricle architecture, the landmark detection method of the present disclosure is based on convolutional neural networks. The information necessary for landmark detection is extracted from a database of clinical images, along with their annotations (i.e., landmark positions). FIGS. 25, 26, and 27 show images 2500, 2600, 2700, respectively, of three patients where the left ventricle apex, mitral valve, and right ventricle apex, respectively, have been positioned using a web application, such as the web application discussed above. Note how annotations for the aortic valve, pulmonary valve, and tricuspid valve are missing in this example.

First, the data handling pipeline is described. This section details the process which is followed to create the database of images with their annotations, along with the specific method used to encode landmark location. Second, the architecture of the machine learning approach is presented. How the network transforms the input 3D image into a prediction of landmark location is presented. Third, how the model is trained to the available data is described. Finally, the inference pipeline is detailed. It is shown how one can apply the neural network to an image never used before to predict the region of all six landmarks.

Data Handling Pipeline

For the presented machine learning approach, a database of 4D Flow data is used, which includes three dimensional (3D) magnetic resonance images (MRI) of the heart, stored as series of two dimensional (2D) DICOM images. Typically, around 20 3D volumetric images are acquired throughout a single cardiac cycle, each corresponding to one snapshot of the heartbeat. The initial database thus corresponds to the 3D images of different patients at different time steps. Each 3D MRI presents a number of landmark annotations, from zero landmark to six landmarks, placed by the user of the web application. The landmark annotations, if present, are stored as vectors of coordinates (x, y, z, t) indicating the position (x, y, z) of the landmark in the 3D MRI corresponding to the time point t.

Figure 28:
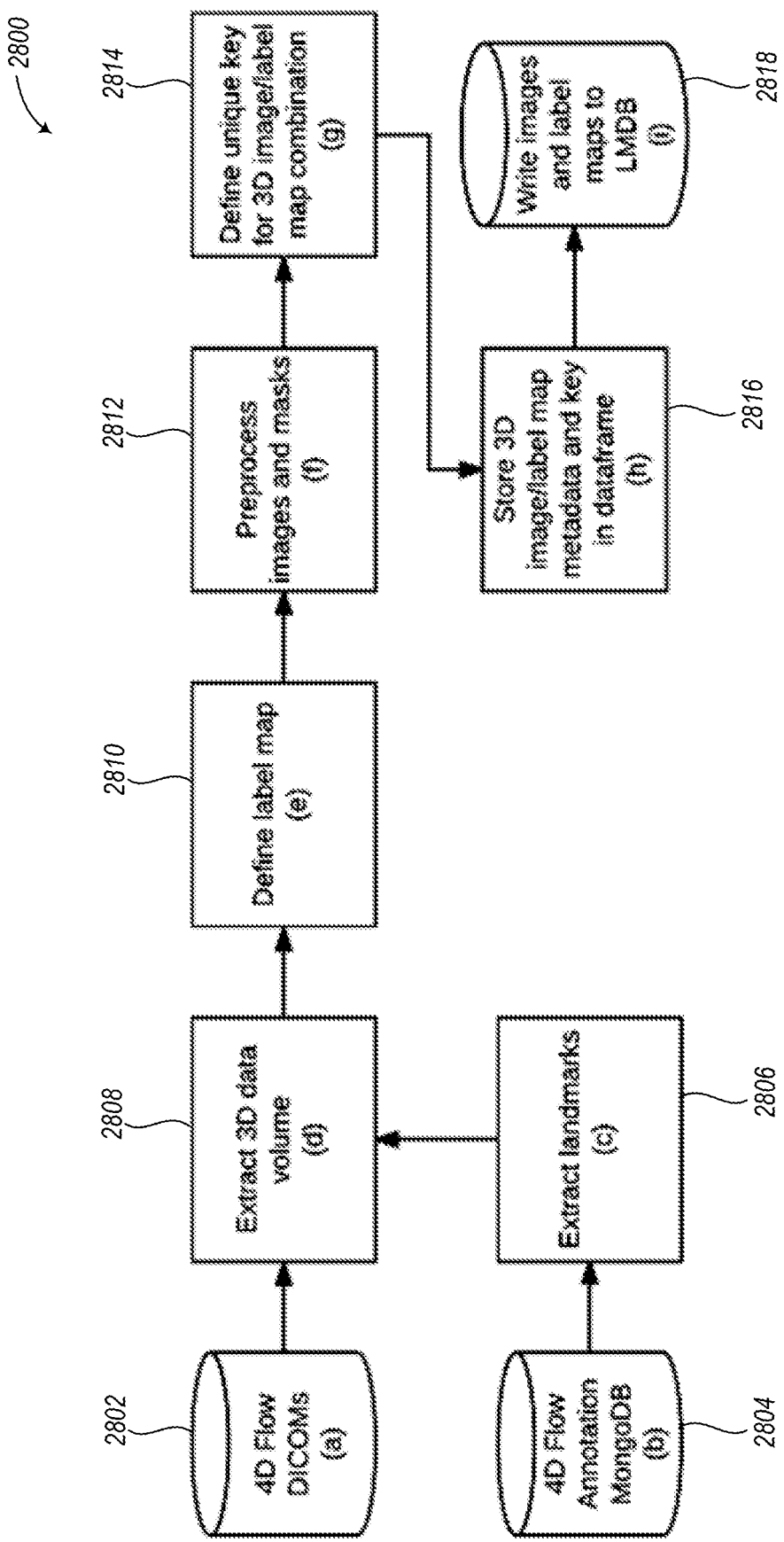
FIG. 28 is a flow diagram which illustrates a process for creation of a training database, according to one illustrated implementation.

FIG. 28 shows a process 2800 which may be followed to handle 2D DICOM slices of the 4D Flow images 2802, and the annotations 2804 stored in a MongoDB database.

At 2806, the landmark coordinates are extracted from the MongoDB database. Then, at 2808, the 3D MRIs are extracted from the series of 2D DICOM images by stacking 2D DICOM images from a single time point together according to their location along the z-axis (i.e., the 2D images are stacked along the depth dimension to create 3D volumes). This results in a volumetric 3D image representing a full view of the heart. The LMDB is built with 3D images that have been annotated with at least one landmark position. This means that images with no ground truth landmarks are not included in the LMDB.

At 2810, the label maps are defined which encode the annotation information in a way understandable by the neural network which will be used in later stages. The position of a landmark is encoded by indicating, at each position in the 3D volume, how likely the position is to be at the landmark position. To do so, a 3D Gaussian probability distribution is created, centered on the position of the ground truth landmark with standard deviation corresponding to observed inter-rater variability of that type of landmark across all the training data.

To understand inter-rater variability, consider one specific landmark such as the LV apex. For every study in which the LV Apex was annotated by more than one user or "rater," the standard deviation of the LV Apex coordinates across all users is computed. By repeating this process for each landmark, the standard deviation for Gaussian used to encode each landmark is defined. This process allows for the setting of this parameter in a principled manner. Among the different advantages of using this approach, it is note that the standard deviation is different for each landmark, and depends on the complexity of locating the landmark. Specifically, more difficult landmarks have larger Gaussian standard deviation in the target probability maps. Further, the standard deviation is different along the x, y, and z axis, reflecting the fact that the uncertainty might be larger along one direction rather than another because of the anatomy of the heart and/or the resolution of the images.

Figure 29:
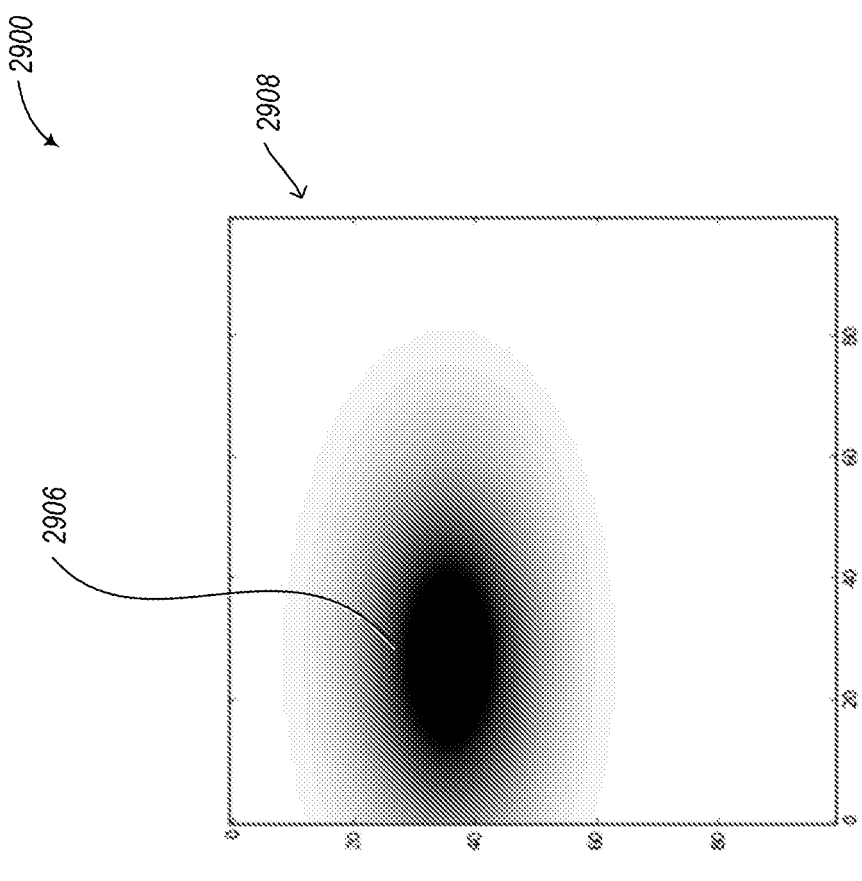
FIG. 29 is a diagram which illustrates encoding of a landmark position on an image with a Gaussian evaluated on the image.
Figure 29:
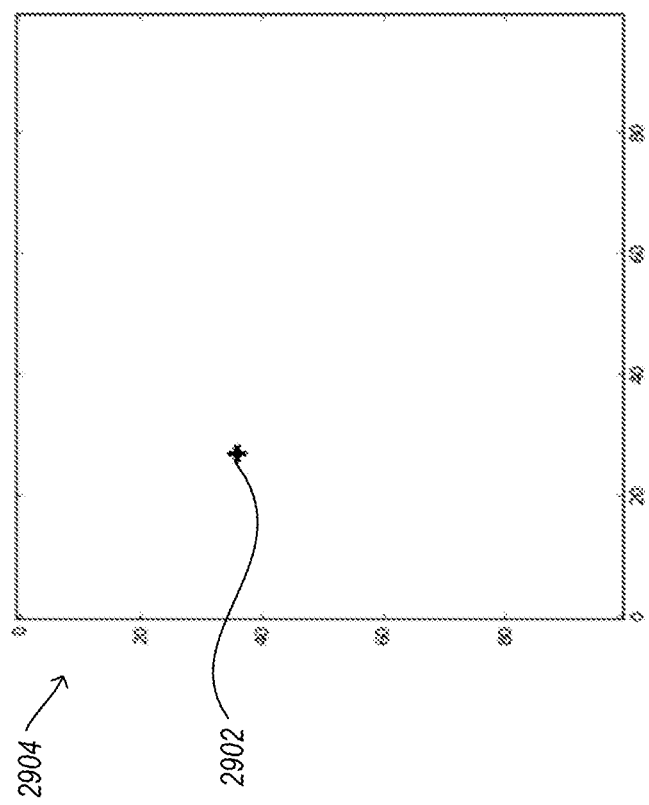

Note that alternative strategies may also be used to define the standard deviation (arbitrary value, parameter search) and may lead to comparable results. FIG. 29 shows this transition from a landmark position, identified with a cross 2902 in a view 2904, to a Gaussian 2906 in a view 2908 evaluated on the image for the 2D case.

At 2812, once the 3D volumes have been defined for both the MRI and the label map, the images are prepocessed. Generally, the goal is to normalize the images size and appearance for future training.

Figure 30:
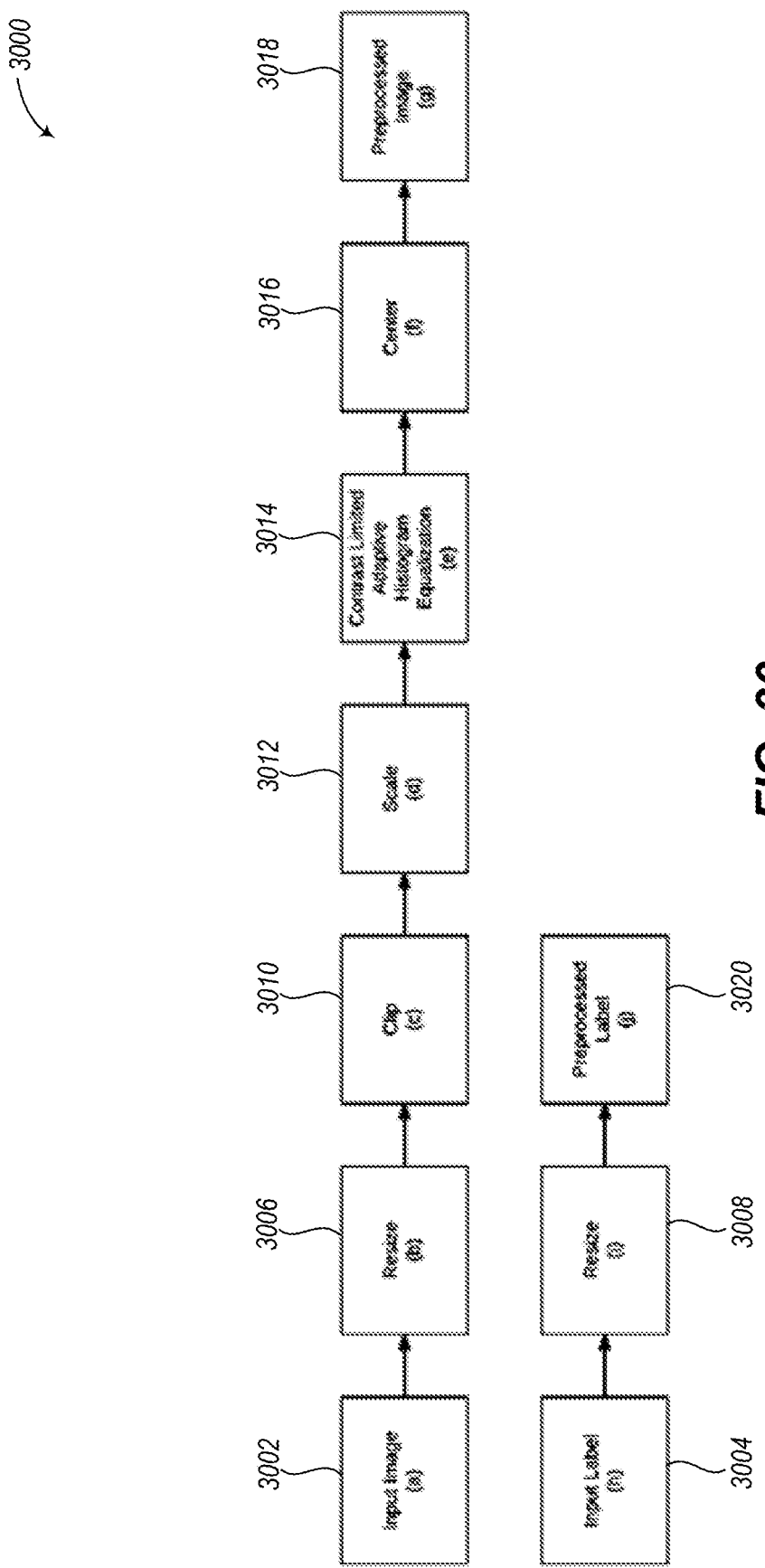
FIG. 30 is a flow diagram of a preprocessing pipeline for the images and landmarks, according to one illustrated implementation.

FIG. 30 shows a process 3000 for a preprocessing pipeline. At 3006 and 3008, the 3D MRIs 3002 and label maps 3004, respectively, are resized to a predefined size $n\_x \times n\_y \times n\_z$ such that all of the MRIs can be fed to the same neural network. At 3010, the intensity of the MRI pixels are clipped between the 1st and 99th percentile. This means that the pixel intensity will saturate at the value of the intensity corresponding to the 1st and 99th percentile. This removes outlier pixel intensities that may be caused by artifacts. At 3012, the intensities are then scaled to lie between 0 and 1. At 3014, the intensity histogram is then normalized using contrast limited adaptive histogram equalization to maximize contrast in the image and minimize intra-image intensity differences (as may be caused by, for example, magnetic field inhomogeneities). Finally, at 3016 the image is centered to have zero mean. Other strategies may be used for the normalization of the image intensity, such as normalizing the variance of the input to one, and may yield similar results. This pipeline results in prepocessed images 3018 and labels 3020 which can be fed to the network.

Figure 31:
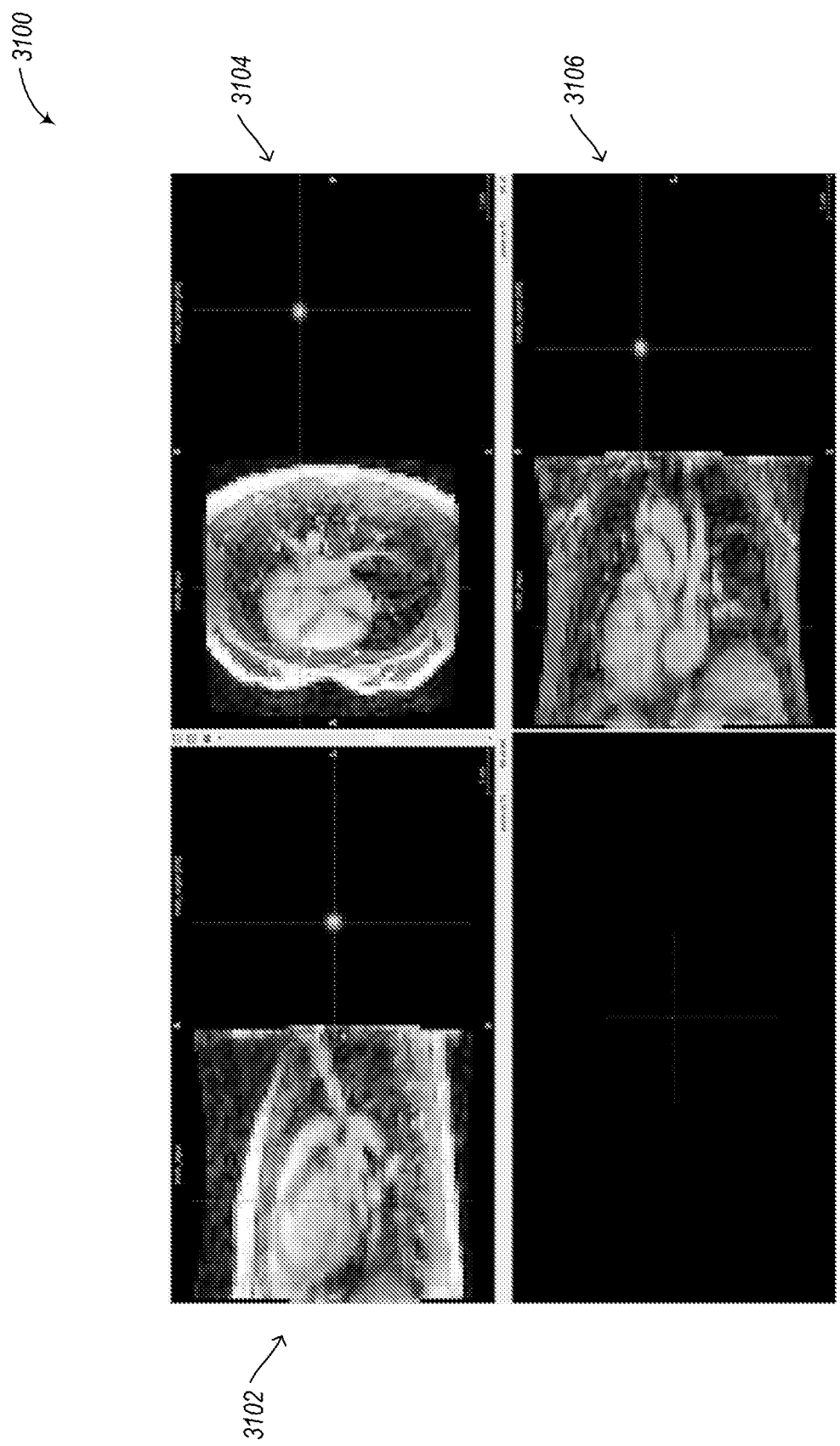
FIG. 31 is a plurality of screenshots which depict an example of pre-processed an input image and encoded mitral valve landmark for one patient. From top to bottom, from left to right, sagittal, axial, and coronal views are shown.
Figure 32:
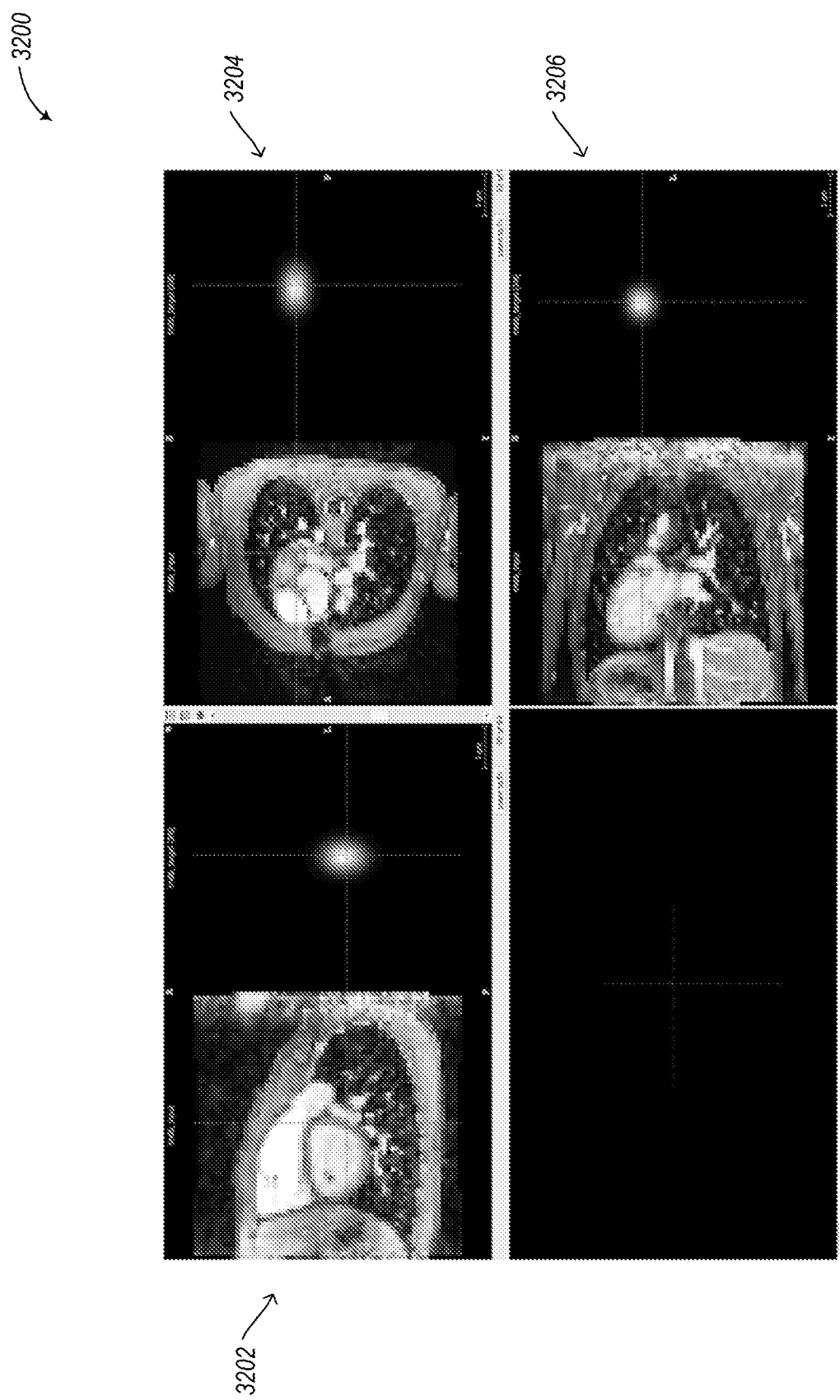
FIG. 32 is a plurality of screenshots which depict an example of pre-processed input image and encoded tricuspid valve landmark for one patient. From top to bottom, from left to right, sagittal, axial, and coronal views are shown.

FIGS. 31 and 32 show example images 3100 and 3200 for two patients of the pre-processed 3D MRI and encoded labels. In particular, FIG. 31 shows a sagittal view 3102, an axial view 3104, and a coronal view 3106 of a preprocessed input image and encoded mitral valve landmark for one patient, and FIG. 32 shows a sagittal view 3202, an axial view 3204, and a coronal view 3206 of a preprocessed input image and encoded mitral valve landmark for another patient. As can be seen in FIGS. 31 and 32, the uncertainty for the localization of the tricuspid valve is larger than the uncertainty for the mitral valve. Moreover, the uncertainty is different from one axis to the other.

Returning to FIG. 28, at 2814 an upload ID is defined to be the key that identifies the pair (MRI, label map), which is stored in a training LMDB database at 2816. Finally, at 2818 the pair (MRI, label map) is written to the LMDB.

Network Architecture

As noted above, a deep neural network is used for the detection of the landmarks. The network takes as input a preprocessed 3D MRI and outputs six 3D label maps, one per landmark. The architecture used in this implementation is similar or identical to the architecture described above. The network is composed of two symmetric paths: a contracting path and an expanding path (see FIG. 6).

As not all landmarks may not be available in the available training data, the systems and methods of the present disclosure advantageously handle missing information in the labels while still being able to predict all landmarks simultaneously.

The network used for landmark detection differs from the DeepVentricle implementation discussed above in three main ways. First, the architecture is three dimensional: the network processes a 3D MRI in a single pass, producing a 3D label map for every landmark. Second, the network predicts 6 classes, one for each landmark. Third, the parameters selected after the hyperparameter search can differ from the DeepVentricle parameters, and are specifically selected to solve the problem at hand. Additionally, the standard deviation used to define the label maps, discussed above, may be considered as a hyperparameter. The output of the network is a 3D map which encodes where the landmark is positioned. High values of the map may correspond to likely landmark position, and low values may correspond to unlikely landmark position.

Training

The following discussion describes how the deep neural network can be trained using the LMDB database of 3D MRI and label map pairs. The overall objective is to tune the parameters of the network such that the network is able to predict the position of the heart landmarks on previously unseen images. A flowchart of the training process is shown in FIG. 8 and described above.

The training database may be split into a training set used to train the model, a validation set used to quantify the quality of the model, and a test set. The split enforces all the images from a single patient to lie in the same set. This guarantees that the model is not validated with patients used for training. At no point is data from the test set used when training the model. Data from the test set may be used to show examples of landmark localization, but this information is not used for training or for ranking models with respect to one another.

During the training, the gradient of the loss is used in order to update the parameters of the neural network. In at least some implementations, weighting the loss in regions where the landmark is present may be utilized to provide faster convergence of the network. More precisely, when computing the loss, a larger weight may be applied to the region of the image near the landmarks, compared to the rest of the image. As a result, the network converges more rapidly. However, using non weighted-loss may also be used with good results, albeit with a longer training time.

Inference

Given a new image, the landmark position is inferred by pre-processing the image in a similar fashion as to what is described above with reference to FIG. 28. More precisely, the image may be resized, clipped, scaled, the image's histogram equalized, and the image may be centered. The network outputs one map per landmark, for a total of six 3D maps in the case of six landmarks. These maps describe the probability that each landmark is found in a particular position. Alternatively, the maps can be considered as encoding an inverse distance function from the true location of the landmark (i.e., high value results in small distance, low value results in large distance).

Figure 33:
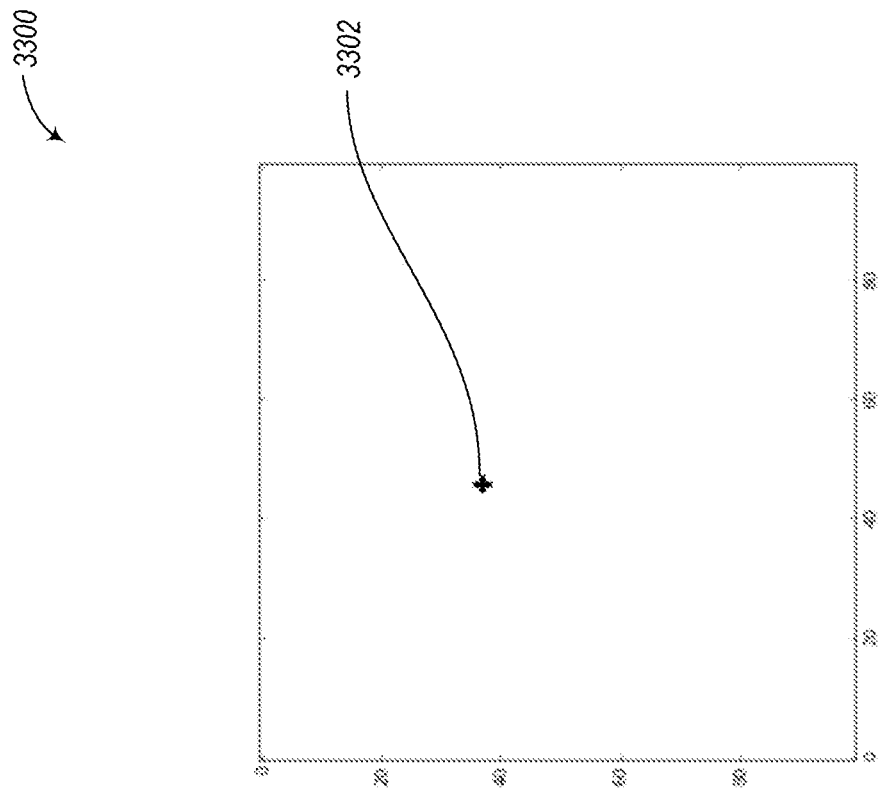
FIG. 33 is a diagram which illustrates prediction of a landmark position from network output.
Figure 33:
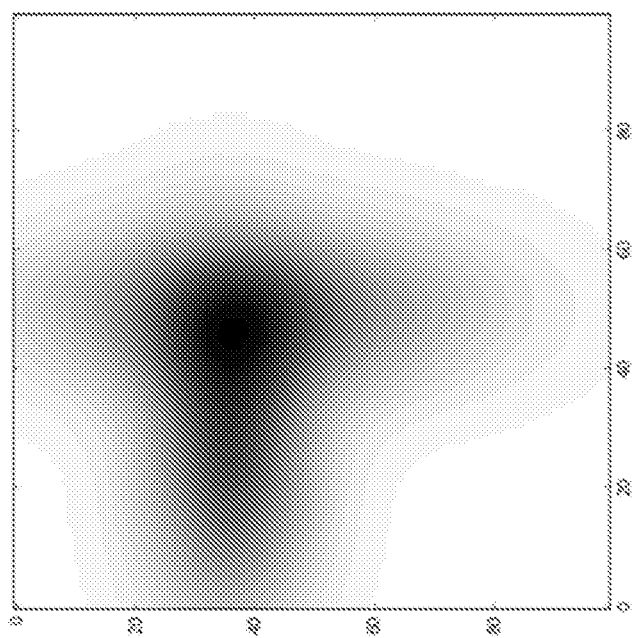

As such, as shown in a diagram 3300 of FIG. 33, the landmark position 3302 can be determined by looking for the maximum value of the output of the neural network for each landmark. This position is then projected into the space of the original non-preprocessed 3D input MRI for the final landmarks localization (e.g., undoing any spatial distortions that were applied to the volume during inference). Note that several other strategies may be used to translate the label maps into landmark position coordinates. For instance, one could take the expected location using the label map as a 3D probability density. Note that taking the maximum corresponds to considering the mode of the density. Or the probability estimate may be first smoothed before selecting the maximum or expected value as the location.

Data Gathering

In at least some implementations, the dataset is made of clinical studies uploaded on the web application by previous users. The annotations may be placed by the user on the different images. As explained previously, this dataset is split into a train, validation, and test set.

The neural network may be trained using the pipeline previously described above and shown in FIG. 8. Batches of data extracted from the train set are sequentially fed to the neural network. The gradient of the loss between the network prediction and the real landmark location is computed and backpropagated to update the intrinsic parameters of the network. Other model hyperparameters (e.g., network size, shape) are chosen using hyper-parameter search, as discussed above.

Model Accessibility

The trained model may be stored on servers as part of a cloud service. The model can be loaded on multiple servers at inference time in order to carry the detection of landmarks at several time points in parallel. This process is similar to the approach used for DeepVentricle, which is shown in FIG. 9 and discussed above.

User Interactions

When a cardiac MRI is uploaded to the web application, the user can select a "Views" button under a "Cardiac" section. This opens a new panel on the right of the image with a "Locate Landmarks" button. Selecting this button automatically locates the six landmarks on every 3D image at every time point. A list of the located landmark is visible on the right panel. Selecting the landmark name brings the focus of the image to the predicted landmark location, and the user is allowed to make any modifications deemed necessary. Once the user is satisfied, the user can select a "standard views" button which creates the standard 2, 3, 4 chamber and SAX views of the heart.

Figure 34:
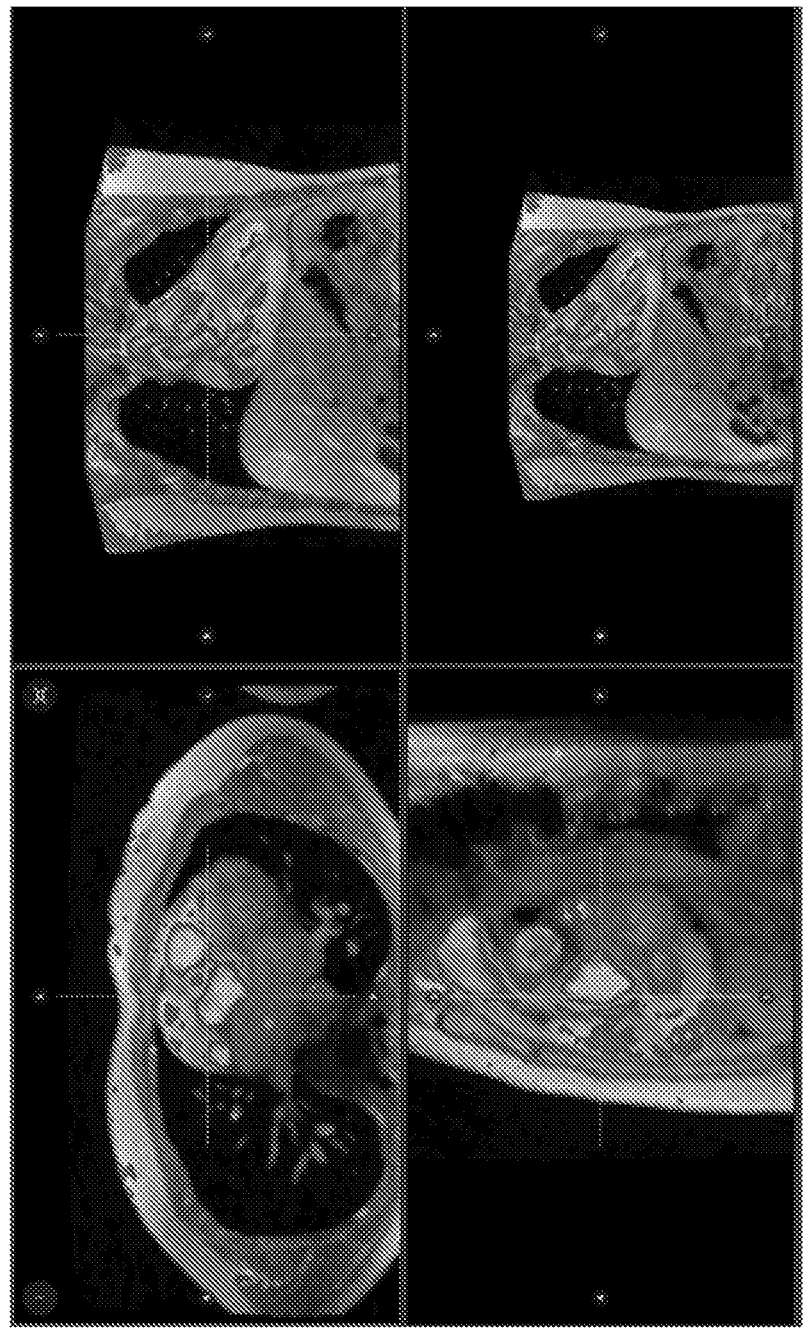
FIG. 34 is an example image showing flow information overlaid on an anatomical image.

In at least some implementations, the 3D images acquired are 4D Flow sequences. This means that the phase of the signal is also acquired, and may be used to quantify the velocity of the blood flow in the heart and arteries, as shown in the image 3400 of FIG. 34 which shows four different views. This information can be useful to locate the different landmarks of the heart. In this case, the previously described model may be augmented to include flow information.

Image Pre-Processing

In 4D Flow, flow velocity information is available at every time point of the acquisition for every patient. In order to make full use of this information, the standard deviation along the time axis may be computed at every voxel of the 3D image. Standard deviation magnitude is associated with the amount of blood flow variation of that pixel over the course of one heartbeat. This standard deviation image is then normalized according the previously described normalization pipeline: resizing, clipping, scaling, histogram equalization, centering. Note that several other approaches can be considered to encode the temporal information of the flow data. For instance, the Fourier transform of the 4D signal may be computed along the last dimension, and various frequency bins may be used to encode the signal. More generally, the whole time series may be input to the network, at the expense of requiring additional computation and memory power.

Network Extension

The input to the neural network may also be extended with an additional channel. More precisely, a four dimensional (4D) tensor may be defined where the last dimension encodes as separate channels the anatomical pixel intensity and the flow magnitude or components of velocity. The network described above may be extended to accept such tensor as input. This requires the extension of the first layer to accept a 4D tensor. The subsequent steps of network training, inference, and user interactions remain similar to what has been previously described.

In at least some implementations, the automatic location of cardiac landmarks may be achieved by directly predicting the coordinates (x, y, z) of the different landmarks. For that, a different network architecture may be used. This alternative network may be composed of a contracting path, followed with several fully connected layers, with a length-three vector of (x, y, z) coordinates as the output for each landmark. This is a regression, rather than a segmentation network. Note that, in the regression network, unlike in the segmentation network, there is no expanding path in the network. Other architectures may also be used with the same output format. In at least some implementations, time may also be included in the output as a fourth dimension if 4D data (x, y, z, time) is given as input.

Assuming time is not incorporated, the output of the network is eighteen scalars corresponding to three coordinates for each of the six landmarks in the input image. Such an architecture may be trained in a similar fashion to the previously described landmark detector. The only update needed is the re-formulation of the loss to account for the change in the network output format (a spatial point in this implementation, as opposed to the probability map used in the first implementation). One reasonable loss function may be the L2 (squared) distance between the output of the network and the real landmark coordinate, but other loss functions may be used as well, as long as the loss functions are related to the quantity of interest, namely the distance error.

The first landmark detection implementation discussed above may also be extended using a second neural network which acts as a discriminator network. The discriminator network may be trained in order to distinguish good and realistic landmark locations, from bad and unrealistic ones. In this formulation, the initial network of the implementation may be used to generate several landmark proposals for each type of landmark, such as by using all local maxima of the predicted landmark probability distribution. The discriminator network may then evaluate each proposal, for example, by using a classification architecture on a high-resolution patch, centered around the landmark proposal. The proposal with the highest probability of being the true landmark may then be taken as the output. This implementation may possibly help choose the correct landmark location in ambiguous situations, for example, in the presence of noise or artifacts.

Another approach for the detection of cardiac landmarks is the use of reinforcement learning. In this different framework, an agent walking along the 3D image is considered. The agent is at first placed in the center of the image. The agent then follows a policy until the agent reaches the landmark position. The policy represents the decision making process of the agent at each step: take a step left, right, up, down, above, or under. This policy may be learned using a deep neural network approximating the Bellman equation for the state-action function Q using the Q-learning algorithm. One Q function can then be learned for each of the landmarks to be detected.

In at least some implementations, a neural network may be used to directly predict parameters defining the locations and orientations of the planes for standard views. For instance, a network may be trained to calculate the 3D rotation angle, translation and rescaling needed to move a starting pixel grid to a long axis view. Separate models may be trained to predict different transformations or a single model may be used to output several views.

Interface for Defining Valve Planes for Manual LV/RV Volumes

In order to have a more accurate segmentation of the left and right ventricles, it may be advantageous to identify the position and orientation of the valves of the heart. In at least some implementations, within the aforementioned ventricle segmentation interface, a user is able to mark points that lie on the valve plane using the available long axis views. The valve plane is determined from these input points by performing a regression to find the plane that best fits. The normal for the plane is set to point away from the apex of the ventricle. Once the plane has been defined, any portion of the volume that lies on the positive side is subtracted from the total volume for the ventricle. This ensures that nothing outside the valve is included in determining the volume of the ventricle.

Example Processor-Based Device

Figure 35:
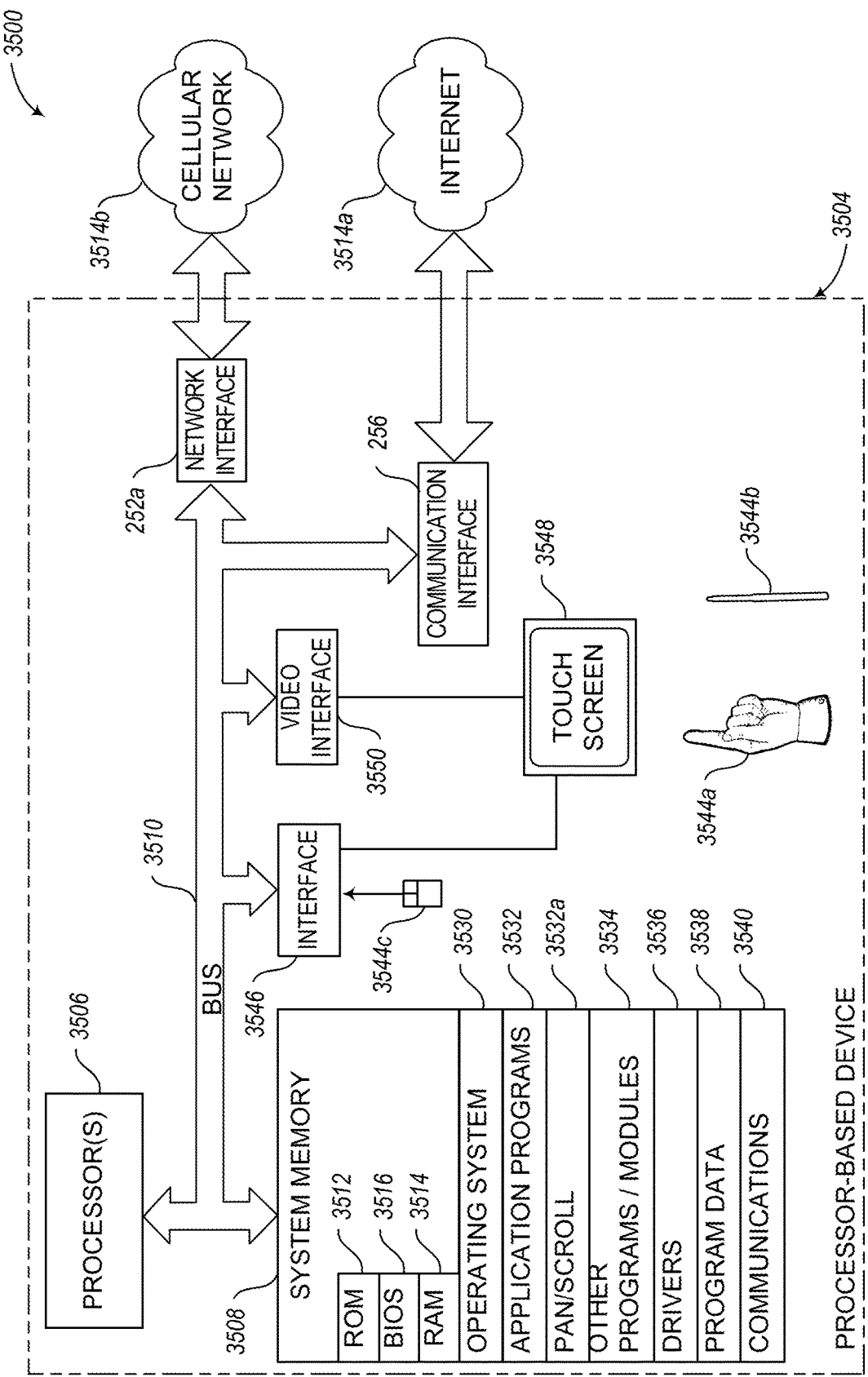
FIG. 35 is a block diagram of an example processor-based device used to implement one or more of the functions described herein, according to one non-limiting illustrated implementation.

FIG. 35 shows a processor-based device 3504 suitable for implementing various functionality described herein. Although not required, some portion of the implementations will be described in the general context of processor-executable instructions or logic, such as program application modules, objects, or macros being executed by one or more processors. Those skilled in the relevant art will appreciate that the described implementations, as well as other implementations, can be practiced with various processor-based system configurations, including handheld devices, such as smartphones and tablet computers, wearable devices, multiprocessor systems, microprocessor-based or programmable consumer electronics, personal computers ("PCs"), network PCs, minicomputers, mainframe computers, and the like.

The processor-based device 3504 may include one or more processors 3506, a system memory 3508 and a system bus 3510 that couples various system components including the system memory 3508 to the processor(s) 3506. The processor-based device 3504 will at times be referred to in the singular herein, but this is not intended to limit the implementations to a single system, since in certain implementations, there will be more than one system or other networked computing device involved. Non-limiting examples of commercially available systems include, but are not limited to, ARM processors from a variety of manufactures, Core microprocessors from Intel Corporation, U.S.A., PowerPC microprocessor from IBM, Sparc microprocessors from Sun Microsystems, Inc., PA-RISC series microprocessors from Hewlett-Packard Company, 68xxx series microprocessors from Motorola Corporation.

The processor(s) 3506 may be any logic processing unit, such as one or more central processing units (CPUs), microprocessors, digital signal processors (DSPs), application-specific integrated circuits (ASICs), field programmable gate arrays (FPGAs), etc. Unless described otherwise, the construction and operation of the various blocks shown in FIG. 35 are of conventional design. As a result, such blocks need not be described in further detail herein, as they will be understood by those skilled in the relevant art.

The system bus 3510 can employ any known bus structures or architectures, including a memory bus with memory controller, a peripheral bus, and a local bus. The system memory 3508 includes read-only memory ("ROM") 1012 and random access memory ("RAM") 3514. A basic input/output system ("BIOS") 3516, which can form part of the ROM 3512, contains basic routines that help transfer information between elements within processor-based device 3504, such as during start-up. Some implementations may employ separate buses for data, instructions and power.

The processor-based device 3504 may also include one or more solid state memories, for instance Flash memory or solid state drive (SSD) 3518, which provides nonvolatile storage of computer-readable instructions, data structures, program modules and other data for the processor-based device 3504. Although not depicted, the processor-based device 3504 can employ other nontransitory computer- or processor-readable media, for example a hard disk drive, an optical disk drive, or memory card media drive.

Program modules can be stored in the system memory 3508, such as an operating system 3530, one or more application programs 3532, other programs or modules 3534, drivers 3536 and program data 3538.

The application programs 3532 may, for example, include panning/scrolling 3532a. Such panning/scrolling logic may include, but is not limited to logic that determines when and/or where a pointer (e.g., finger, stylus, cursor) enters a user interface element that includes a region having a central portion and at least one margin. Such panning/scrolling logic may include, but is not limited to logic that determines a direction and a rate at which at least one element of the user interface element should appear to move, and causes updating of a display to cause the at least one element to appear to move in the determined direction at the determined rate. The panning/scrolling logic 3532a may, for example, be stored as one or more executable instructions. The panning/scrolling logic 3532a may include processor and/or machine executable logic or instructions to generate user interface objects using data that characterizes movement of a pointer, for example data from a touch-sensitive display or from a computer mouse or trackball, or other user interface device.

The system memory 3508 may also include communications programs 3540, for example a server and/or a Web client or browser for permitting the processor-based device 3504 to access and exchange data with other systems such as user computing systems, Web sites on the Internet, corporate intranets, or other networks as described below. The communications programs 3540 in the depicted implementation is markup language based, such as Hypertext Markup Language (HTML), Extensible Markup Language (XML) or Wireless Markup Language (WML), and operates with markup languages that use syntactically delimited characters added to the data of a document to represent the structure of the document. A number of servers and/or Web clients or browsers are commercially available such as those from Mozilla Corporation of California and Microsoft of Washington.

While shown in FIG. 35 as being stored in the system memory 3508, the operating system 3530, application programs 3532, other programs/modules 3534, drivers 3536, program data 3538 and server and/or browser 3540 can be stored on any other of a large variety of nontransitory processor-readable media (e.g., hard disk drive, optical disk drive, SSD and/or flash memory).

A user can enter commands and information via a pointer, for example through input devices such as a touch screen 3548 via a finger 3544a, stylus 3544b, or via a computer mouse or trackball 3544c which controls a cursor. Other input devices can include a microphone, joystick, game pad, tablet, scanner, biometric scanning device, etc. These and other input devices (i.e., "I/O devices") are connected to the processor(s) 3506 through an interface 3546 such as touch-screen controller and/or a universal serial bus ("USB") interface that couples user input to the system bus 3510, although other interfaces such as a parallel port, a game port or a wireless interface or a serial port may be used. The touch screen 3548 can be coupled to the system bus 3510 via a video interface 3550, such as a video adapter to receive image data or image information for display via the touch screen 3548. Although not shown, the processor-based device 3504 can include other output devices, such as speakers, vibrator, haptic actuator, etc.

The processor-based device 104 may operate in a networked environment using one or more of the logical connections to communicate with one or more remote computers, servers and/or devices via one or more communications channels, for example, one or more networks 3514a, 3514b. These logical connections may facilitate any known method of permitting computers to communicate, such as through one or more LANs and/or WANs, such as the Internet, and/or cellular communications networks. Such networking environments are well known in wired and wireless enterprise-wide computer networks, intranets, extranets, the Internet, and other types of communication networks including telecommunications networks, cellular networks, paging networks, and other mobile networks.

When used in a networking environment, the processor-based device 3504 may include one or more wired or wireless communications interfaces 3514a, 3514b (e.g., cellular radios, WI-FI radios, Bluetooth radios) for establishing communications over the network, for instance the Internet 3514a or cellular network.

In a networked environment, program modules, application programs, or data, or portions thereof, can be stored in a server computing system (not shown). Those skilled in the relevant art will recognize that the network connections shown in FIG. 35 are only some examples of ways of establishing communications between computers, and other connections may be used, including wirelessly.

For convenience, the processor(s) 3506, system memory 3508, network and communications interfaces 3514*a*, 354*b* are illustrated as communicably coupled to each other via the system bus 3510, thereby providing connectivity between the above-described components. In alternative implementations of the processor-based device 3504, the above-described components may be communicably coupled in a different manner than illustrated in FIG. 35. For example, one or more of the above-described components may be directly coupled to other components, or may be coupled to each other, via intermediary components (not shown). In some implementations, system bus 3510 is omitted and the components are coupled directly to each other using suitable connections.

The foregoing detailed description has set forth various implementations of the devices and/or processes via the use of block diagrams, schematics, and examples. Insofar as such block diagrams, schematics, and examples contain one or more functions and/or operations, it will be understood by those skilled in the art that each function and/or operation within such block diagrams, flowcharts, or examples can be implemented, individually and/or collectively, by a wide range of hardware, software, firmware, or virtually any combination thereof. In one implementation, the present subject matter may be implemented via Application Specific Integrated Circuits (ASICs). However, those skilled in the art will recognize that the implementations disclosed herein, in whole or in part, can be equivalently implemented in standard integrated circuits, as one or more computer programs running on one or more computers (e.g., as one or more programs running on one or more computer systems), as one or more programs running on one or more controllers (e.g., microcontrollers) as one or more programs running on one or more processors (e.g., microprocessors), as firmware, or as virtually any combination thereof, and that designing the circuitry and/or writing the code for the software and or firmware would be well within the skill of one of ordinary skill in the art in light of this disclosure.

Those of skill in the art will recognize that many of the methods or algorithms set out herein may employ additional acts, may omit some acts, and/or may execute acts in a different order than specified.

In addition, those skilled in the art will appreciate that the mechanisms taught herein are capable of being distributed as a program product in a variety of forms, and that an illustrative implementation applies equally regardless of the particular type of signal bearing media used to actually carry out the distribution. Examples of signal bearing media include, but are not limited to, the following: recordable type media such as floppy disks, hard disk drives, CD ROMs, digital tape, and computer memory.

The various implementations described above can be combined to provide further implementations. To the extent that they are not inconsistent with the specific teachings and definitions herein, all of the U.S. patents, U.S. patent application publications, U.S. patent applications, foreign patents, foreign patent applications and non-patent publications referred to in this specification and/or listed in the Application Data Sheet, including but not limited to U.S. Provisional Patent Application No. 61/571,908 filed Jul. 7, 2011; U.S. patent application Ser. No. 14/118,964 filed Nov. 20, 2013; PCT Patent Application No. PCT/US2012/045575 filed Jul. 5, 2012; U.S. Provisional Patent Application No. 61/928,702 filed Jan. 17, 2014; U.S. patent application Ser. No. 15/112,130 filed Jul. 15, 2016; PCT Patent Application No. PCT/US2015/011851 filed Jan. 16, 2015; U.S. Provisional Patent Application No. 62/260,565 filed Nov. 29, 2015; U.S. Provisional Patent Application No. 62/415,203 filed Oct. 31, 2016; and U.S. Provisional Patent Application No. 62/415,666 filed Nov. 1, 2016; are incorporated herein by reference, in their entirety. Aspects of the implementations can be modified, if necessary, to employ systems, circuits and concepts of the various patents, applications and publications to provide yet further implementations.

These and other changes can be made to the implementations in light of the above-detailed description. In general, in the following claims, the terms used should not be construed to limit the claims to the specific implementations disclosed in the specification and the claims, but should be construed to include all possible implementations along with the full scope of equivalents to which such claims are entitled. Accordingly, the claims are not limited by the disclosure.

The invention claimed is:

1. A system, comprising:
   at least one nontransitory processor-readable storage medium that stores at least one of processor-executable instructions or data; and
   at least one processor communicably coupled to the at least one nontransitory processor-readable storage medium, the at least one processor:
   receives learning data comprising a plurality of batches of labeled image sets, each image set comprising image data representative of an anatomical structure, and each image set including at least one label which identifies the region of a particular part of the anatomical structure depicted in each image of the image set;
   trains a fully convolutional neural network (CNN) model to segment at least one part of the anatomical structure utilizing the received learning data, wherein the CNN model comprises a contracting path and an expanding path, the contracting path includes a number of convolutional layers and a number of pooling layers, each pooling layer preceded by at least one convolutional layer, and the expanding path includes a number of convolutional layers and a number of upsampling layers, each upsampling layer preceded by at least one convolutional layer and comprises a transpose convolution operation which performs upsampling and interpolation with a learned kernel;
   stores the CNN model in the at least one nontransitory processor-readable storage medium of the system; and
   processes magnetic resonance imaging (MRI) image data, generated at least in part from an MRI device or system, using the CNN model to generate per-class probabilities for individual pixels of each image of the MRI image data, each class corresponding to one of a plurality of parts of the anatomical structure.

2. The system of claim 1 wherein, subsequent to each upsampling layer, the CNN model includes a concatenation of feature maps from a corresponding layer in the contracting path through a skip connection.

3. The system of claim 1 wherein the image data is representative of a heart during one or more time points throughout a cardiac cycle.

4. The system of claim 3 wherein the image data includes ultrasound data or visible light photograph data.

5. The system of claim 1 wherein the at least one processor:
augments the learning data via modification of at least some of the image data in the plurality of batches of labeled image sets; and
modifies at least some of the image data in the plurality of batches of labeled image sets according to at least one of: a horizontal flip, a vertical flip, a shear amount, a shift amount, a zoom amount, a rotation amount, a brightness level, or a contrast level.

6. The system of claim 1 wherein the at least one processor:
for each image set, identifies whether the image set is missing a label for any of a plurality of parts of the anatomical structure; and
for image sets identified as missing at least one label, modifies a training loss function to account for the identified missing labels.

7. The system of claim 1 wherein the image data comprises volumetric images, and each label comprises a volumetric label mask or contour.

8. The system of claim 1 wherein the image data is representative of a heart during one or more time points throughout a cardiac cycle, and wherein a subset of the plurality of batches of labeled image sets includes labels which exclude papillary muscles.

9. The system of claim 1 wherein for each processed image, the CNN model utilizes data for at least one image which is at least one of: adjacent to the processed image with respect to space or adjacent to the processed image with respect to time.

10. The system of claim 1 wherein for each processed image, the CNN model utilizes data for at least one image which is adjacent to the processed image with respect to space and utilizes data for at least one image which is adjacent to the processed image with respect to time.

11. The system of claim 1 wherein for each processed image, the CNN model utilizes at least one of temporal information or phase information.

12. The system of claim 1 wherein the image data comprises at least one of steady-state free precession (SSFP) magnetic resonance imaging (MRI) data or 4D flow MRI data.

13. A system, comprising:
at least one nontransitory processor-readable storage medium that stores at least one of processor-executable instructions or data; and
at least one processor communicably coupled to the at least one nontransitory processor-readable storage medium, the at least one processor:
receives image data generated at least in part from an magnetic resonance imaging (MRI) device or system, wherein the image data represents an anatomical structure;
processes the received image data through a fully convolutional neural network (CNN) model to generate per-class probabilities for each pixel of each image of the image data, each class corresponding to one of a plurality of parts of the anatomical structure represented by the image data, wherein the CNN model comprises a contracting path and an expanding path, the contracting path includes a number of convolutional layers and a number of pooling layers, each pooling layer preceded by at least one convolutional layer, and the expanding path includes a number of convolutional layers and a number of upsampling layers, each upsampling layer preceded by at least one convolutional layer and comprises a transpose convolution operation which performs upsampling and interpolation with a learned kernel;
for each image of the image data, generates a probability map for each of the plurality of classes using the generated per-class probabilities; and
stores the generated probability maps in the at least one nontransitory processor-readable storage medium.

14. The system of claim 13 wherein the image data is representative of a heart during one or more time points throughout a cardiac cycle.

15. The system of claim 13 wherein the at least one processor:
autonomously causes an indication of at least one of the plurality of parts of the anatomical structure to be displayed on a display based at least in part on the generated probability maps.

16. The system of claim 13 wherein the at least one processor:
post-processes the processed image data to ensure at least one physical constraint is met.

17. The system of claim 16 wherein the image data is representative of a heart during one or more time points throughout a cardiac cycle, and the at least one physical constraint comprises at least one of: the volume of the myocardium is the same at all time points, or the right ventricle and the left ventricle cannot overlap each other.

18. The system of claim 13 wherein the at least one processor:
for each image of the image data, transforms the plurality of probability maps into a label mask by setting the class of each pixel to the class with the highest probability; and
converts each of the label masks for the image data into respective spline contours.

19. The system of claim 18 wherein the at least one processor:
autonomously causes the generated contours to be displayed with the image data on a display.

20. The system of claim 19 wherein the at least one processor:
receives a user modification of at least one of the displayed contours; and
stores the modified contour in the at least one nontransitory processor-readable storage medium.

21. The system of claim 18 wherein the at least one processor:
determines the volume of at least one of the plurality of parts of the anatomical structure utilizing the generated contours.

22. The system of claim 18 wherein the anatomical structure comprises a heart, and the at least one processor:
determines the volume of at least one of the plurality of parts of the heart at a plurality of time points of a cardiac cycle utilizing the generated contours.

23. The system of claim 22 wherein the at least one processor:
automatically determines which of the plurality of time points of the cardiac cycle correspond to an end systole phase and an end diastole phase of the cardiac cycle based on the time points determined to have a minimum volume and a maximum volume, respectively.

24. The system of claim 21 wherein the at least one processor:
causes the determined volume of the at least one of the plurality of parts of the anatomical structure to be displayed on a display.

25. The system of claim 13 wherein the image data comprises volumetric images.

26. A method of operating a system comprising at least one nontransitory processor-readable storage medium that stores at least one of processor-executable instructions or data, and at least one processor communicably coupled to the at least one nontransitory processor-readable storage medium, the method comprising:
receiving, by the at least one processor, image data which represents an anatomical structure, the image data including a plurality of magnetic resonance imaging (MRI) images;
processing, by the at least one processor, the received image data through a fully convolutional neural network (CNN) model to generate per-class probabilities for each pixel of each MRI image of the image data, each class corresponding to one of a plurality of parts of the anatomical structure represented by the image data, wherein the CNN model comprises a contracting path and an expanding path, the contracting path includes a number of convolutional layers and a number of pooling layers, each pooling layer preceded by at least one convolutional layer, and the expanding path includes a number of convolutional layers and a number of upsampling layers, each upsampling layer preceded by at least one convolutional layer and comprises a transpose convolution operation which performs upsampling and interpolation with a learned kernel;
for each MRI image of the image data, generating, by the at least one processor, a probability map for each of the plurality of classes using the generated per-class probabilities; and
storing, by the at least one processor, the generated probability maps in the at least one nontransitory processor-readable storage medium.

27. The method of claim 26 wherein receiving image data comprises receiving image data that is representative of a heart during one or more time points throughout a cardiac cycle.

28. The method of claim 26, further comprising:
autonomously causing, by the at least one processor, an indication of at least one of the plurality of parts of the anatomical structure to be displayed on a display based at least in part on the generated probability maps.

29. The method of claim 26, further comprising:
post-processing, by the at least one processor, the processed image data to ensure at least one physical constraint is met.

30. The method of claim 29 wherein receiving image data comprises receiving image data that is representative of a heart during one or more time points throughout a cardiac cycle, and the at least one physical constraint comprises at least one of: the volume of the myocardium is the same at all time points, or the right ventricle and the left ventricle cannot overlap each other.

31. A method of operating a system comprising at least one nontransitory processor-readable storage medium that stores at least one of processor-executable instructions or data, and at least one processor communicably coupled to the at least one nontransitory processor-readable storage medium, the method comprising:
receiving image data which represents an anatomical structure, the image data including a plurality of magnetic resonance imaging (MRI) images;
processing, by the at least one processor, the received image data through a fully convolutional neural network (CNN) model to generate per-class probabilities for each pixel of each MRI image of the image data, each class corresponding to one of a plurality of parts of the anatomical structure represented by the image data;
for each MRI image of the image data, generating, by the at least one processor, a probability map for each of the plurality of classes using the generated per-class probabilities;
storing, by the at least one processor, the generated probability maps in the at least one nontransitory processor-readable storage medium;
for each MRI image of the image data, transforming, by the at least one processor, the plurality of probability maps into a label mask by setting the class of each pixel to the class with the highest probability; and
converting, by the at least one processor, each of the label masks for the image data into respective spline contours.

32. The method of claim 31, further comprising:
autonomously causing, by the at least one processor, the generated contours to be displayed with the image data on a display.

33. The method of claim 32, further comprising:
receiving, by the at least one processor, a user modification of at least one of the displayed contours; and
storing, by the at least one processor, the modified contour in the at least one nontransitory processor-readable storage medium.

34. The method of claim 31, further comprising:
determining, by the at least one processor, the volume of at least one of the plurality of parts of the anatomical structure utilizing the generated contours.

35. The method of claim 34, further comprising:
causing, by the at least one processor, the determined volume of the at least one of the plurality of parts of the anatomical structure to be displayed on a display.

36. The method of claim 31 wherein the anatomical structure comprises a heart, the method further comprising:
determining, by the at least one processor, the volume of at least one of the plurality of parts of the heart at a plurality of time points of a cardiac cycle utilizing the generated contours.

37. The method of claim 36, further comprising:
automatically determining, by the at least one processor, which of the plurality of time points of the cardiac cycle correspond to an end systole phase and an end diastole phase of the cardiac cycle based on the time points determined to have a minimum volume and a maximum volume, respectively.

38. The method of claim 31 wherein receiving image data comprises receiving volumetric image data.

39. A system, comprising:
at least one nontransitory processor-readable storage medium that stores at least one of processor-executable instructions or data; and
at least one processor communicably coupled to the at least one nontransitory processor-readable storage medium, the at least one processor:
receives a plurality of sets of 3D MRI images, the images in each of the plurality of sets represent an anatomical structure of a patient;
receives a plurality of annotations for the plurality of sets of 3D MRI images, each annotation indicative of a landmark of an anatomical structure of a patient depicted in a corresponding image;
trains a convolutional neural network (CNN) model to predict the locations of the plurality of landmarks utilizing the 3D MRI images, wherein the CNN model comprises a contracting path and an expanding path, the contracting path includes a number of convolutional layers and a number of pooling layers, each pooling layer preceded by one or more convolutional layers, and the expanding path includes a number of convolutional layers and a number of upsampling layers, each upsampling layer preceded by one or more convolutional layers and comprises a transpose convolution operation which performs upsampling and interpolation with a learned kernel;

stores the CNN model in the at least one nontransitory processor-readable storage medium of the system; and processes MRI image data using the CNN model to generate per-class probabilities for individual pixels of each image of the MRI image data, each class corresponding to one of a plurality of parts of the anatomical structure.

40. The system of claim 39 wherein the at least one processor trains a CNN model to predict the locations of the plurality of landmarks utilizing the 3D MRI images.

41. The system of claim 39 wherein the at least one processor trains a CNN model which has an output which is one or more sets of spatial coordinates, each set of the one or more spatial coordinates identifying a location of one of the plurality of landmarks.

42. The system of claim 39 wherein the at least one processor:

for each of one or more landmarks of the anatomical structure, defines a 3D label map based at least in part on the received sets of 3D MRI images and the received plurality of annotations, each 3D label map encodes a likelihood that the landmark is located at a particular location on the 3D label map, wherein the at least one processor trains the CNN model to segment the one or more landmarks utilizing the 3D MRI images and the generated 3D label maps.

43. The system of claim 39 wherein the images in each of the plurality of sets represent a heart of a patient at different respective time points of a cardiac cycle, and each annotation is indicative of a landmark of a heart of a patient depicted in a corresponding image.

44. The system of claim 39 wherein the at least one processor:

receives a set of 3D MRI images;

processes the received 3D MRI images through the CNN model to detect at least one of the one or more landmarks; and causes the detected at least one of the plurality of landmarks to be presented on a display.

45. The system of claim 44 wherein the at least one processor:

processes the received 3D MRI images through the CNN model to detect at least one of the plurality of landmarks at a plurality of time points; and causes the detected at least one of the plurality of landmarks at a plurality of time points to be presented on a display.

46. The system of claim 39 wherein the CNN model utilizes phase information associated with the received 3D MRI images.

* * * * *